(12) United States Patent
Miyairi

(10) Patent No.: US 8,372,700 B2
(45) Date of Patent: *Feb. 12, 2013

(54) METHOD FOR MANUFACTURING THIN FILM TRANSISTOR

(75) Inventor: Hidekazu Miyairi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 209 days.

This patent is subject to a terminal disclaimer.

(21) Appl. No.: 12/731,210

(22) Filed: Mar. 25, 2010

(65) Prior Publication Data

US 2010/0248433 A1 Sep. 30, 2010

(51) Int. Cl.
H01L 21/00 (2006.01)

(52) U.S. Cl. .................. 438/149; 438/158; 257/E29.151

(58) Field of Classification Search .......... 438/157–167; 257/E51.005, E29.151
See application file for complete search history.

(56) References Cited

U.S. PATENT DOCUMENTS

| 4,409,134 | A | 10/1983 | Yamazaki |
| 6,008,065 | A | 12/1999 | Lee et al. |
| 6,485,997 | B2 | 11/2002 | Lee et al. |
| 6,493,048 | B1 | 12/2002 | Baek et al. |
| 6,635,581 | B2 | 10/2003 | Wong |
| 7,223,643 | B2 | 5/2007 | Ohnuma et al. |
| 7,749,820 | B2 * | 7/2010 | Miyairi ........................ 438/151 |
| 7,790,483 | B2 * | 9/2010 | Miyairi et al. .................. 438/22 |
| 7,883,943 | B2 * | 2/2011 | Miyairi et al. ................. 438/151 |
| 7,952,093 | B2 * | 5/2011 | Yamazaki et al. .............. 257/59 |
| 7,985,605 | B2 * | 7/2011 | Komori et al. .................. 438/22 |
| 7,989,234 | B2 * | 8/2011 | Miyairi et al. .................. 438/22 |
| 8,143,170 | B2 | 3/2012 | Miyairi et al. |
| 8,207,026 | B2 | 6/2012 | Suzawa et al. |
| 2001/0049064 | A1 | 12/2001 | Lee et al. |
| 2006/0290867 | A1 | 12/2006 | Ahn et al. |
| 2007/0002249 | A1 | 1/2007 | Yoo et al. |
| 2007/0126969 | A1 | 6/2007 | Kimura et al. |
| 2007/0139571 | A1 | 6/2007 | Kimura |
| 2007/0146591 | A1 | 6/2007 | Kimura et al. |
| 2007/0222936 | A1 | 9/2007 | Shih |

(Continued)

FOREIGN PATENT DOCUMENTS

| JP | 64084669 | 3/1989 |
| JP | 03011744 B | 1/1991 |

(Continued)

OTHER PUBLICATIONS

Kim.C et al. "A Novel Four-Mask-Count Process Architecture for TFT-LCDS", SID Digest '00: SID International Symposium Digest of Technical Papers, vol. 31, pp. 1006-1009, (2000).

Primary Examiner — Brook Kebede
(74) Attorney, Agent, or Firm — Fish & Richardson P.C.

(57) ABSTRACT

It is an object to provide a method for manufacturing a thin film transistor, in which the number of masks to be used is small. A thin film transistor is manufactured as follows: a first conductive film, an insulating film, a semiconductor film, an impurity semiconductor film, and a second conductive film are stacked; a resist mask having a recessed portion is formed thereover with the use of a multi-tone mask; a thin-film stack body is formed with first etching; a gate electrode layer is formed with second etching in which an etched first conductive film is side-etched; and then a source electrode and a drain electrode and the like are formed. A crystalline semiconductor film is used for the semiconductor film.

19 Claims, 48 Drawing Sheets

U.S. PATENT DOCUMENTS

| | | |
|---|---|---|
| 2009/0152559 A1 | 6/2009 | Miyairi et al. |
| 2009/0212296 A1 | 8/2009 | Mizoguchi et al. |
| 2009/0212300 A1 | 8/2009 | Komori |
| 2009/0224249 A1 | 9/2009 | Miyairi et al. |
| 2009/0227051 A1 | 9/2009 | Miyairi et al. |
| 2009/0227076 A1 | 9/2009 | Miyairi |
| 2009/0233389 A1 | 9/2009 | Miyairi et al. |
| 2009/0261369 A1 | 10/2009 | Komori et al. |
| 2009/0311809 A1 | 12/2009 | Miyairi et al. |
| 2010/0187535 A1* | 7/2010 | Suzawa et al. ............. 257/66 |
| 2010/0230683 A1 | 9/2010 | Miyairi |
| 2011/0260208 A1 | 10/2011 | Komori et al. |
| 2011/0263060 A1* | 10/2011 | Miyairi et al. ............. 438/34 |
| 2012/0007087 A1 | 1/2012 | Mizoguchi et al. |
| 2012/0045860 A1 | 2/2012 | Komori |

FOREIGN PATENT DOCUMENTS

| | | |
|---|---|---|
| JP | 03161938 A | 7/1991 |
| JP | 2003179069 A | 6/2003 |
| JP | 2007227440 A | 9/2007 |
| WO | WO2008099528 A1 | 8/2008 |

* cited by examiner 100 101 102 104 105 scanning direction

150

106

METHOD FOR MANUFACTURING THIN FILM TRANSISTOR

BACKGROUND OF THE INVENTION

1. Field of the Invention

The present invention relates to a method for manufacturing a thin film transistor and a method for manufacturing a display device.

2. Description of the Related Art

In recent years, thin film transistors which are formed using a semiconductor thin film having a thickness of several nanometers to several hundreds of nanometers over a substrate having an insulating surface, such as a glass substrate, have been attracting attention. Thin film transistors have been widely used for integrated circuits (ICs) and electronic devices typified by electrooptic devices. Thin film transistors have rapidly developed particularly as switching elements for image display devices typified by liquid crystal display devices, electroluminescent (EL) display devices, and the like.

With the use of a polycrystalline semiconductor film, a thin film transistor with high mobility can be obtained. As examples of methods for forming a polycrystalline semiconductor film, a method in which an amorphous semiconductor film is crystallized with laser irradiation at a relatively low temperature, a method in which an amorphous semiconductor film is heated and crystallized at a temperature higher than that of the method in which an amorphous semiconductor film is crystallized with laser irradiation, and the like can be given. Such a crystalline semiconductor which is crystallized at a relatively low temperature is referred to as low temperature polysilicon (LTPS), and a crystalline semiconductor which is crystallized at a relatively high temperature is referred to as high temperature polysilicon (HTPS). In particular, since an LTPS is a polycrystalline semiconductor film which can be crystallized at a relatively low temperature, a glass substrate can be used, and various techniques have developed.

High productivity and reduction in the manufacturing cost have been required for the above method for manufacturing a thin film transistor. Simplification of a process is one way for increasing productivity and reducing the manufacturing cost. It is important that the number of photomasks to be used for a photolithography method be reduced in order to simplify a process. For example, when one more photomask is used, the following steps are further required: application of a resist, prebaking, light exposure, development, postbaking, and the like, and steps before and after the above steps, such as formation of a film, etching, removal of a resist, cleaning, and drying. Thus, the number of steps is significantly increased only by adding one photomask used in a manufacturing process of a thin film transistor. In order to reduce the number of photomasks used in a manufacturing process of a thin film transistor, many techniques have developed (for example, Patent Document 1 and Patent Document 2).

REFERENCES

Patent Documents

[Patent Document 1] Japanese Published Patent Application No. 2003-179069
[Patent Document 2] Japanese Published Patent Application No. 2007-227440

SUMMARY OF THE INVENTION

It is an object of one embodiment of the present invention to reduce the number of photomasks used in manufacturing a thin film transistor.

One embodiment of the present invention is a method for manufacturing a thin film transistor, including the steps of: stacking a first conductive film, an insulating film, and a first semiconductor film in this order; crystallizing the first semiconductor film to form a second semiconductor film; stacking an impurity semiconductor film and a second conductive film in this order over the second semiconductor film; forming a first resist mask having a recessed portion over the second conductive film; performing first etching on at least the insulating film, the second semiconductor film, the impurity semiconductor film, and the second conductive film with the use of the first resist mask; performing second etching in which the first conductive film is side-etched to form a first wiring layer; making the first resist mask recede to expose a part of the second conductive film which overlaps with the recessed portion of the first resist mask and to form a second resist mask; and performing third etching on the second conductive film, the impurity semiconductor film, and the second semiconductor film with the use of the second resist mask to form a second wiring layer, an impurity semiconductor layer, and the second semiconductor film whose upper part is etched.

Note that in this specification, the word "crystallization" includes a case where an amorphous structure becomes a crystalline structure and a case where crystallinity is increased in a structure in which an amorphous structure and a crystalline structure are mixed. Therefore, even when crystallinity is just increased, "crystallization", "crystallization step", or other similar words are used.

Another embodiment of the present invention is a method for manufacturing a thin film transistor, including the steps of stacking a first conductive film, an insulating film, and a first semiconductor film in this order; crystallizing the first semiconductor film to form a second semiconductor film; stacking an impurity semiconductor film and a second conductive film in this order over the second semiconductor film; forming a first resist mask having a recessed portion over the second conductive film; performing first etching on at least the insulating film, the second semiconductor film, the impurity semiconductor film, and the second conductive film with the use of the first resist mask; making the first resist mask recede to expose a part of the second conductive film which overlaps with the recessed portion of the first resist mask and to form a second resist mask; performing second etching in which the first conductive film is side-etched to form a first wiring layer; and performing third etching on the second conductive film, the impurity semiconductor film, and the second semiconductor film with the use of the second resist mask to form a second wiring layer, an impurity semiconductor layer, and the second semiconductor film whose upper part is etched.

In the above structure of one embodiment of the present invention, the first resist mask may be formed using a multi-tone mask.

Another embodiment of the present invention is a method for manufacturing a thin film transistor, including the steps of: stacking a first conductive film, an insulating film, and a first semiconductor film in this order; crystallizing the first semiconductor film to form a second semiconductor film; forming a first resist mask over the second semiconductor film; adding an impurity element imparting one conductivity type to a region of the second semiconductor film which is not covered with the first resist mask selectively; removing the first resist mask, and then activating the impurity element of the second semiconductor film; forming a second conductive film over the second semiconductor film; forming a second resist mask having a recessed portion over the second conductive film; performing first etching on at least the insulating film, the second semiconductor film, and the second conductive film with the use of the second resist mask; performing second etching in which the first conductive film is side-etched to form a first wiring layer; forming a third resist mask over the second conductive film; and performing third etching on the second conductive film and the second semiconductor film with the use of the third resist mask to form a second wiring layer and a semiconductor layer including a source region and a drain region.

In the above structure of one embodiment of the present invention, it is preferable that a thin-film stack body be formed with the first etching and a side surface of the first wiring layer be located on an inner side than a side surface of the thin-film stack body by an almost uniform distance with the second etching.

In the above structure of one embodiment of the present invention, it is preferable that the first conductive film be formed over a substrate with a base insulating film interposed therebetween and an upper portion of the base insulating film be etched as well with the first etching.

Here, as the first etching, dry etching or wet etching may be employed. Note that the first etching can be performed in one step when dry etching is employed as the first etching, while the first etching may be performed in plural steps when wet etching is employed as the first etching. As the second etching, dry etching or wet etching may also be employed. However, as described above, with the second etching, the first conductive film needs to be side-etched, and thus wet etching is preferably employed as the second etching.

Here, the second semiconductor film is preferably formed in such a manner that the first semiconductor film is heated with a thermal crystallization method, or the first semiconductor film is irradiated with a laser beam.

Here, since the second etching is performed under the condition that the first conductive film is side-etched, the first conductive film is etched such that the first conductive film recedes to an inner side than the patterned thin-film stack body. Accordingly, the side surface of the first wiring layer which is formed using the first conductive film with the second etching is positioned on an inner side than the side surface of the patterned thin-film stack body. Furthermore, the distance between the side surface of the patterned first wiring layer and the side surface of the patterned thin-film stack body is almost uniform.

Note that in this specification, the word "pattern" of the first wiring layer means, for example, a top view layout of a metal wiring which forms a gate electrode, a gate wiring, a capacitor electrode, and a capacitor wiring.

Note that in this specification, the word "side-etching" means etching in which a film is etched not only in a thickness direction of the film (a direction perpendicular to the substrate surface or a direction perpendicular to the surface of a base film of the etched film) but also in a direction perpendicular to the thickness direction (a direction parallel to the substrate surface or a direction parallel to the surface of the base film of the etched film).

Note that in the method for manufacturing a thin film transistor which is one embodiment of the present invention described above, it is preferable that the resist mask having the recessed portion be formed using a multi-tone mask.

Note that a display device can be manufactured by applying the method for manufacturing a thin film transistor which is one embodiment of the present invention described above and selectively forming a pixel electrode which is connected to the second wiring layer of the thin film transistor.

Note that it is preferable that etching be performed under such conditions as to cause "unintended etching" as little as possible.

Note that in this specification, the phrase "film has heat resistance" means that the film can keep the shape as a film and required functions and characteristics under temperatures of later steps.

Note that in this specification, the word "gate wiring" means a wiring connected to a gate electrode of a thin film transistor. The gate wiring is formed using a first wiring layer. The gate wiring is also referred to as a scan line.

Note that in this specification, the word "source wiring" is a wiring connected to a source electrode and a drain electrode of a thin film transistor. The source wiring is formed using a second wiring layer. The source wiring is also referred to as a signal line.

With the use of one embodiment of the present invention, the number of steps of manufacturing a thin film transistor can be significantly reduced. Further, since the thin film transistor manufactured according to one embodiment of the present invention can be applied to a display device, the number of steps of manufacturing a display device can be significantly reduced as well. More specifically, with the use of one embodiment of the present invention, a first wiring layer is side-etched for etching, and thus the formation of a mask for etching the first wiring layer can be omitted. Accordingly, the number of photomasks used for etching can be reduced. It is also possible to form a thin film transistor with the use of one photomask (multi-tone mask). Therefore, the number of steps of manufacturing a thin film transistor or a display device can be significantly reduced. Moreover, misalignment of a photomask can be prevented at the time of aligning the photomask for etching.

With the use of one embodiment of the present invention, a thin film transistor has a cavity in contact with an end portion of a first wiring layer, which leads to reduction in leakage current between a gate electrode and a drain electrode.

BRIEF DESCRIPTION OF THE DRAWINGS

In the accompanying drawings:

FIGS. 3A to 3C illustrate one example of methods for manufacturing the display device including the thin film transistor a;

DETAILED DESCRIPTION OF THE INVENTION

Figure 1A:
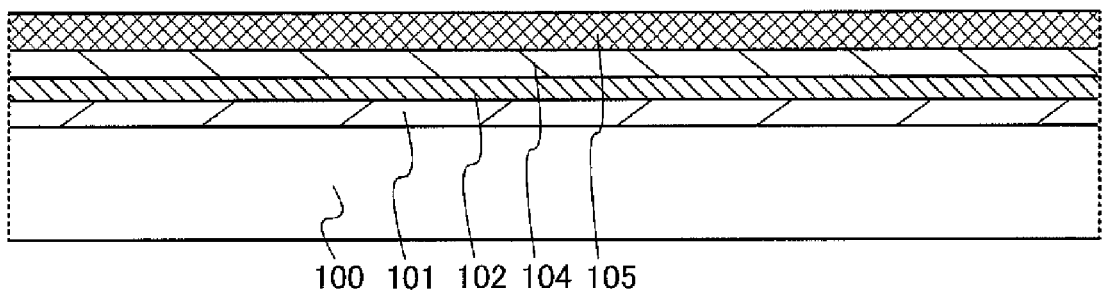
FIGS. 1A to 1C illustrate one example of methods for manufacturing a display device including a thin film transistor.

Embodiments of the present invention will be described below with reference to the accompanying drawings. Note that the present invention is not limited to the following description of the embodiments, and it is readily appreciated by those skilled in the art that modes and details of the present invention can be modified in a variety of ways without departing from the scope and spirit of the present invention. Accordingly, the present invention should not be interpreted as being limited to the following description of the embodiments. In the description of the present invention with reference to the drawings, a reference numeral indicating the same part is used in common throughout the drawings. Note that the same hatching pattern is applied to similar parts, and the similar parts are not especially denoted by reference numerals in some cases.

Embodiment 1

In this embodiment, an example of a method for manufacturing a display device including a thin film transistor is described with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, FIGS. 14A to 14C, FIGS. 15A to 15C, FIGS. 16A to 16C, FIG. 17A, FIG. 18, FIG. 19, FIG. 20, FIG. 21, FIG. 22, and FIG. 23.

Figure 22:
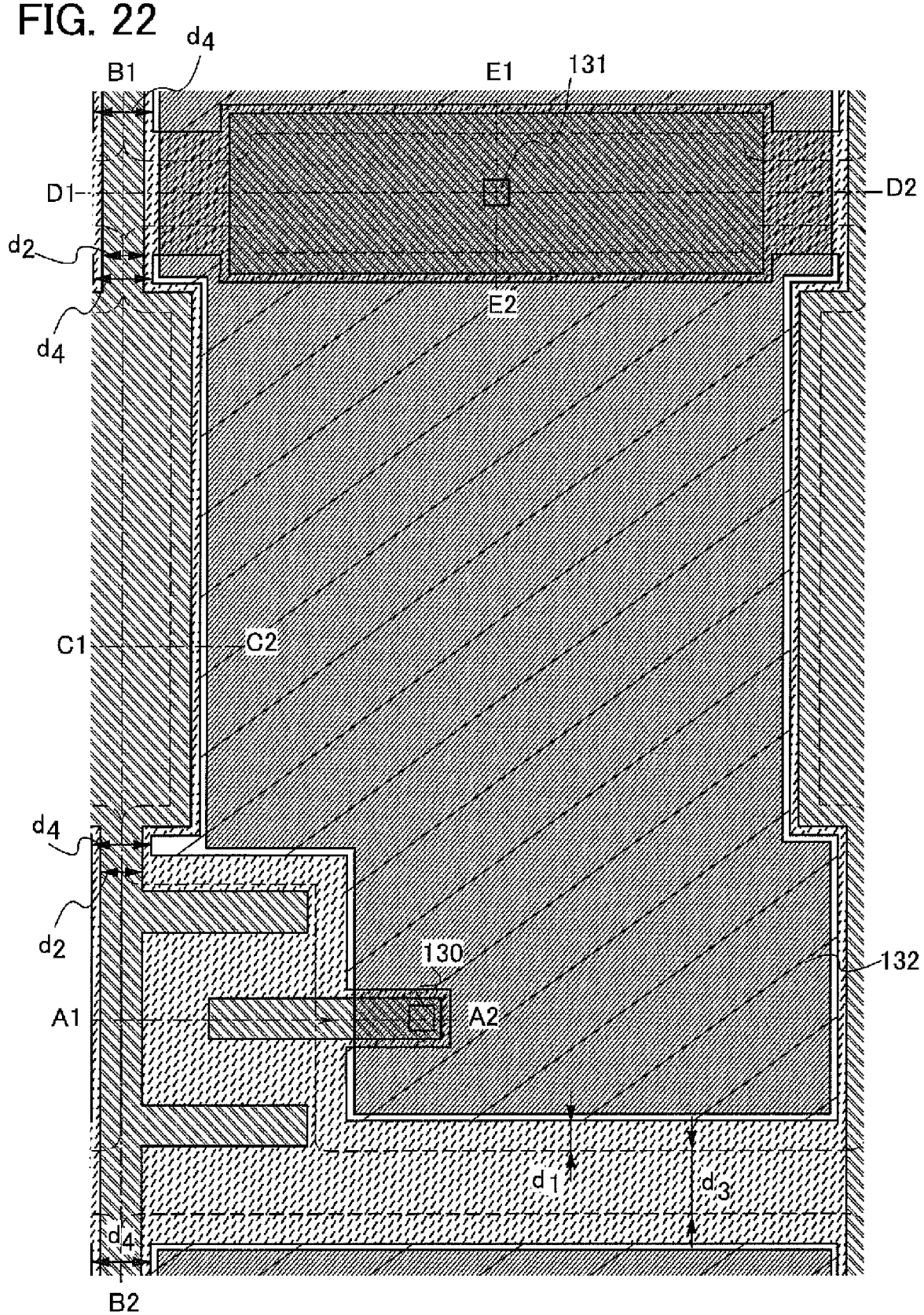
FIG. 22 illustrates one example of methods for manufacturing the display device including the thin film transistor.

Note that FIG. 18, FIG. 19, FIG. 20, FIG. 21, and FIG. 22 are top views illustrating a thin film transistor according to this embodiment. FIG. 22 is a completion view in the situation in which formation of a pixel electrode has been finished.

FIGS. 2A to 2C, FIGS. 3A to 3C, and FIGS. 4A to 4C are cross-sectional views taken along the line A1-A2 in FIG. 18, FIG. 19, FIG. 20, FIG. 21, and FIG. 22. FIGS. 5A to 5C, FIGS. 6A to 6C, and FIGS. 7A to 7C are cross-sectional views taken along the line B1-B2 in FIG. 18, FIG. 19, FIG. 20, FIG. 21, and FIG. 22. FIGS. 8A to 8C, FIGS. 9A to 9C, and FIGS. 10A to 10C are cross-sectional views taken along the line C1-C2 in FIG. 18, FIG. 19, FIG. 20, FIG. 21, and FIG. 22. FIGS. 11A to 11C, FIGS. 12A to 12C, and FIGS. 13A to 13C are cross-sectional views taken along the line D1-D2 in FIG. 18, FIG. 19, FIG. 20, FIG. 21, and FIG. 22. FIGS. 14A to 14C, FIGS. 15A to 15C, and FIGS. 16A to 16C are cross-sectional views taken along the line E1-E2 in FIG. 18, FIG. 19, FIG. 20, FIG. 21, and FIG. 22.

Figure 1B:
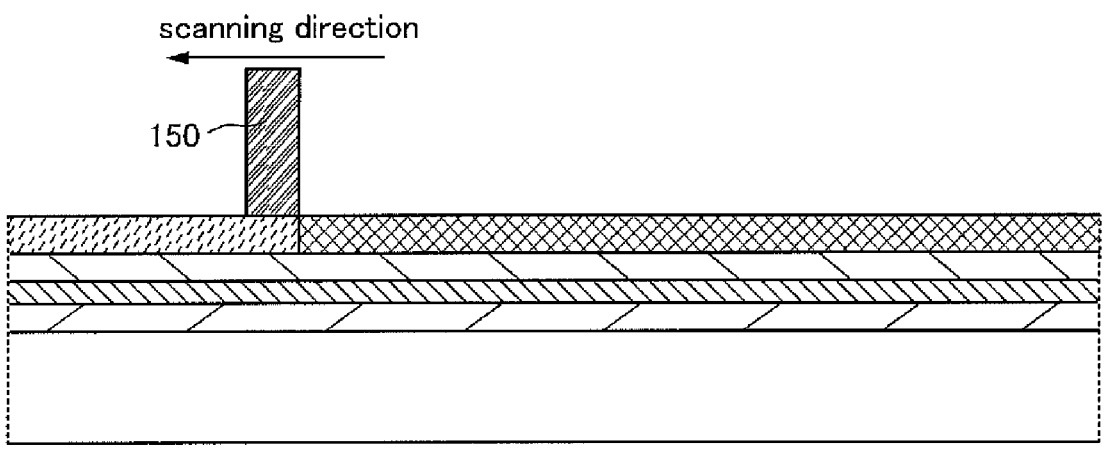
Figure 1C:
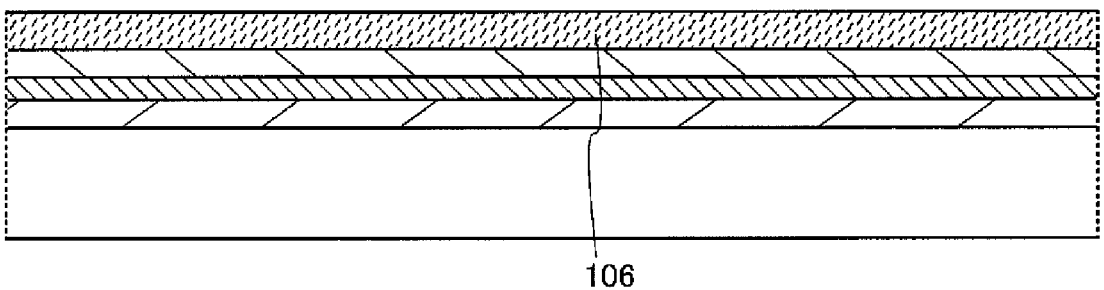

FIGS. 1A to 1C illustrates a method for forming a second semiconductor film 106 over a substrate 100.

First, a first insulating film 101, a first conductive film 102, a second insulating film 104, and a first semiconductor film 105 are formed in this order over the substrate 100 (FIG. 1A). Each of these films may have a single layer structure or a stacked structure including a plurality of layers.

The substrate 100 is an insulating substrate. In the case where the present invention is applied to a display device, a glass substrate or a quartz substrate can be used as the substrate 100, for example. In this embodiment, a glass substrate is used.

The first insulating film 101 is formed using an insulating material. The first insulating film 101 can be formed using, for example, a silicon oxide, a silicon nitride, a silicon oxynitride, a silicon nitride oxide, or the like. Note that the first insulating film 101 needs to have such heat resistance as to withstand heat in later steps (formation of the second insulating film 104 and the like). In addition, a material which is not unintentionally etched or eroded in later steps (etching of a second conductive film 110 and the like) is selected as the material of the first insulating film 101.

In the case where a glass substrate is used as the substrate 100, it is preferable that a silicon nitride film or a silicon nitride oxide film be used for the first insulating film 101. This is because when the first insulating film 101 includes nitrogen, Na and the like in the glass substrate 100 can be effectively prevented from entering a semiconductor film. Moreover, the first insulating film 101 preferably includes a halogen (fluorine, chlorine, or bromine). When a halogen is included in the first insulating film 101, an impurity metal element in the glass substrate 100 can be more effectively prevented from entering the semiconductor film. In order that a halogen is included in the first insulating film 101, a gas used in formation of the first insulating film 101 may include a halogen gas or a gas including a halogen compound.

Note that the first insulating film 101 can be formed with, for example, a CVD method (a thermal CVD method, a plasma CVD method, or the like), a sputtering method, or the like; however, the formation method of the first insulating film 101 is not limited to a particular method. The first insulating film 101 may be formed using a single layer structure or a stacked structure including a plurality of layers. Note that the first insulating film 101 can also be referred to as a base film or a base insulating film.

The first conductive film 102 is formed using a conductive material. The first conductive film 102 can be formed using a conductive material such as a metal, e.g., Ti, Mo, Cr, Ta, W, Al, Cu, Nd, Nb, or Sc, an alloy including any of these metals as a main component, or the like. Note that the material of the first conductive film 102 needs to be a material which has such heat resistance as to withstand heat in later steps (formation of the second insulating film 104 and the like) and is not unintentionally etched or eroded in later steps (etching of the second conductive film 110 and the like). As long as these conditions are satisfied, the material of the first conductive film 102 is not limited to a particular material.

In addition, the first conductive film 102 can be formed with, for example, a sputtering method, a CVD method (including a thermal CVD method, a plasma CVD method, or the like), or the like. However, the formation method of the first conductive film 102 is not limited to a particular method.

The second insulating film 104 is formed using an insulating material. The second insulating film 104 can be formed using, for example, a silicon oxide, a silicon nitride, a silicon oxynitride, a silicon nitride oxide, or the like. Note that similarly to the first conductive film 102, the material of the second insulating film 104 needs to be a material which has heat resistance and is not unintentionally etched or eroded in later steps. As long as these conditions are satisfied, the material of the second insulating film 104 is not limited to a particular material.

In addition, the second insulating film 104 can be formed with, for example, a CVD method (including a thermal CVD method, a plasma CVD method, or the like), a sputtering method, or the like; however, the formation method of the second insulating film 104 is not limited to a particular method. Note that the second insulating film 104 serves as a gate insulating film.

The first semiconductor film 105 is formed using a semiconductor material. The first semiconductor film 105 can be formed using, for example, amorphous silicon formed using a silane gas or the like. Alternatively, germanium or the like may be used. Note that the crystallinity of the first semiconductor film 105 is not particularly limited as well, and microcrystal silicon or the like may be used instead of amorphous silicon. Note that similarly to the first conductive film 102 and the like, the material of the first semiconductor film 105 needs to be a material which has heat resistance and is not unintentionally etched or eroded in later steps. As long as these conditions are satisfied, the material of the first semiconductor film 105 is not limited to a particular material.

In addition, the first semiconductor film 105 can be formed with, for example, a CVD method (including a thermal CVD method, a plasma CVD method, or the like), a sputtering method, or the like. However, the formation method of the first semiconductor film 105 is not limited to a particular method.

Next, the first semiconductor film 105 is heated in order to remove hydrogen, the first semiconductor film 105 is irradiated with a laser beam 150, and the first semiconductor film 105 is crystallized (FIG. 1B). Note that the step of removing hydrogen may be performed such that the substrate 100 is carried into an electric furnace and then heated at 450° C. to 550° C. for 0.5 hours to 4 hours. The substrate 100 may be heated, for example, at 500° C. for approximately one hour.

Alternatively, the substrate 100 may be irradiated with the laser beam 150 while being heated. Note that the laser beam 150 is preferably a linear laser beam. At this time, the heating temperature is preferably around 300° C. to 500° C.

In addition, in the crystallization step in which a laser beam is used, for example, a pulsed laser, a continuous wave laser (a CW laser), a quasi-CW laser (a pulsed laser, the repetition rate of which is greater than or equal to 10 MHz, preferably greater than or equal to 80 MHz), or the like can be used.

Here, examples of a laser which can be used as the laser beam 150 are given. As examples of a laser which can be used as the laser beam 150, an excimer laser such as a KrF laser, and a gas laser such as an Ar laser and a Kr laser can be given. Further, a solid-state laser such as a YAG laser, a YVO$_4$ laser, a YLF laser, a YAlO$_3$ laser, a GdVO$_4$ laser, a KGW laser, a KYW laser, an alexandrite laser, a Ti:sapphire laser, or a Y$_2$O$_3$ laser can be used. Note that an excimer laser is a pulsed laser, and some solid-state lasers such as a YAG laser can be used as a continuous wave laser, a quasi-continuous wave laser, and a pulsed laser. In addition, as for a solid-state laser, any one of the second through fifth harmonics of a fundamental wave is preferably used.

In addition, a semiconductor laser such as GaN, GaAs, GaAlAs, or InGaAsP can be used.

In the case where a solid-state laser capable of continuous oscillation is used, with irradiation at the second through fourth harmonics of a fundamental wave, crystals with a large grain size can be obtained. For example, it is preferable that the second harmonic (532 nm) or the third harmonic (355 nm) of a YAG laser (the fundamental wave: 1064 nm) be used. The power density may be set to greater than or equal to 0.01 MW/cm$^2$ and less than or equal to 100 MW/cm$^2$ (preferably, greater than or equal to 0.1 MW/cm$^2$ and less than or equal to 10 MW/cm$^2$).

Here, for example, an excimer laser which is a pulsed laser is used. In the case where an excimer laser is used, the repetition rate is set to greater than or equal to 1 Hz and less than 10 MHz, preferably 100 Hz to 10 kHz, and the laser energy is set to 0.2 J/cm$^2$ to 0.45 J/cm$^2$, preferably 0.2 J/cm$^2$ to 0.35 J/cm$^2$, more preferably 0.2 J/cm$^2$ to 0.3 J/cm$^2$. When an excimer laser is used, heat diffusion to the first conductive film 102 can be suppressed. When a pulsed laser is used, peeling of the semiconductor film due to volume change in crystallization of the semiconductor film can be prevented compared to the case where a continuous wave laser is used.

As described above, by using irradiation of the first semiconductor film 105 with a laser beam, the second semiconductor film 106 with higher crystallinity is formed (FIG. 1C). Note that the semiconductor film with higher crystallinity is preferably a polycrystalline semiconductor film.

In this embodiment, the case where a glass substrate is used for the substrate 100 and a laser is used for crystallizing the first semiconductor film 105 is described. However, the first semiconductor film 105 may be crystallized with a thermal crystallization method in which rapid thermal annealing (RTA) or an annealing furnace is used after the step in which hydrogen in the first semiconductor film 105 is removed. Note that after the thermal crystallization step, the first semiconductor film 105 may be irradiated with the laser beam 150.

Moreover, before laser irradiation for the first semiconductor film 105, a catalytic element which can promote crystallization of the semiconductor film (for example, nickel) may be added to the first semiconductor film 105.

In a general thin film transistor having an inverted staggered bottom gate structure, a pattern of a gate electrode is formed, a gate insulating film is formed to cover the gate electrode, an amorphous semiconductor film or a microcrystalline semiconductor film is formed over the gate insulating film, and the semiconductor film is crystallized or the crystallinity of the semiconductor film is improved with irradiation with a laser beam, so that a crystalline semiconductor film is formed. By using a laser crystallization method, a laser beam is shaped into a linear beam or a rectangular beam, and a semiconductor film is irradiated with the linear beam or the rectangular beam for scanning, so that the semiconductor film is crystallized or the crystallinity of the semiconductor film is improved. At this time, since a pattern of a gate electrode is formed in a conventional thin film transistor having an inverted staggered bottom gate structure, the thermal conductivity of a surface of the semiconductor film, which is irradiated with the laser beam, becomes non-uniform. Therefore, variations in grain sizes of formed crystal grains are generated, which causes variations in electrical characteristics. Moreover, since there is a step caused by the pattern forming the gate electrode, leakage current may be generated between the semiconductor layer and the gate electrode in the vicinity of a side surface of the semiconductor layer. In addition, since there is a step caused by the pattern forming the gate electrode, there is a case in which it is difficult to form the semiconductor film so as to favorably cover a surface over which the semiconductor film is formed.

On the other hand, the semiconductor film is irradiated with a laser beam without a pattern forming the gate electrode in the method for manufacturing the thin film transistor in this embodiment; thus, the uniformity of the thermal conductivity is high and variations in electrical characteristics can be suppressed. Moreover, even in the case where a polycrystalline semiconductor film is directly formed, since a pattern forming the gate electrode is not formed at the time of forming the semiconductor film, leakage current generated between the semiconductor layer and the gate electrode is suppressed. Accordingly, it becomes easy to form the semiconductor film so as to favorably cover a surface over which the semiconductor film is formed.

An impurity semiconductor film 108 and the second conductive film 110 are stacked in this order over the second semiconductor film 106. Each of these films may have a single layer structure or a stacked structure including a plurality of layers.

The impurity semiconductor film 108 is a semiconductor film containing an impurity element imparting one conductivity type, and is formed using a material gas or the like for the formation of a semiconductor to which the impurity element imparting one conductivity type is added. For example, the impurity semiconductor film 108 is a silicon film containing phosphorus or boron, which is formed using a silane gas containing phosphine (chemical formula: PH$_3$) or diborane (chemical formula: B$_2$H$_6$). Note that similarly to the first conductive film 102 and the like, the material of the impurity semiconductor film 108 needs to be a material which has heat resistance and is not unintentionally etched or eroded in later steps. As long as these conditions are satisfied, the material of the impurity semiconductor film 108 is not limited to a particular material. Note that the crystallinity of the impurity semiconductor film 108 is not particularly limited as well; however, the impurity semiconductor film 108 is preferably formed using a crystalline semiconductor film. In the case where the impurity semiconductor film 108 is formed using a crystalline semiconductor, components which interrupt crystallization, typified by oxygen or nitrogen, are reduced, and the flow rate of a dilution gas such as hydrogen is decreased with respect to the flow rate of a deposition gas such as silane. In the case where the impurity semiconductor film 108 is formed using an amorphous semiconductor, the flow rate of a dilution gas is 1 time to 10 times, preferably 1 time to 5 times the flow rate of the deposition gas, whereas, when the impurity semiconductor film 108 is formed using a crystalline semiconductor, the flow rate of a dilution gas is 10 times to 2000 times, preferably 50 times to 200 times the flow rate of the deposition gas. In such a manner, a so-called microcrystalline semiconductor film is formed.

In addition, the impurity semiconductor film 108 can be formed with, for example, a CVD method (including a thermal CVD method, a plasma CVD method, or the like), or the like. However, the formation method of the impurity semiconductor film 108 is not limited to a particular method.

Note that it is preferable that a film containing an impurity element which has the same conductivity type as the impurity semiconductor film 108 at a lower concentration than the impurity semiconductor film 108 be formed between the second semiconductor film 106 and the impurity semiconductor film 108. When the film containing an impurity element at a lower concentration is formed, a lightly doped drain (LDD) region is formed between the second semiconductor film 106 and the impurity semiconductor film 108, and hot carrier degradation can be prevented. Note that a film containing an impurity element at a lower concentration is not necessarily formed as a film, and there may be only a region containing an impurity element at a lower concentration.

The second conductive film 110 is formed using a material which is conductive (the materials mentioned as the material of the first conductive film 102 or the like) but is different material from the material used for the first conductive film 102. Here, the phrase "different material" means a material having a different main component. Specifically, a material which is not easily etched with second etching which is described later is preferably selected. Further, similarly to the first conductive film 102 and the like, the material of the second conductive film 110 needs to be a material which has heat resistance and is not unintentionally etched or eroded in later steps. Accordingly, as long as these conditions are satisfied, the material of the second conductive film 110 is not limited to a particular material.

In addition, the second conductive film 110 can be formed with, for example, a sputtering method, a CVD method (including a thermal CVD method, a plasma CVD method, or the like), or the like. However, the formation method of the second conductive film 110 is not limited to a particular method.

Next, a first resist mask 112 is formed over the second conductive film 110 (FIG. 2A, FIG. 5A, FIG. 8A, FIG. 11A, and FIG. 14A). The first resist mask 112 is a resist mask having a recessed portion or a projected portion. In other words, the first resist mask 112 can also be referred to as a resist mask including a plurality of regions (here, two regions) having different thicknesses. In the first resist mask 112, the thick region is called a projected portion of the first resist mask 112 and the thin region is called a recessed portion of the first resist mask 112.

In the first resist mask 112, the projected portion is formed in a region where a second wiring layer 120 is to be formed later, and the recessed portion is formed in a region where a semiconductor film is exposed and the second wiring layer 120 is not formed.

The first resist mask 112 can be formed using a multi-tone mask. Here, multi-tone masks are described below with reference to FIGS. 27A-1 and 27A-2 and FIGS. 27B-1 and 27B-2.

A multi-tone mask is a mask capable of light exposure with multi-level light intensity, for example, light exposure with three levels of light intensity to provide an exposed region, a half-exposed region, and an unexposed region. With the use of the multi-tone mask, one-time light exposure and development process allow a resist mask with plural thicknesses (for example, two levels of thicknesses) to be formed. Therefore, by the use of a multi-tone mask, the number of photomasks can be reduced.

Figures 1, 27A:
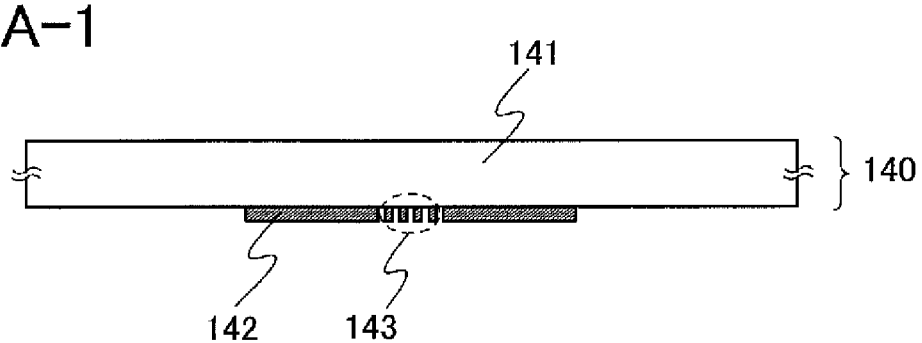
FIGS. 27A-1 and 27A-2 and FIGS. 27B-1 and 27B-2 illustrate embodiments of a multi-tone mask.
Figures 2, 27A:
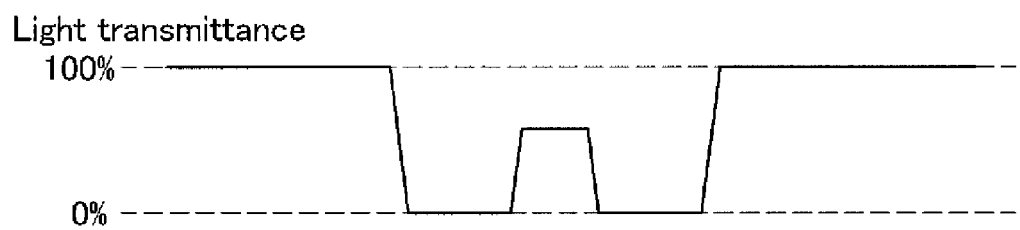
Figures 1, 27B:
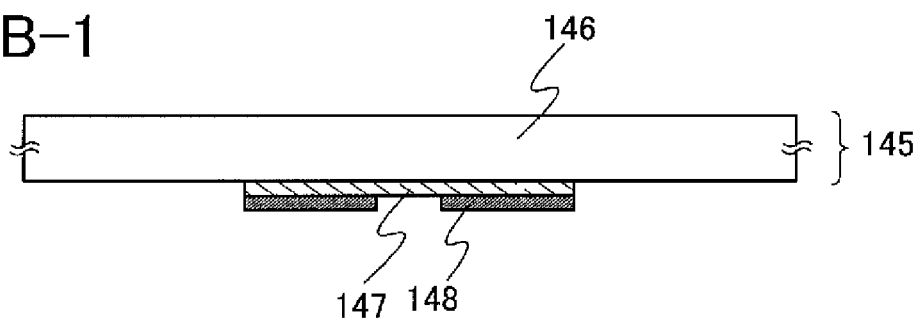
Figures 2, 27B:
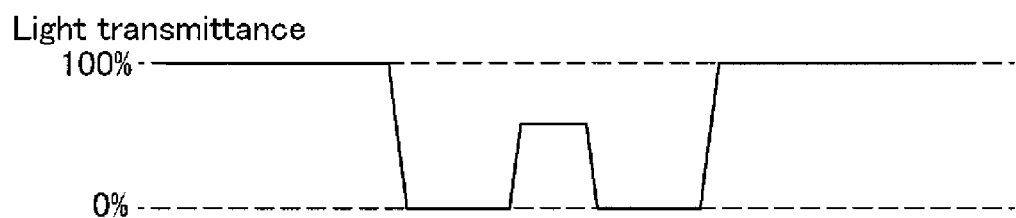

FIG. 27A-1 and FIG. 27B-1 are examples of cross-sectional views of multi-tone masks. A gray-tone mask 140 is illustrated in FIG. 27A-1 and a half-tone mask 145 is illustrated in FIG. 27B-1.

The gray-tone mask 140 illustrated in FIG. 27A-1 includes a light-blocking portion 142 formed using a light-blocking film on a substrate 141 having a light-transmitting property, and a diffraction grating portion 143 provided using a pattern of the light-blocking film.

The diffraction grating portion 143 has slits, dots, mesh, or the like which are provided at an interval less than or equal to the resolution limit of light used for light exposure, whereby the amount of light transmitted through the diffraction grating portion 143 is adjusted. Note that the slits, dots, or mesh provided at the diffraction grating portion 143 may be provided at regular or irregular intervals.

As the substrate 141 having a light-transmitting property, quartz or the like can be used. The light-blocking film forming the light-blocking portion 142 and the diffraction grating portion 143 may be formed using a metal film and preferably provided using Cr, chromium oxide, or the like.

In the case where the gray-tone mask 140 is irradiated with light for light exposure, as illustrated in FIG. 27A-2, the transmittance in the region overlapping with the light-blocking portion 142 is 0%, and the transmittance in the region where neither the light-blocking portion 142 nor the diffraction grating portion 143 is provided is 100%. Further, the transmittance at the diffraction grating portion 143 is approximately in the range of 10% to 70%, which can be adjusted by the interval of slits, dots, mesh, or the like of the diffraction grating.

The half-tone mask 145 illustrated in FIG. 27B-1 includes a semi-light-transmitting portion 147 formed using a semi-light-transmitting film on a substrate 146 having a light-transmitting property, and a light-blocking portion 148 formed using a light-blocking film.

The semi-light-transmitting portion 147 can be formed using a film of MoSiN, MoSi, MoSiO, MoSiON, CrSi, or the like. The light-blocking portion 148 may be formed using a metal film similar to the light-blocking film of the gray-tone mask and preferably provided using Cr, chromium oxide, or the like.

In the case where the half-tone mask 145 is irradiated with light for light exposure, as illustrated in FIG. 27B-2, the transmittance in the region overlapping with the light-blocking portion 148 is 0%, and the transmittance in the region where neither the light-blocking portion 148 nor the semi-light-transmitting portion 147 is provided is 100%. Further, the transmittance in the semi-light-transmitting portion 147 is approximately in the range of 10% to 70%, which can be adjusted by the kind, the thickness, or the like of the material.

With light exposure using the multi-tone mask and development, the first resist mask 112 which includes regions having different thicknesses can be formed.

Note that this embodiment is not limited to this, and the first resist mask may be formed without using a multi-tone mask. Further, as described above, the first resist mask may be a resist mask which has neither a recessed portion nor a projected portion.

Next, first etching is performed using the first resist mask 112. That is, the first conductive film 102, the second insulating film 104, the second semiconductor film 106, the impurity semiconductor film 108, and the second conductive film 110 are patterned by etching to form a thin-film stack body 114 and an etched first conductive film 113. At this time, an upper portion of the first insulating film 101 is also etched to form an etched first insulating film 115 in many cases (FIG. 2B, FIG. 5B, FIG. 8B, FIG. 11B, FIG. 14B, and FIG. 18). This etching step is called "first etching". As the first etching, dry etching or wet etching may be employed. It is preferable to employ a highly anisotropic etching method (physical etching). By using a highly anisotropic etching method as the first etching, the pattern processing accuracy can be improved. Note that the first etching can be performed in one step when dry etching is employed as the first etching, while the first etching may is preferably performed in plural steps when wet etching is employed as the first etching. This is because in the wet etching, the etching rate varies depending on the kind of films subjected to etching and thus, it is difficult to etch all films in one step. In this embodiment, when the first etching is performed in one step, dry etching is used; and when the first etching is performed in plural steps, dry etching is used at least for the etching of the first conductive film 102. That is, it is preferable to process at least the first conductive film 102 with dry etching to form the etched first conductive film 113.

The etched first insulating film 115 which serves as a base insulating film can prevent "unintentional etching" of the substrate 100 in the first etching. Therefore, an impurity metal element included in the substrate 100 can be prevented from attaching to and entering a semiconductor film.

Note that as the first etching, dry etching may be performed in three stages, for example. First, etching is performed using a mixed gas of a $Cl_2$ gas, a $CF_4$ gas, and an $O_2$ gas. Then, etching is performed using only a $Cl_2$ gas, and lastly, etching is performed using only a $CHF_3$ gas.

Next, second etching is performed using the first resist mask 112. That is, the etched first conductive film 113 is further patterned with etching to form a first wiring layer 116 (collective term of 116A, 116B, 116C and 116D; FIG. 2C, FIG. 5C, FIG. 8C, FIG. 11C, FIG. 14C, and FIG. 19). This etching step is called "second etching".

Note that the first wiring layer 116 includes a gate electrode of the thin film transistor, a gate wiring, one electrode of a capacitor, a capacitor wiring, and a supporting portion. When a first wiring layer is referred to as a "first wiring layer 116A", the first wiring layer means an electrode layer forming a gate wiring and a gate electrode of a thin film transistor. When a first wiring layer is referred to as a "first wiring layer 116B" or a "first wiring layer 116D", the first wiring layer means an electrode layer forming a supporting portion. When a first wiring layer is referred to as a "first wiring layer 116C", the first wiring layer means an electrode layer forming a capacitor wiring and one electrode of a capacitor. These first wiring layers are collectively referred to as the "first wiring layer 116".

The second etching is performed under such etching conditions that a side surface of the first wiring layer 116 formed using the first conductive film 102 is located on an inner side than a side surface of the thin-film stack body 114. In other words, the second etching is performed so that the side surface of the first wiring layer 116 is in contact with a bottom surface of the thin-film stack body 114 (so that the width of the first wiring layer 116 is narrower than that of the thin-film stack body 114 in the cross section along the lines A1-A2 of FIG. 19, FIG. 20, FIG. 21, and FIG. 22). Further, the second etching is performed under such conditions that the etching rate of the second conductive film 110 is low and the etching rate of the first conductive film 102 is high. In other words, the second etching is performed under the conditions that the etching selectivity of the first conductive film 102 with respect to the second conductive film 110 is high. By performing the second etching under such conditions, the first wiring layer 116 can be formed.

Note that the shape of the side surface of the first wiring layer 116 is not particularly limited. For example, the shape may be a tapered shape. The shape of the side surface of the first wiring layer 116 is determined depending on the conditions such as a chemical solution used in the second etching.

Here, the phrase "conditions that the etching rate of the second conductive film 110 is low and the etching rate of the first conductive film 102 is high" or "conditions that the etching selectivity of the first conductive film 102 with respect to the second conductive film 110 is high" means conditions satisfying the following first requirement and second requirement.

Figure 2A:
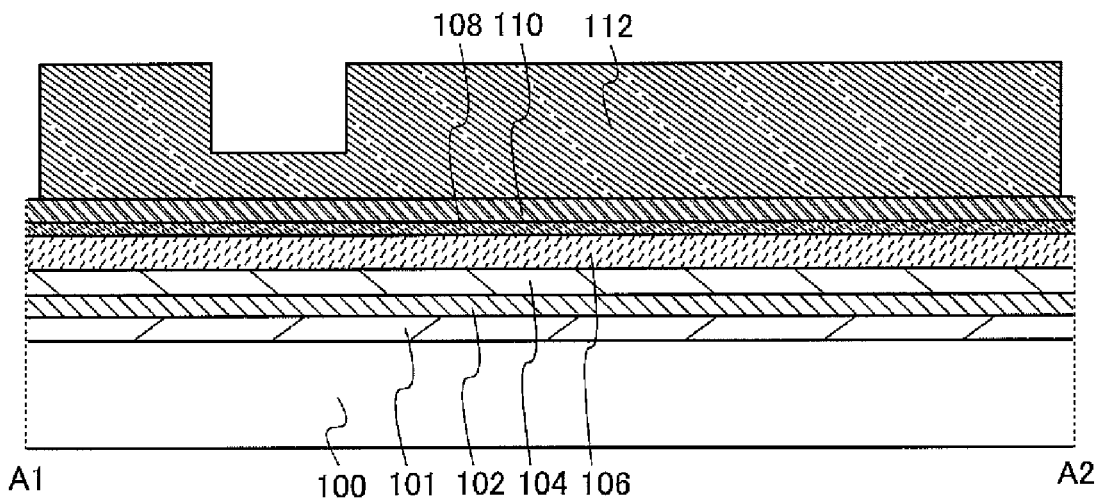
FIGS. 2A to 2C illustrate one example of methods for manufacturing the display device including the thin film transistor.
Figure 2B:
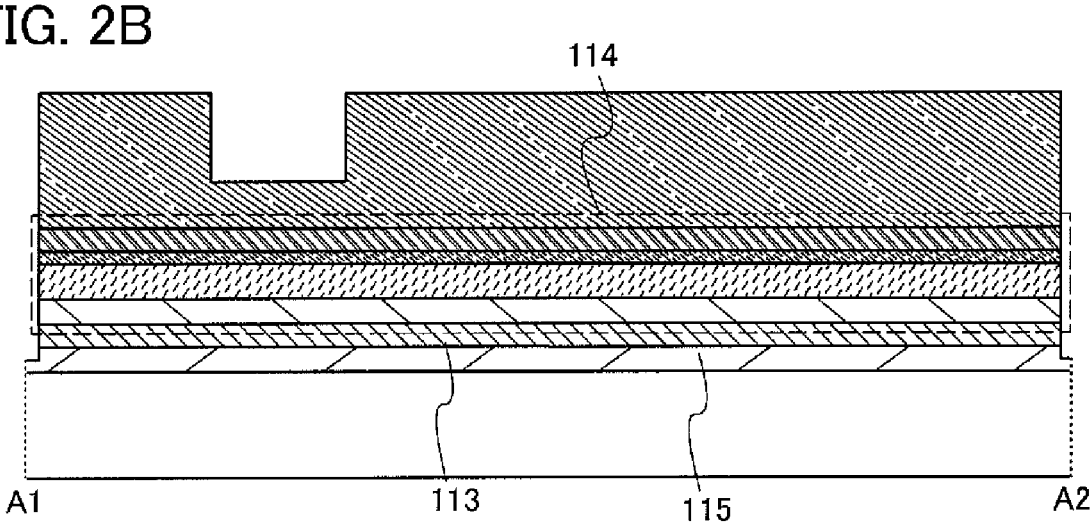
Figure 2C:
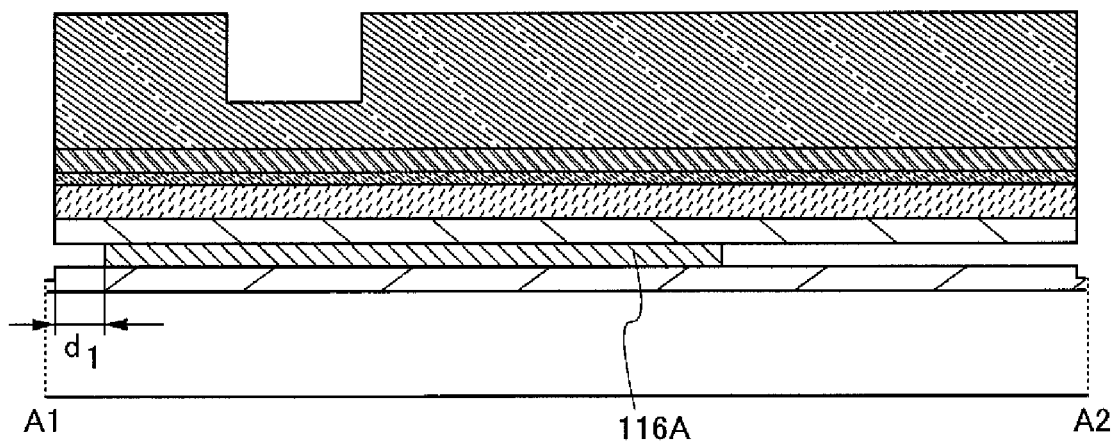

The first requirement is that the first wiring layer 116 is left in an appropriate place. The appropriate places for the first wiring layer 116 are regions indicated by dotted lines in FIG. 19, FIG. 20, FIG. 21, and FIG. 22. That is, it is necessary that the first wiring layer 116 is left so as to form a gate wiring (including a gate electrode), a capacitor wiring, and a supporting portion after the second etching. In order that the first wiring layer forms the gate wiring and the capacitor wiring, the second etching needs to be performed so as not to disconnect these wirings. As illustrated in FIG. 2C and FIG. 22, the side surface of the first wiring layer 116 is preferably located on an inner side than the side surface of the thin-film stack body 114 by a distance $d_1$, and the distance $d_1$ may be set as appropriate by a practitioner according to the layout.

The second requirement is that a minimum width $d_3$ of the gate wiring or the capacitor wiring formed using the first wiring layer 116 and a minimum width $d_2$ of a source wiring formed using a second wiring layer 120A have appropriate values (FIG. 22). This is because when the second wiring layer 120A is etched in the second etching, the minimum width $d_2$ of the source wiring is reduced, resulting in excessive increase in the current density of the source wiring and degradation of electrical characteristics. Therefore, the second etching is performed under the conditions that the etching rate of the first conductive film 102 is not extraordinarily high and the etching rate of the second conductive film 110 is as low as possible.

Note that it is difficult to increase the minimum width $d_2$ of the source wiring. This is because since the minimum width $d_2$ of the source wiring is determined by a minimum width $d_4$ of the semiconductor film overlapping with the source wiring, enlargement of the minimum width $d_2$ of the source wiring requires the increase in the minimum width $d_4$ of the semiconductor film, which leads to difficulty in insulating the gate wiring and the capacitor wiring, which are adjacent to each other, from each other. Therefore, the minimum width $d_4$ of the semiconductor film is set smaller than approximately twice the distance $d_1$. In other words, the distance $d_1$ is set larger than approximately half the minimum width $d_4$ of the semiconductor film.

It is acceptable as long as there is at least one portion where the width of the semiconductor film overlapping with the source wiring is the minimum width $d_4$ between the gate wiring and the capacitor wiring which is adjacent to the gate wiring. It is preferable that the width of the semiconductor film in a region adjacent to the gate wiring and a region adjacent to the capacitor wiring be the minimum width $d_4$ as illustrated in FIG. 22.

In addition, it is preferable that the width of the electrode in a portion connected to a pixel electrode layer, which is formed using the second wiring layer, be the minimum width $d_2$ of the source wiring.

As described above, the second etching under the condition that side-etching can also be performed is very important. This is because with the second etching in which the first conductive film 102 is side-etched, the gate wiring and the capacitor wiring, which are adjacent to each other and are formed using the first wiring layer 116, can be formed to be insulated from each other (FIG. 19).

Here, since the second etching is etching in which side-etching is performed, the second etching proceeds in a substantially isotropic manner. When the first conductive film 102 is processed with the first etching to form the etched first conductive film 113 and the first wiring layer 116 is formed with the second etching in the above manner, the distance $d_1$ can be made smaller than the thickness of the first conductive film 102. That is, the distance $d_1$ can be designed independently of the thickness of the first conductive film 102, thereby increasing the freedom of layout design of a pixel structure.

Here, the word "side-etching" means etching in which a film is etched not only in a thickness direction of the film (a direction perpendicular to the substrate surface or a direction perpendicular to the surface of a base film) but also in a direction perpendicular to the thickness direction (a direction parallel to the substrate surface or a direction parallel to the surface of the base film). An end portion of the film subjected to side-etching can have various shapes depending on the etching rate of an etching gas or a chemical solution used for the etching of the film. However, the end portion of the film is, in many cases, formed with a curved surface.

Figure 19:
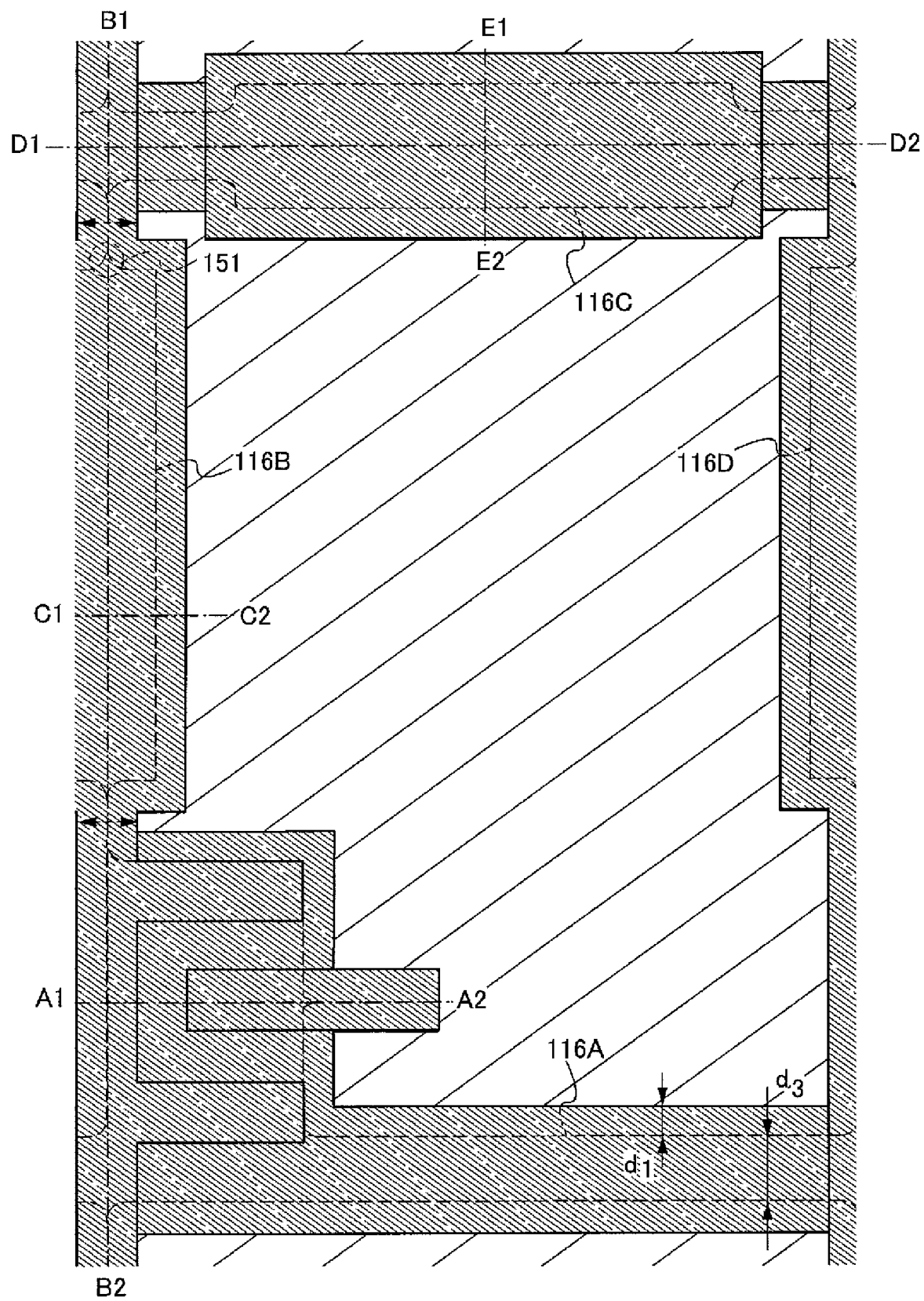
FIG. 19 illustrates one example of methods for manufacturing the display device including the thin film transistor.
Figure 20:
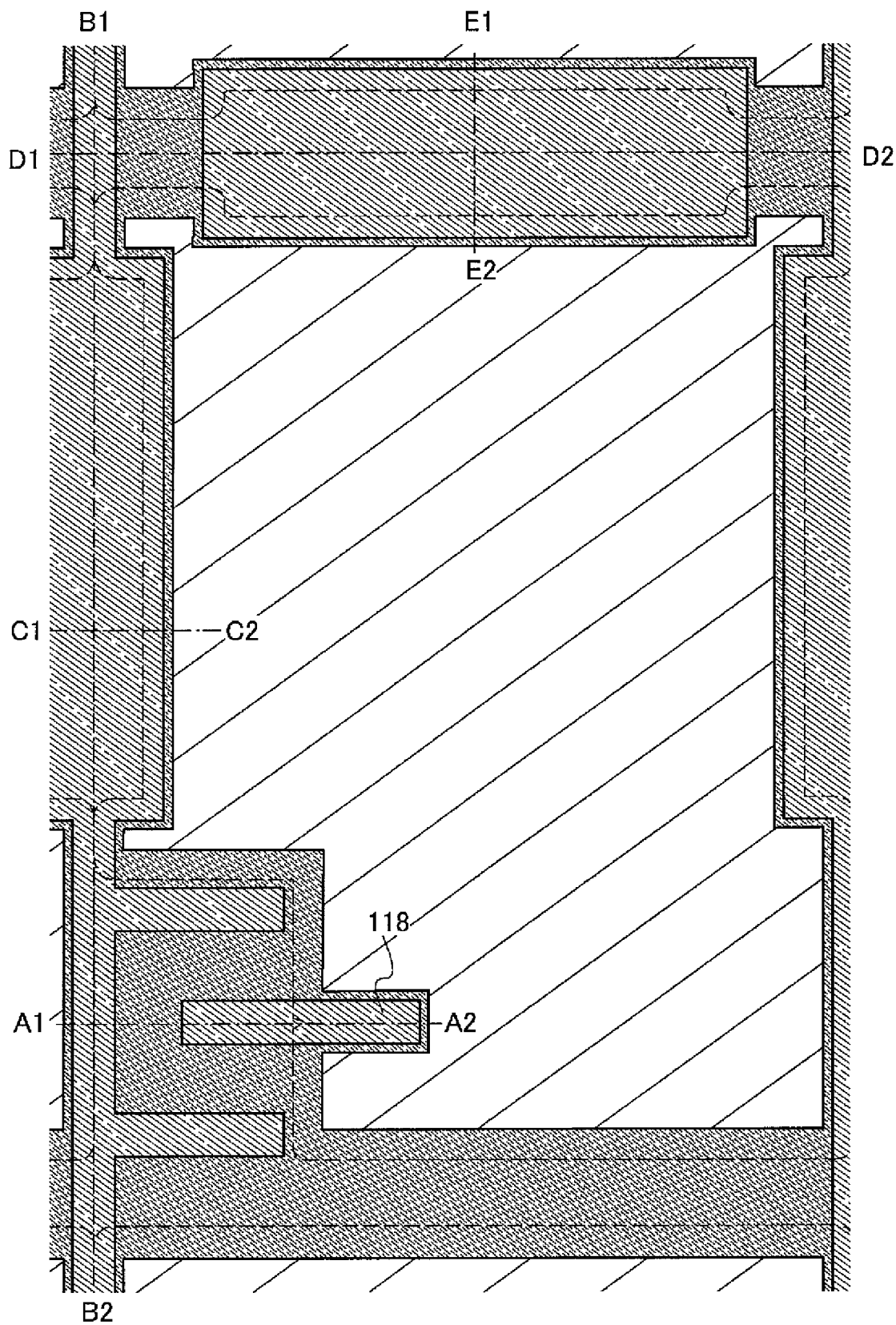
FIG. 20 illustrates one example of methods for manufacturing the display device including the thin film transistor.
Figure 21:
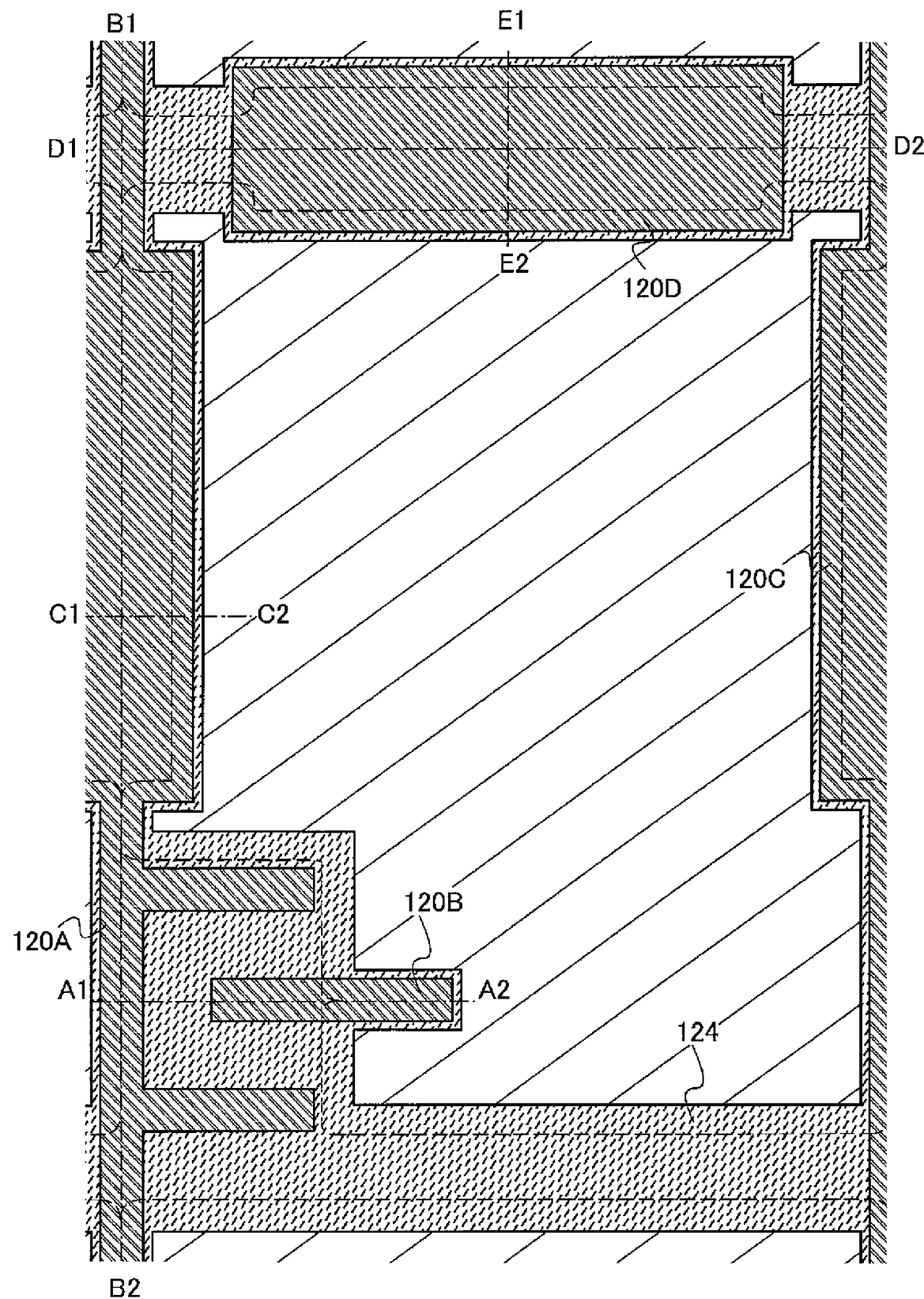
FIG. 21 illustrates one example of methods for manufacturing the display device including the thin film transistor.

As illustrated in FIG. 19, the thin-film stack body 114 formed with the first etching is designed to be narrow in a portion which is in contact with a supporting portion formed using the first wiring layer 116B and the first wiring layer 116D (see the portions indicated only by two-headed arrows in FIG. 19). With this structure, the first wiring layer 116A and the first wiring layer 116B or the first wiring layer 116D can be disconnected to be insulated from each other with the second etching.

Figure 23:
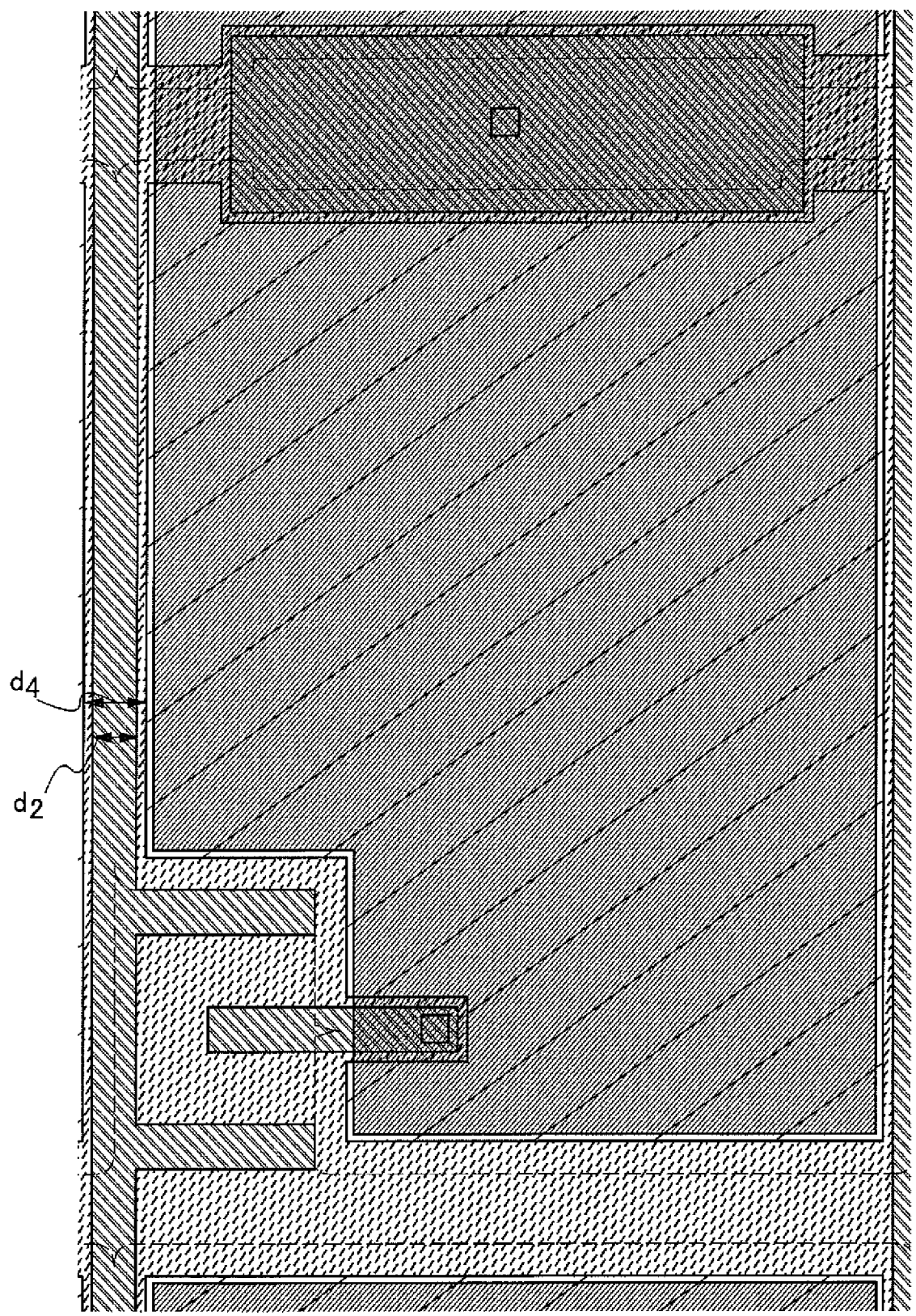
FIG. 23 illustrates one example of a display device including a thin film transistor.

The first wiring layer 116B and the first wiring layer 116D illustrated in FIG. 19 each serve as a supporting portion which supports the thin-film stack body 114. By the existence of the supporting portion, peeling of a film such as the second insulating film 104 formed over the first wiring layer 116 can be prevented. Further, by the existence of the supporting portion, a cavity region formed in contact with the first wiring layer 116 with the second etching can be prevented from being larger than necessary. Furthermore, it is preferable to provide the supporting portion because the thin-film stack body 114 can be prevented from being broken or damaged due to its own weight and, accordingly, fabrication yield is increased. However, this embodiment is not limited to the mode with the supporting portion, and the supporting portion is not necessarily provided. An example of a top view of the mode without the supporting portion (corresponding to FIG. 22) is illustrated in FIG. 23.

As described above, the second etching is preferably performed with wet etching.

In the case where the second etching is performed with wet etching, Al or Mo may be deposited as the first conductive film 102, Ti or W may be deposited as the second conductive film 110, and a chemical solution containing nitric acid, acetic acid, and phosphoric acid may be used for etching. Alternatively, Mo may be deposited as the first conductive film 102, Ti, Al, or W may be deposited as the second conductive film 110, and a chemical solution containing an aqueous solution of hydrogen peroxide may be used for etching.

In the case where the second etching is performed with wet etching, it is most preferable that a stacked film in which Mo is deposited over Al to which Nd is added be formed as the first conductive film 102, W be deposited as the second conductive film 110, and a chemical solution containing nitric acid at 2%, acetic acid at 10%, and phosphoric acid at 72% be used for etching. With the use of a chemical solution having such a composition, the etched first conductive film 113 can be further etched without etching the second conductive film 110. Note that Nd is added to the first conductive film 102 for the purpose of increasing heat resistance and preventing the formation of hillocks of Al.

As illustrated in FIG. 19, the first wiring layer 116 has a projection (for example, a horn 151) when seen from the above. This is because the second etching for forming the first wiring layer 116 proceeds almost isotropically, so that the distance $d_1$ between the side surface of the first wiring layer 116 and the side surface of the thin-film stack body 114 is almost uniform. This horn might cause parasitic capacitance. Further, in the case where the horn is formed with a long length, insulation between wirings which are adjacent to each other might be incomplete, which might cause short-circuiting. Therefore, an opening (not illustrated) is formed in a region of the first wiring layer 116 in which a horn is formed in order to prevent the formation of the horn. Specifically, an opening is formed, in advance, in the first resist mask 112 provided above the region of the first wiring layer 116 in which a horn is formed, and the second etching may be performed in a state where part of the first conductive film 102, which overlaps with the opening, is exposed. Accordingly, the formation of the horn can be prevented or the horn can be made small.

Next, the first resist mask 112 is made to reduce (recede). For example, the thickness of the first resist mask 112 is reduced. While the second conductive film 110 is exposed, a second resist mask 118 is formed. As a method for forming the second resist mask 118 by reduction (recession) of the first resist mask 112, for example, ashing using oxygen plasma can be given. However, the method for forming the second resist mask 118 by reduction (recession) of the first resist mask 112 is not limited to this. Although the case where the second resist mask 118 is formed after the second etching is described here, the second etching may be performed after the formation of the second resist mask 118.

Next, the second conductive film 110 in the thin-film stack body 114 is etched using the second resist mask 118, so that the second wiring layer 120 (collective term of 120A, 120B, 120C and 120D) is formed (FIG. 3A, FIG. 6A, FIG. 9A, FIG. 12A, FIG. 15A, and FIG. 20). Here, as the etching conditions, the conditions under which films other than the second conductive film 110 are not unintentionally etched or eroded or are not easily unintentionally etched or eroded are selected. In particular, it is important that etching be performed under the conditions that the first wiring layer 116 is not unintentionally etched or eroded or is not easily unintentionally etched or eroded.

Note that the second wiring layer 120 includes the source electrode or the drain electrode of the thin film transistor, the source wiring or the drain wiring, the electrode that connects the thin film transistor to the pixel electrode, and the other of the electrodes of the capacitor. When a second wiring layer is referred to as the "second wiring layer 120A" or a "second wiring layer 120C", the second wiring layer means an electrode layer which includes one of the source electrode and the drain electrode of the thin film transistor, a source wiring, and a drain wiring; when a second wiring layer is referred to as a "second wiring layer 120B", the second wiring layer means an electrode layer which includes the other of the source electrode and the drain electrode of the thin film transistor and the electrode that connects the thin film transistor to the pixel electrode; and when a second wiring layer is referred to as a "second wiring layer 120D", the second wiring layer means an electrode layer which includes the other of the electrodes of the capacitor. Then, these second wiring layers are collectively referred to as the "second wiring layer 120".

Note that the etching of the second conductive film 110 in the thin-film stack body 114 may be performed with wet etching or dry etching.

Then, the impurity semiconductor film 108 and an upper portion of the second semiconductor film 106 (back channel portion) in the thin-film stack body 114 are etched to form an impurity semiconductor layer 122 (collective term of 122A, 122B, 122C and 122D) and an etched second semiconductor film 124 (FIG. 3B, FIG. 6B, FIG. 9B, FIG. 12B, FIG. 15B, and FIG. 21). At the same time, Here, as the etching conditions, the conditions under which films other than the impurity semiconductor film 108 and the second semiconductor film 106 are not unintentionally etched or eroded or are not easily unintentionally etched or eroded are selected. In particular, it is important that etching be performed under the conditions that the first wiring layer 116 is not unintentionally etched or eroded or is not easily unintentionally etched or eroded.

Here, an impurity semiconductor layer 122A is provided so as to overlap with the second wiring layer 120A. An impurity semiconductor layer 122B is provided so as to overlap with the second wiring layer 120B. An impurity semiconductor layer 122C is provided so as to overlap with the second wiring layer 120C. An impurity semiconductor layer 122D is provided so as to overlap with the second wiring layer 120D.

Note that the etching of the impurity semiconductor film 108 and the upper portion of the second semiconductor film 106 (back channel portion) in the thin-film stack body 114 can be performed with dry etching or wet etching.

Figure 3A:
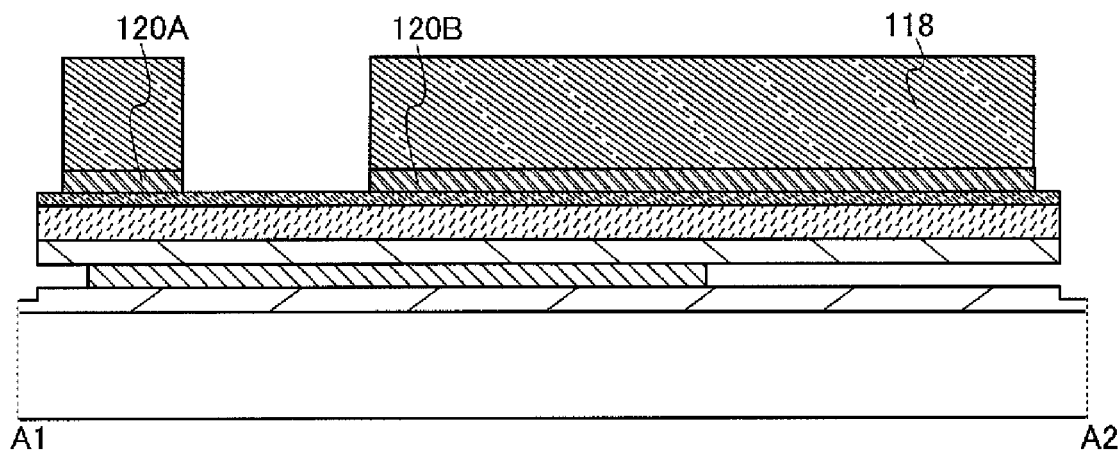
Figure 3B:
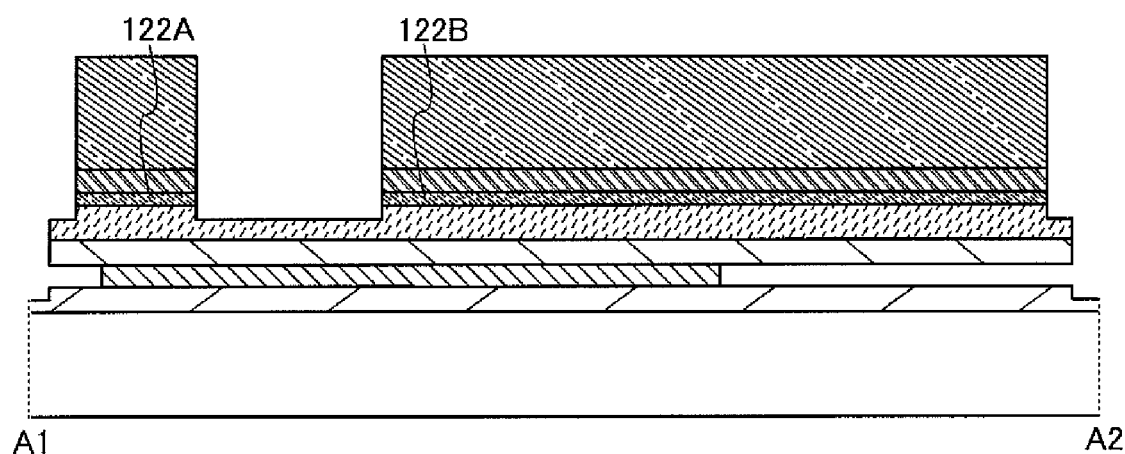
Figure 3C:
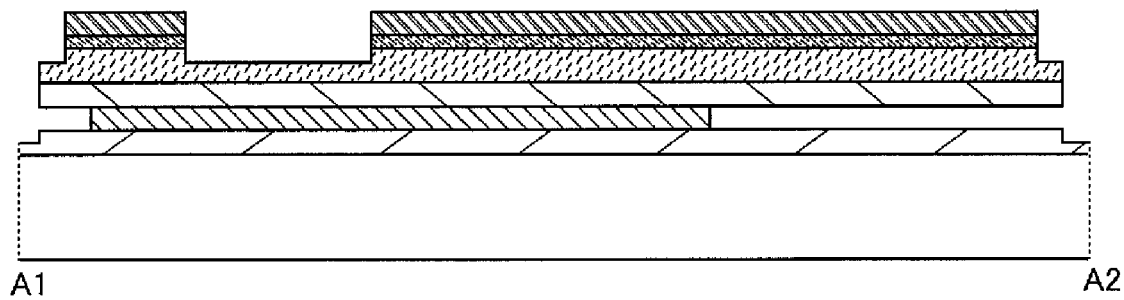
Figure 4A:
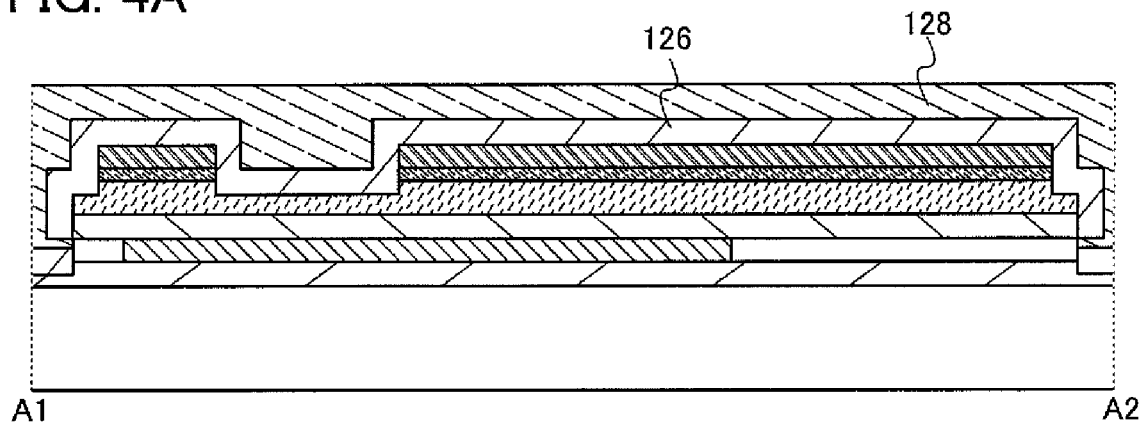
FIGS. 4A to 4C illustrate one example of methods for manufacturing the display device including the thin film transistor.
Figure 4B:
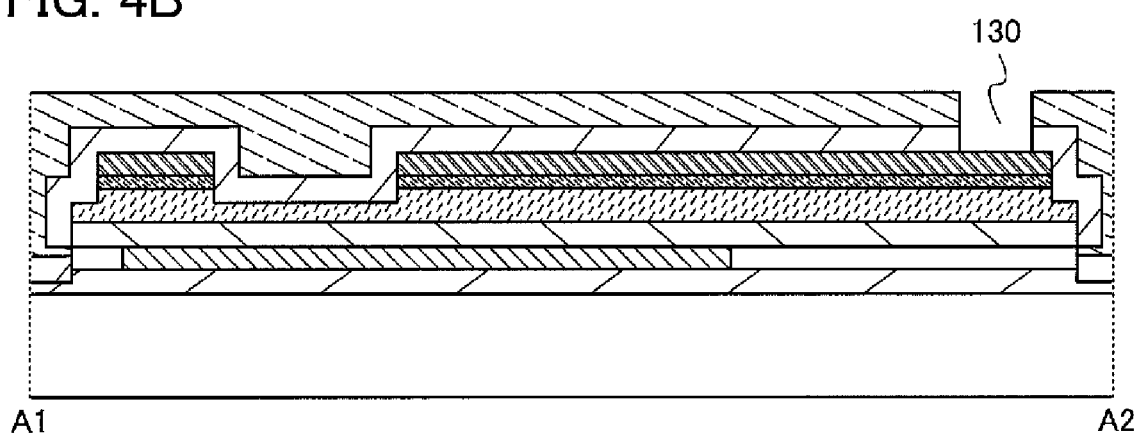
Figure 4C:
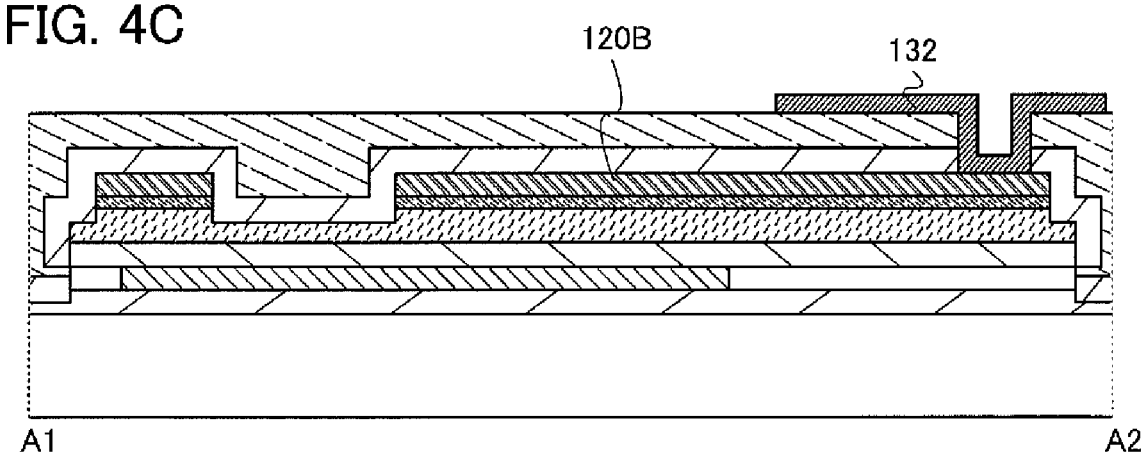
Figure 5A:
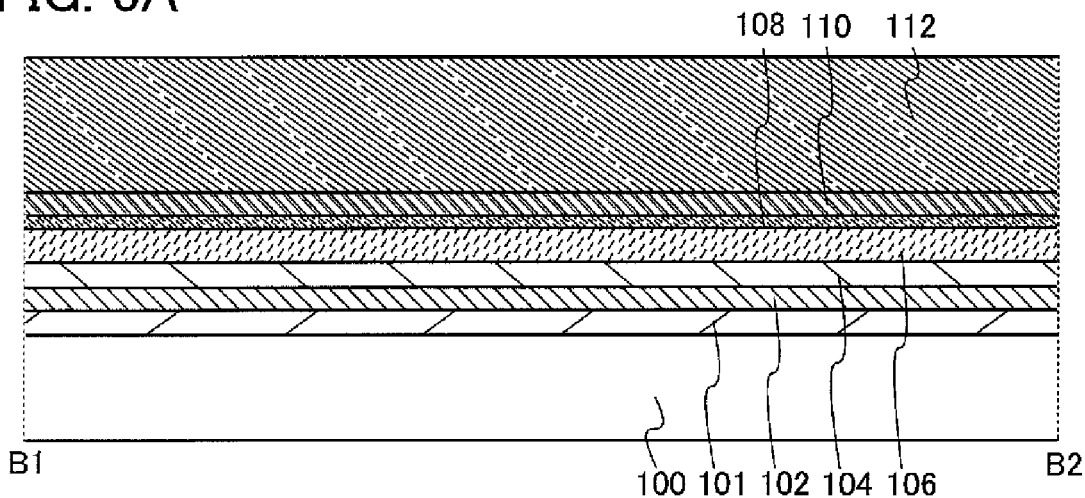
FIGS. 5A to 5C illustrate one example of methods for manufacturing the display device including the thin film transistor.
Figure 5B:
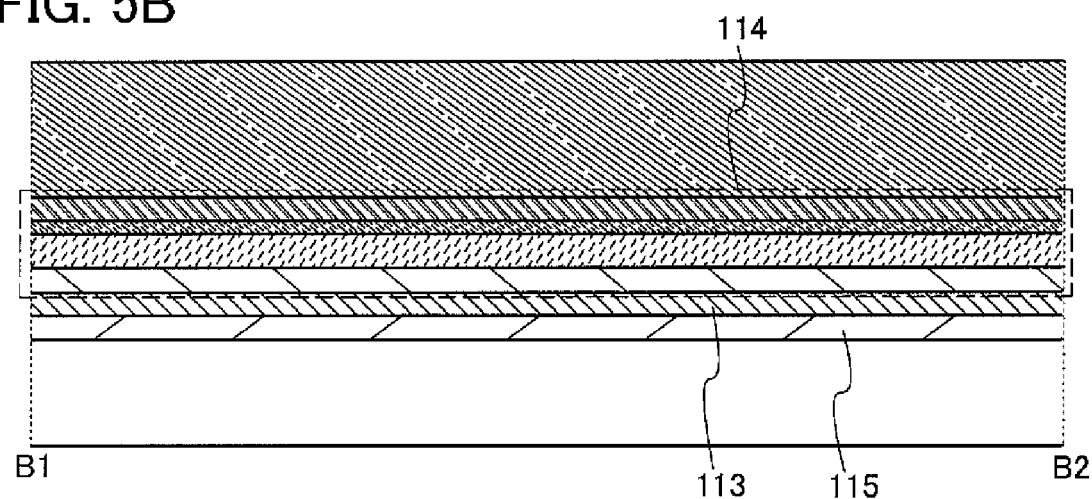
Figure 5C:
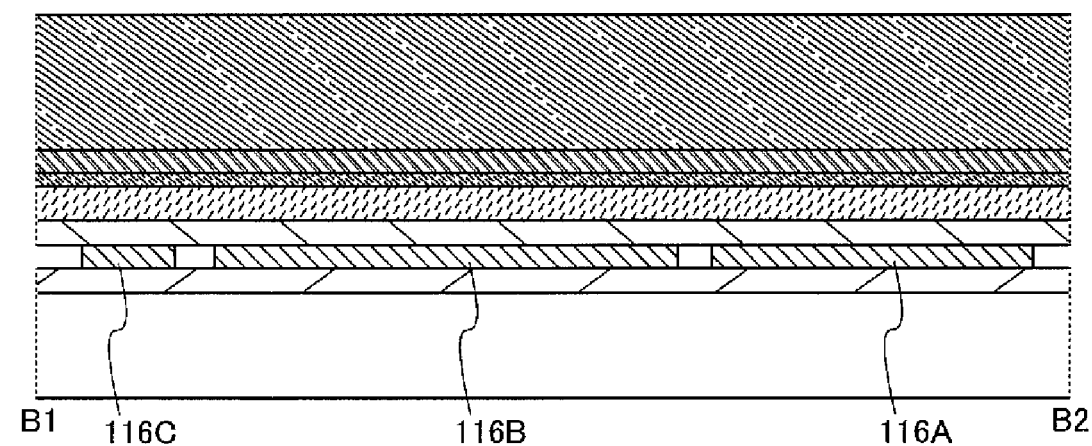
Figure 6A:
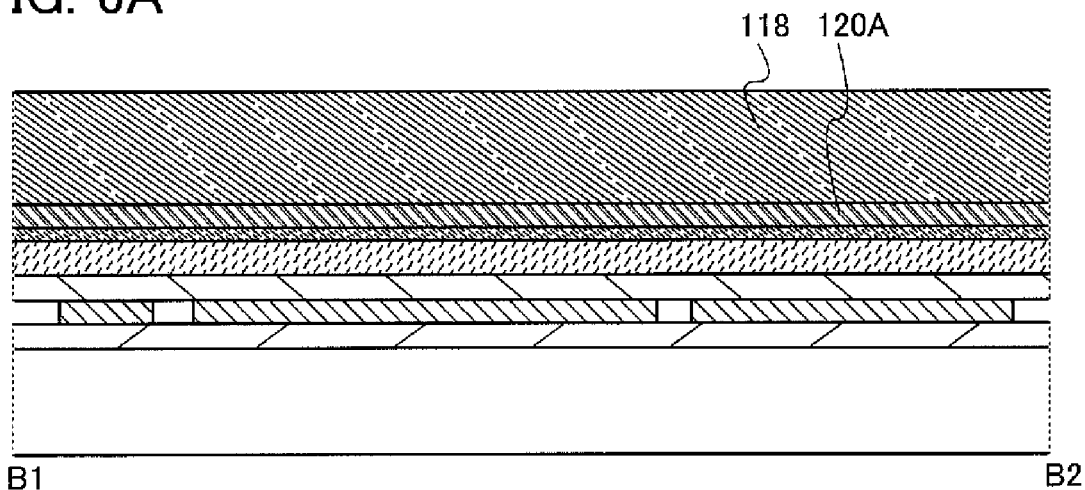
FIGS. 6A to 6C illustrate one example of methods for manufacturing the display device including the thin film transistor.
Figure 6B:
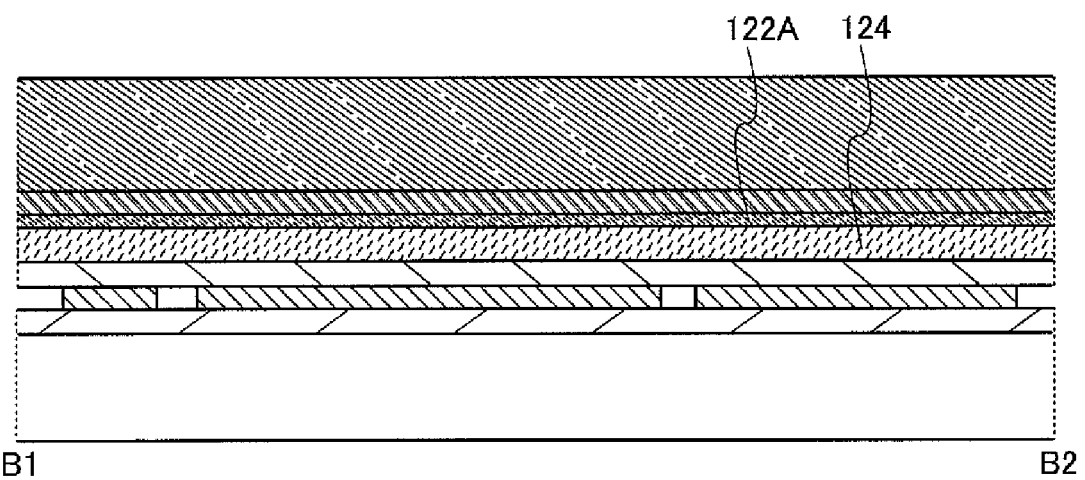
Figure 6C:
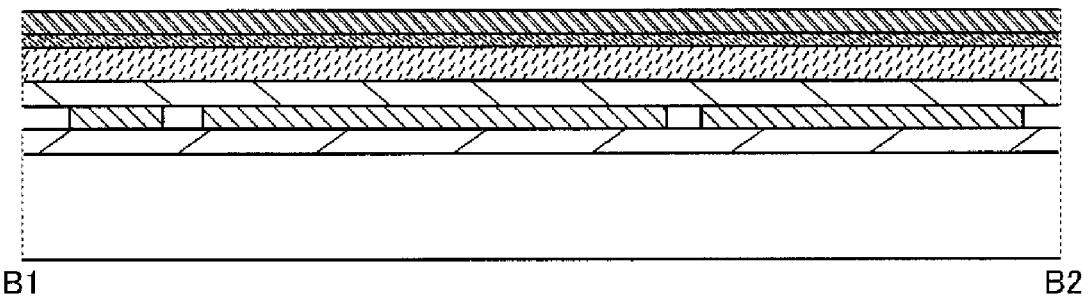
Figure 7A:
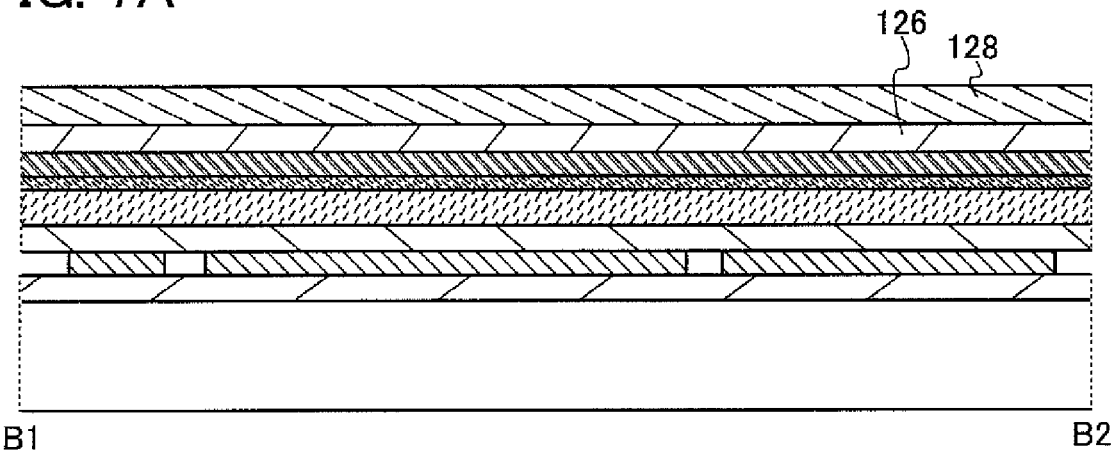
FIGS. 7A to 7C illustrate one example of methods for manufacturing the display device including the thin film transistor.
Figure 7B:
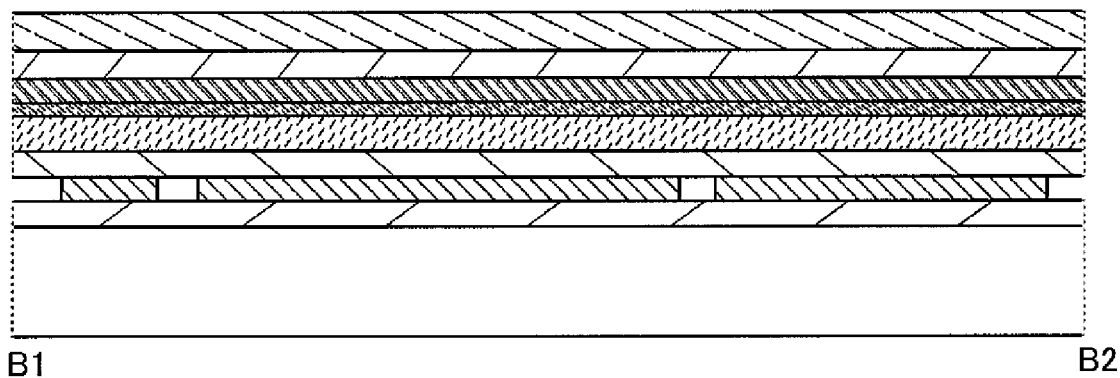
Figure 7C:
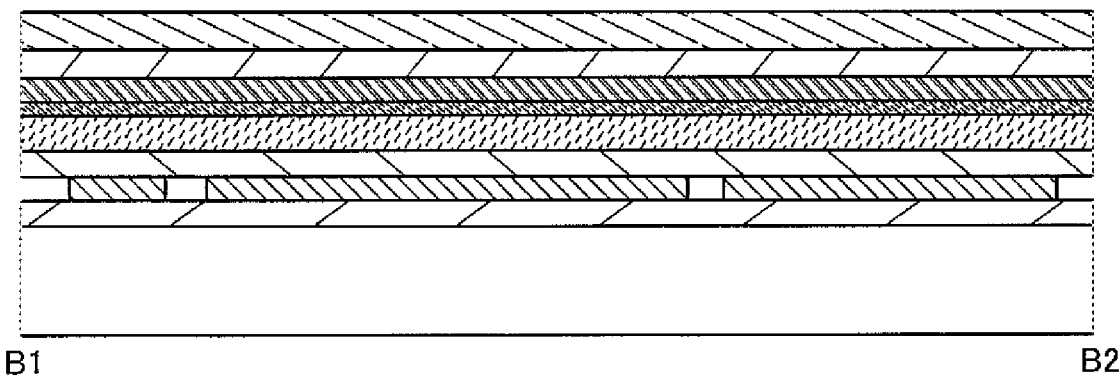
Figure 8A:
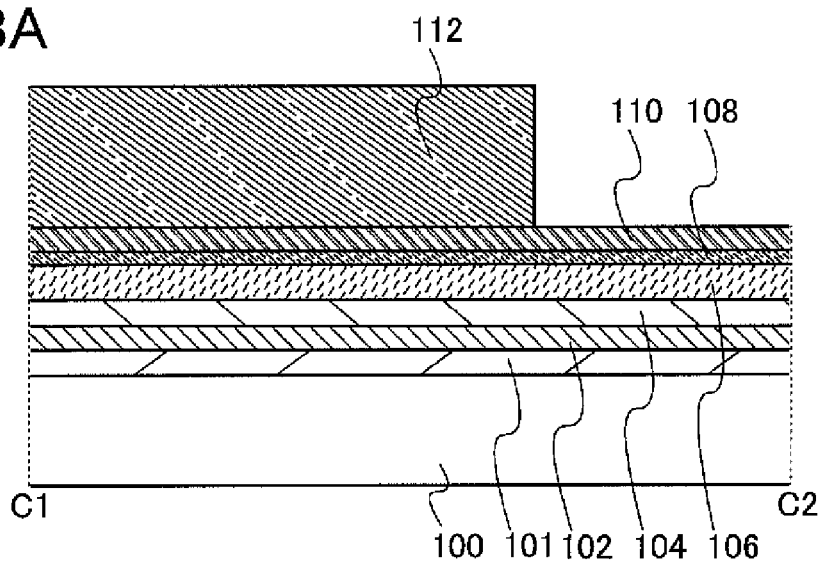
FIGS. 8A to 8C illustrate one example of methods for manufacturing the display device including the thin film transistor.
Figure 8B:
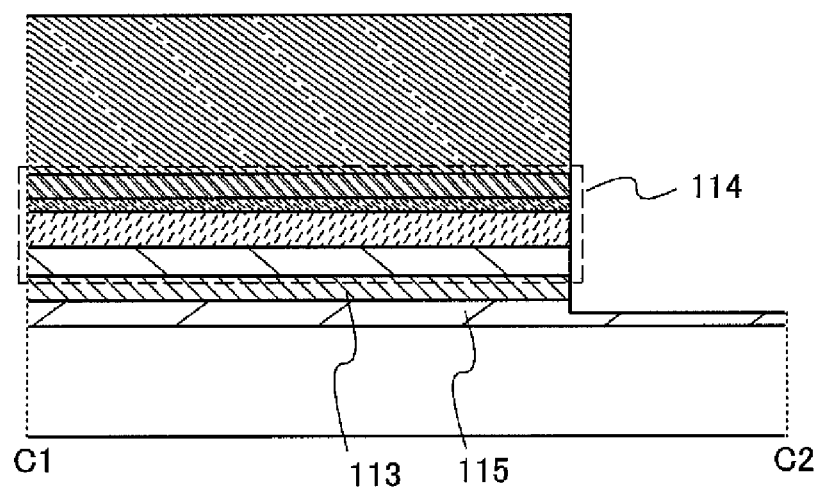
Figure 8C:
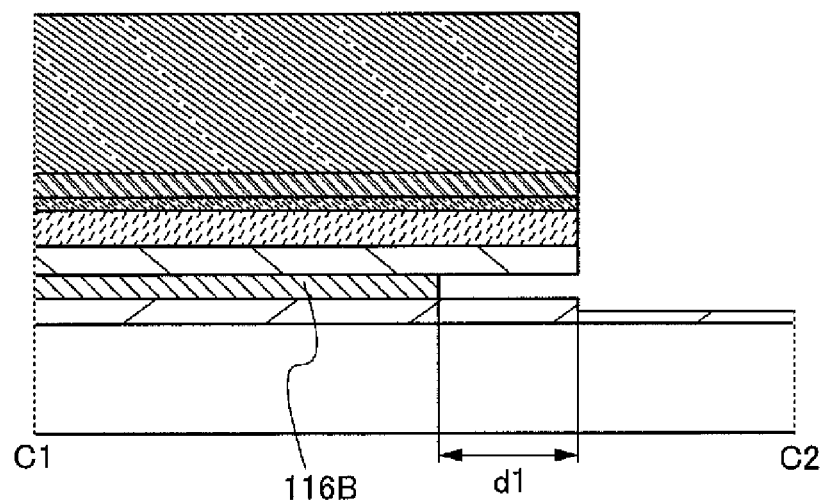
Figure 9A:
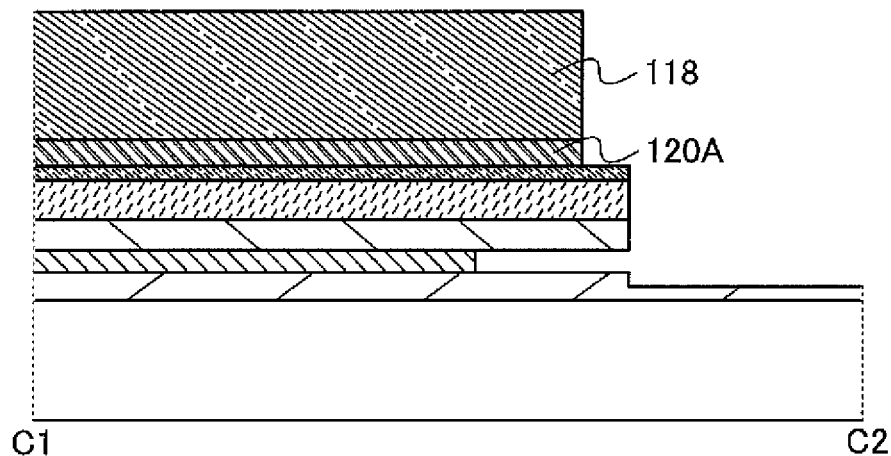
FIGS. 9A to 9C illustrate one example of methods for manufacturing the display device including the thin film transistor.
Figure 9B:
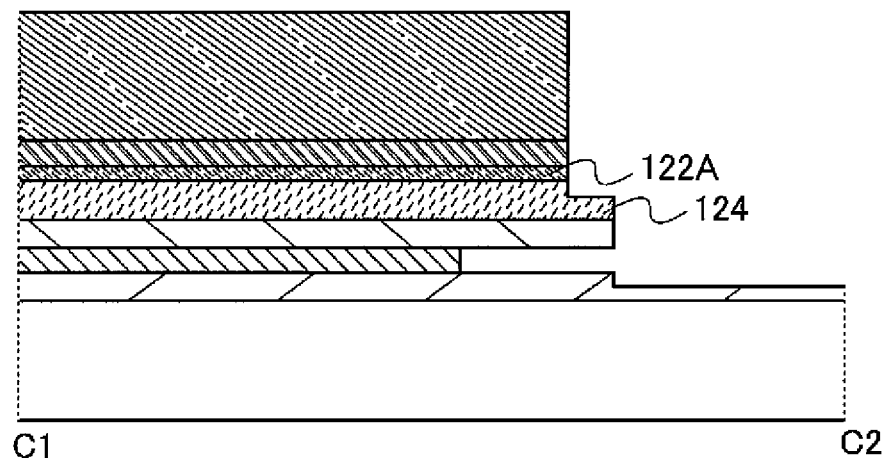
Figure 9C:
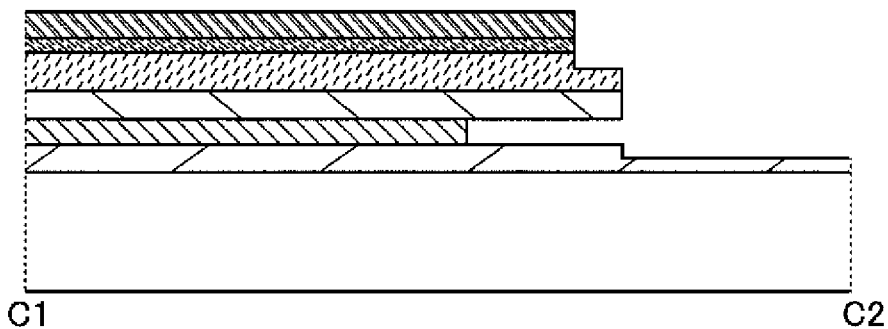
Figure 10A:
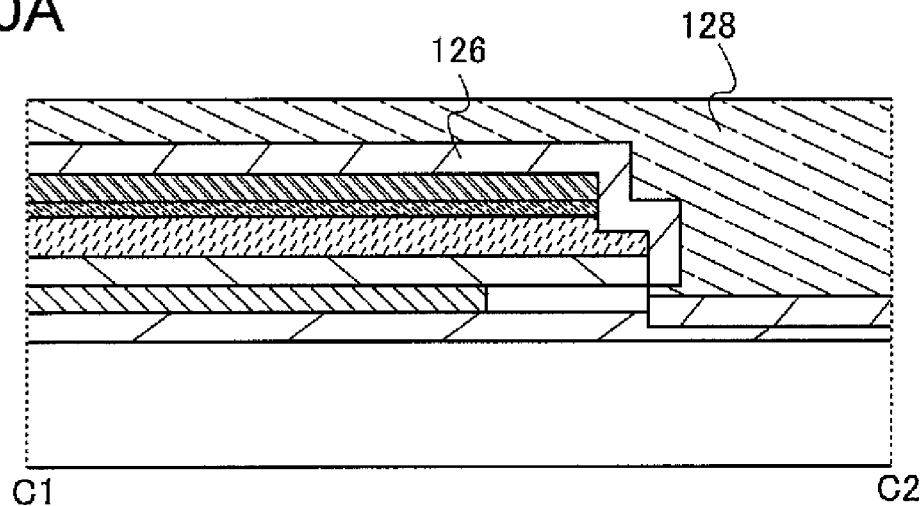
FIGS. 10A to 10C illustrate one example of methods for manufacturing the display device including the thin film transistor.
Figure 10B:
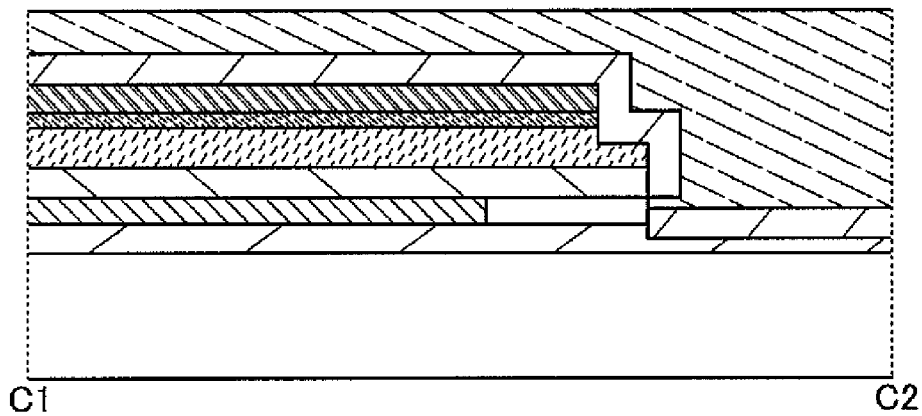
Figure 10C:
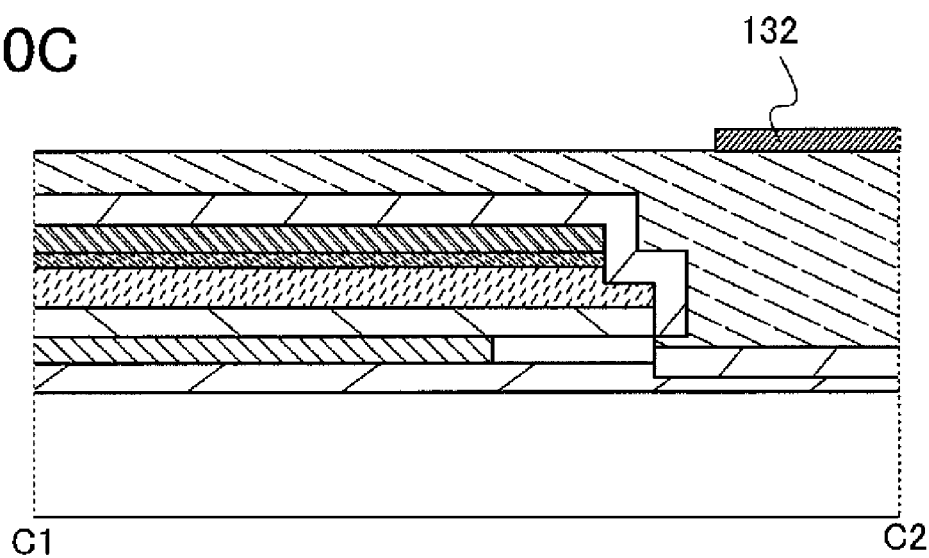
Figure 11A:
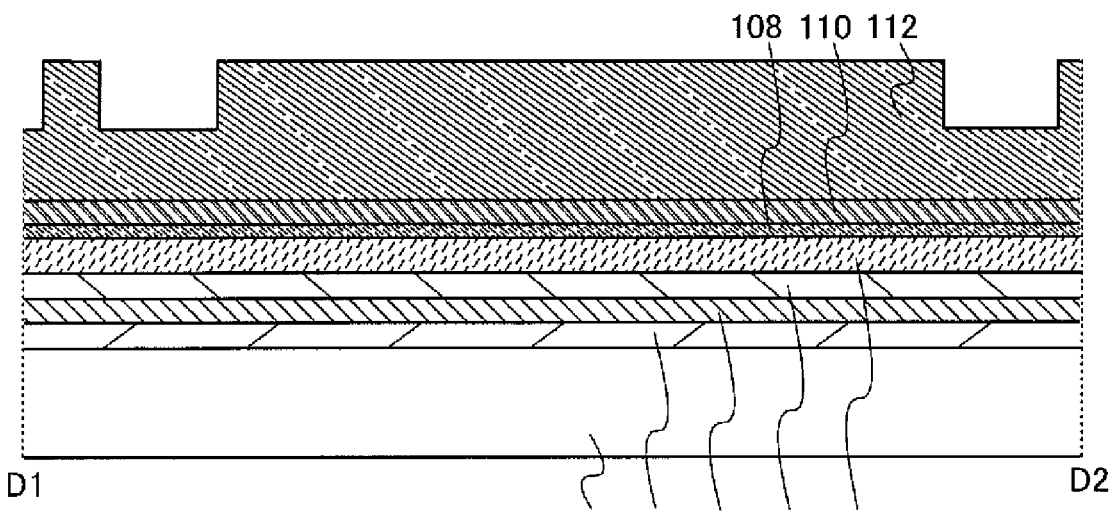
FIGS. 11A to 11C illustrate one example of methods for manufacturing the display device including the thin film transistor.
Figure 11B:
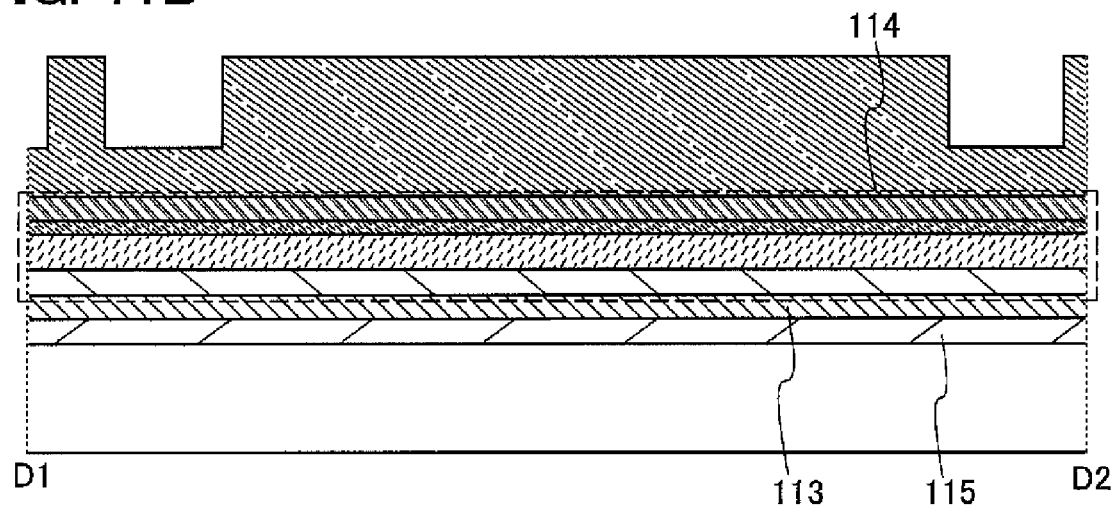
Figure 11C:
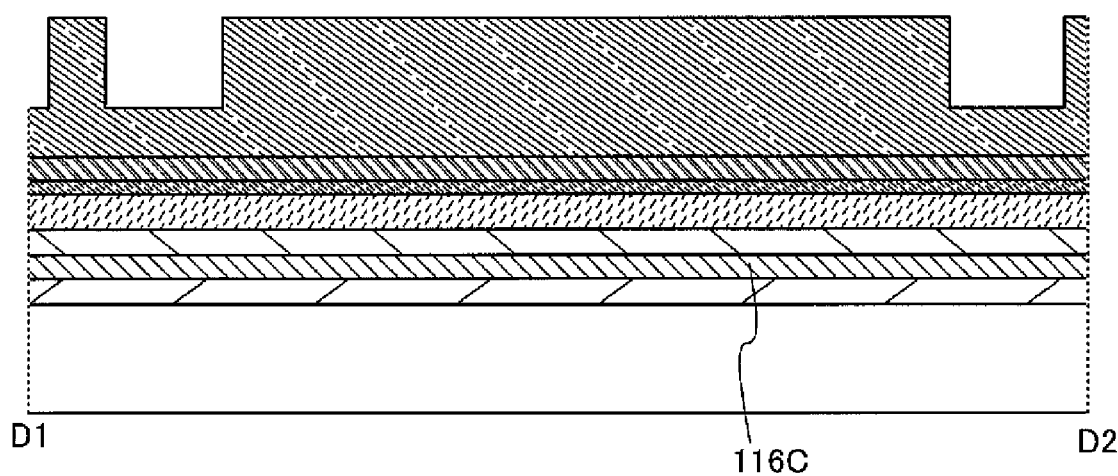
Figure 12A:
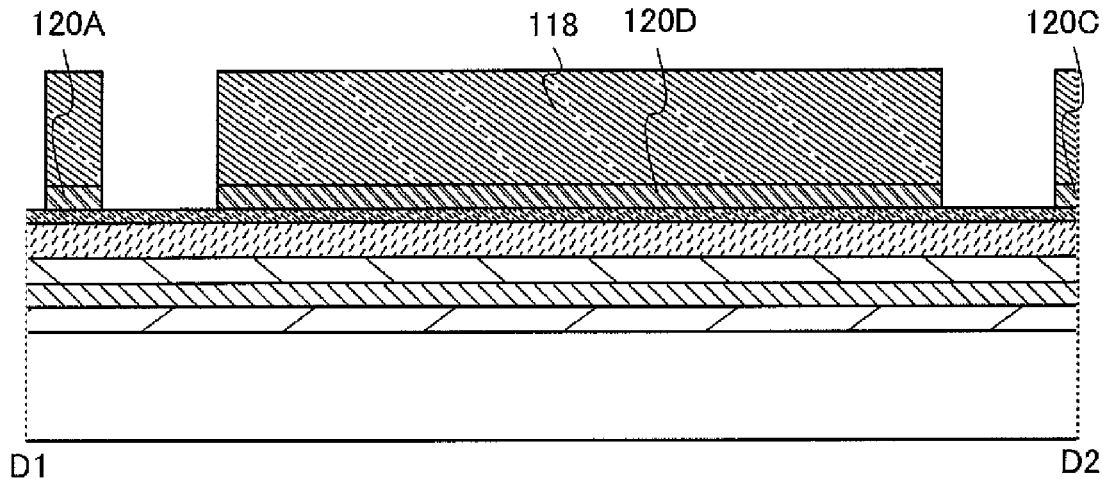
FIGS. 12A to 12C illustrate one example of methods for manufacturing the display device including the thin film transistor.
Figure 12B:
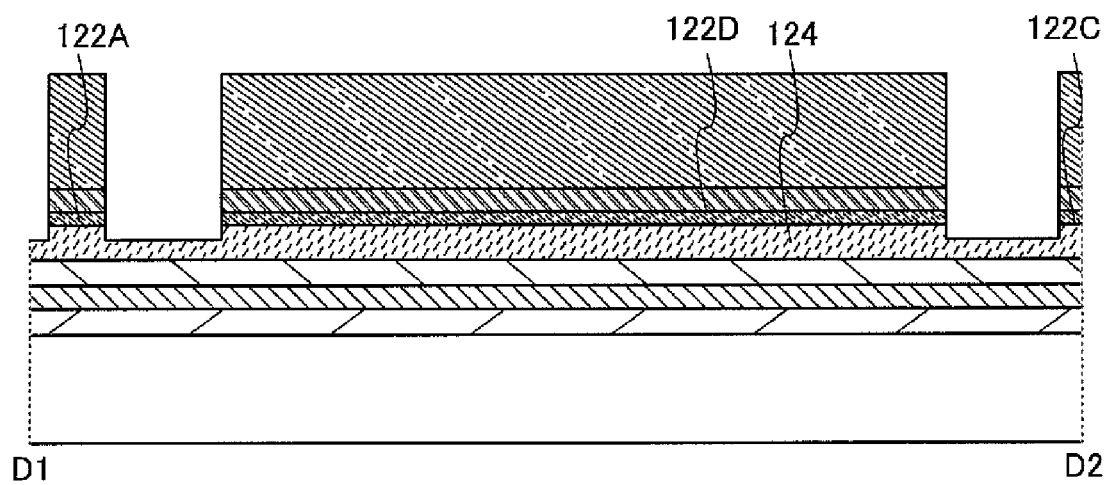
Figure 12C:
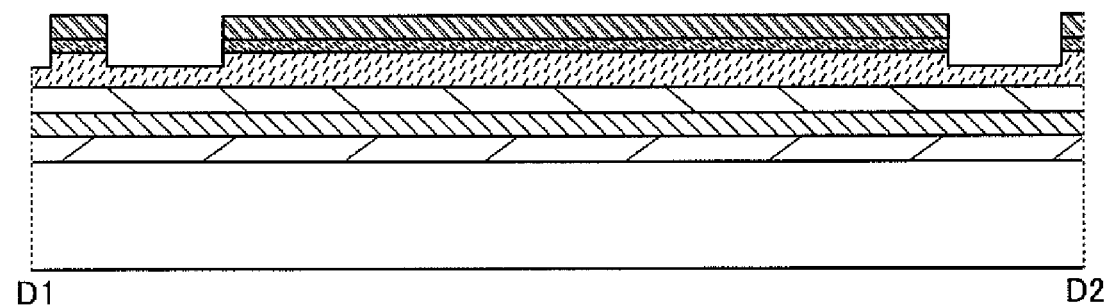
Figure 13A:
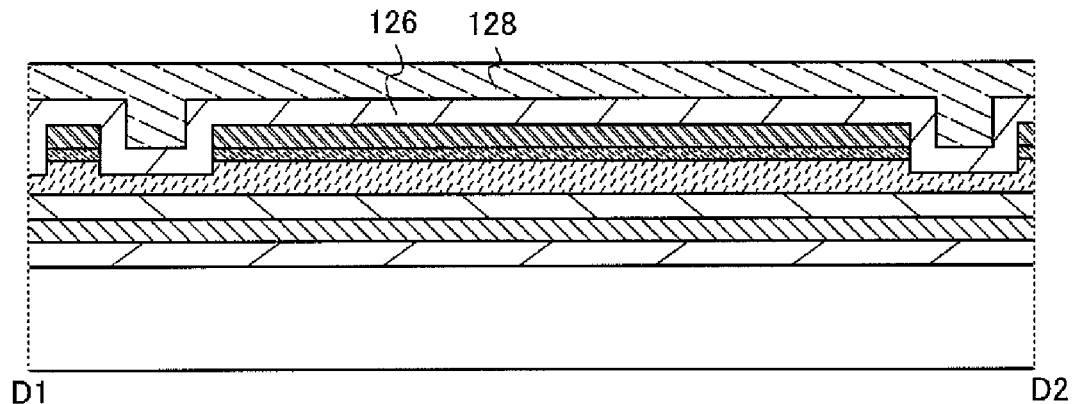
FIGS. 13A to 13C illustrate one example of methods for manufacturing the display device including the thin film transistor.
Figure 13B:
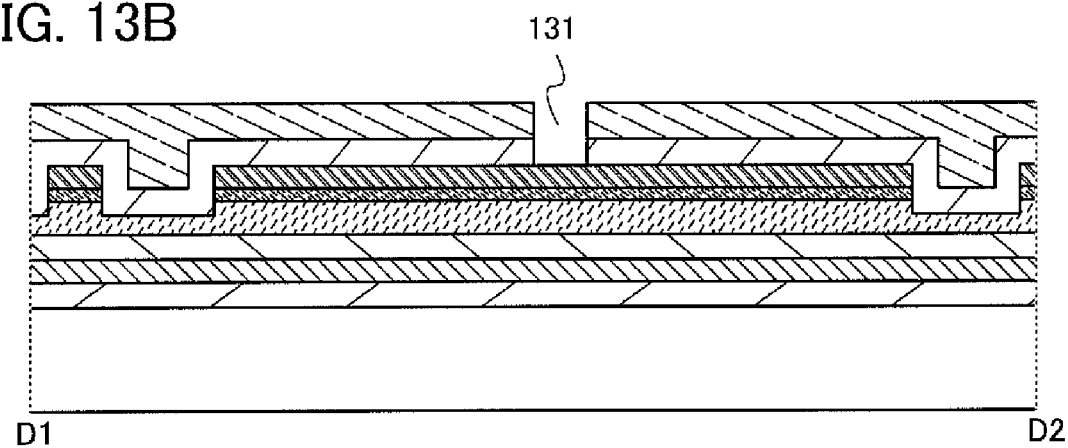
Figure 13C:
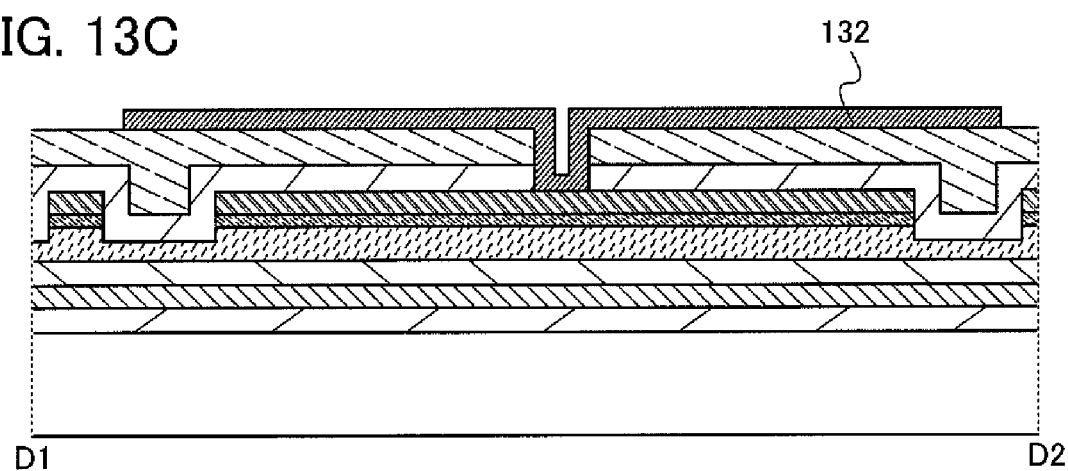
Figure 14A:
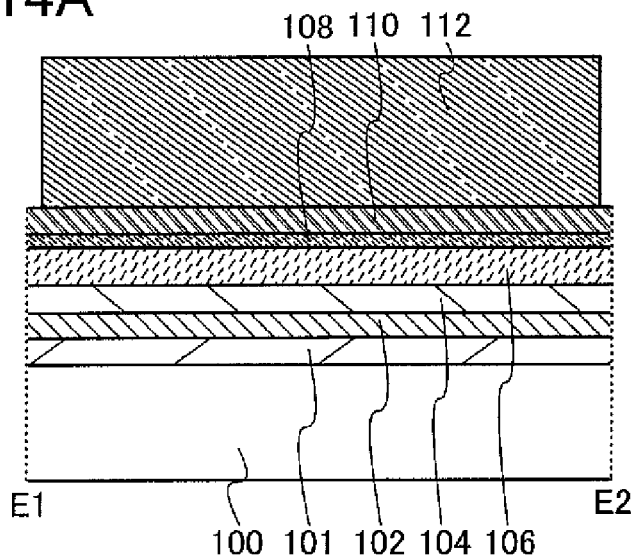
FIGS. 14A to 14C illustrate one example of methods for manufacturing the display device including the thin film transistor.
Figure 14B:
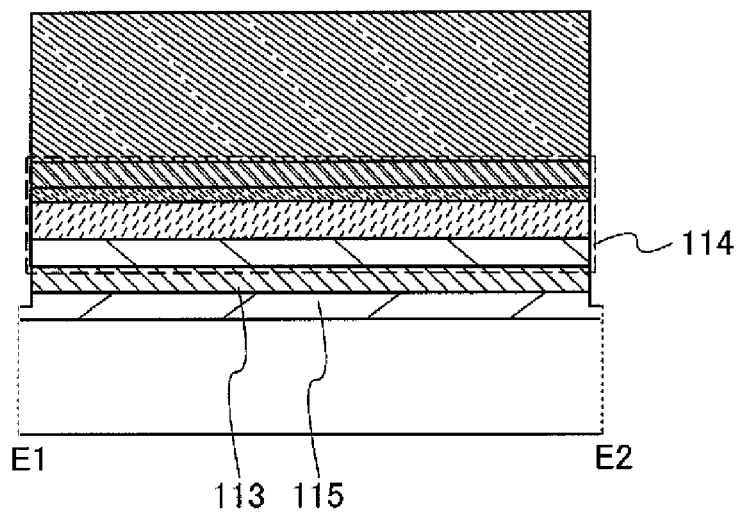
Figure 14C:
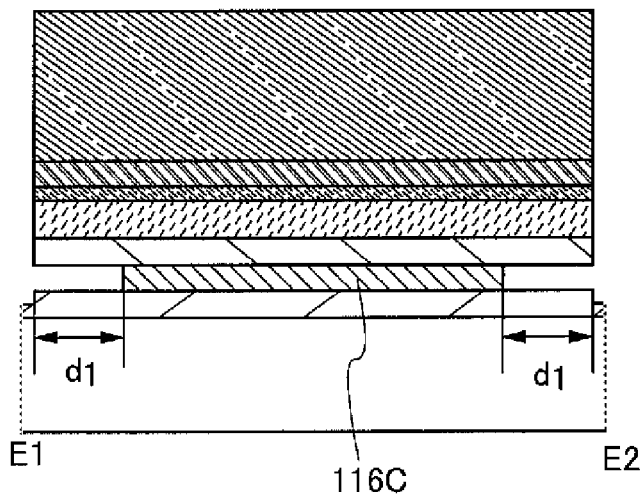
Figure 15A:
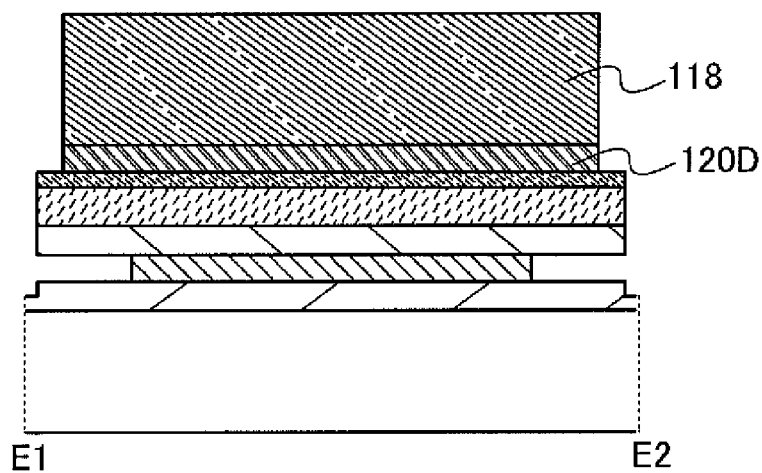
FIGS. 15A to 15C illustrate one example of methods for manufacturing the display device including the thin film transistor.
Figure 15B:
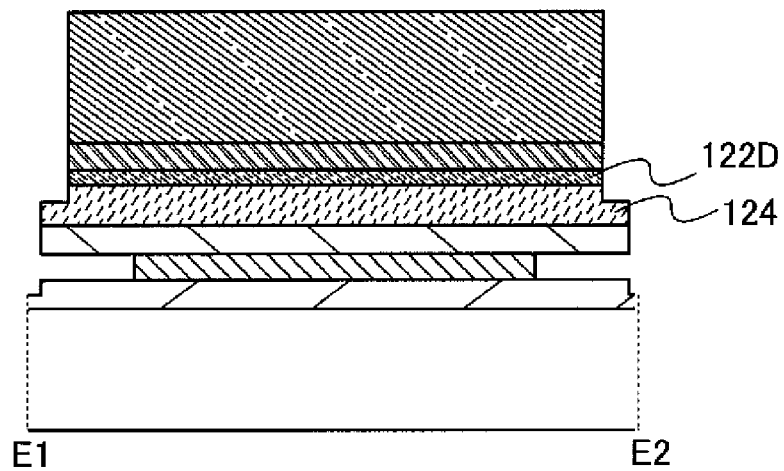
Figure 15C:
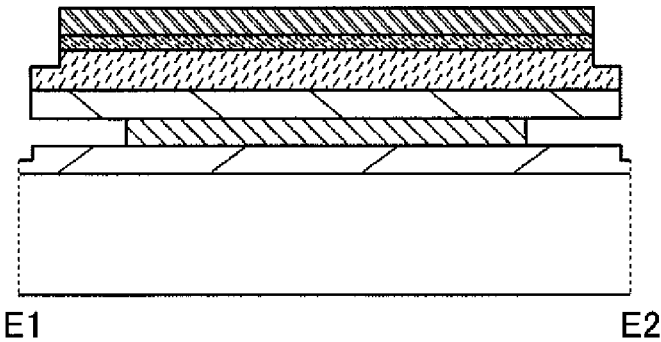
Figure 16A:
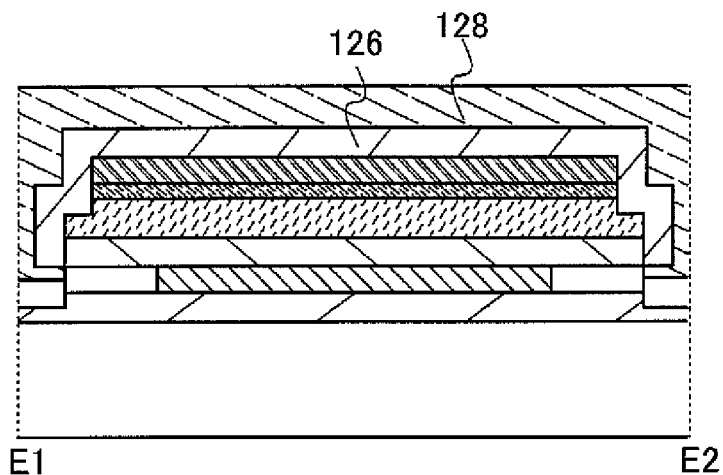
FIGS. 16A to 16C illustrate one example of methods for manufacturing the display device including the thin film transistor.
Figure 16B:
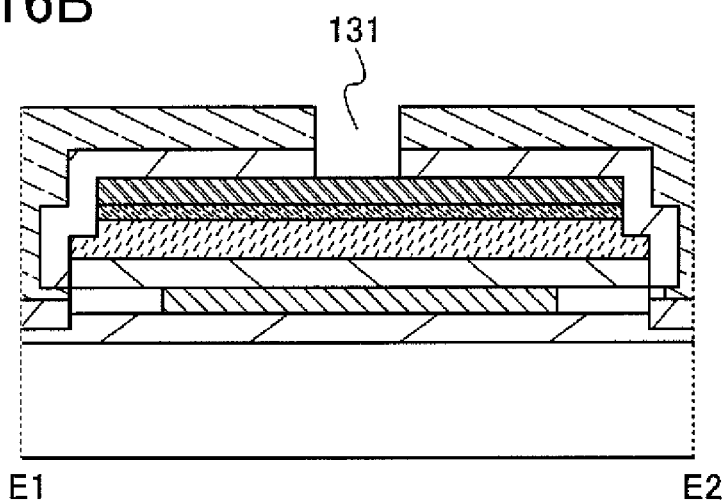
Figure 16C:
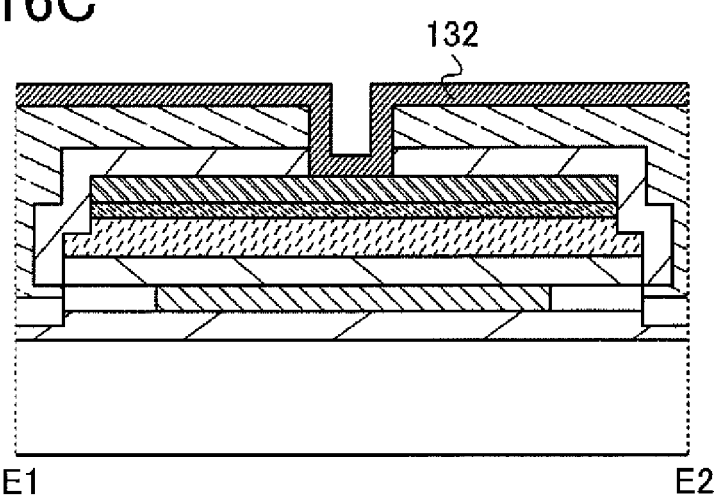

After that, the second resist mask 118 is removed (FIG. 3C, FIG. 6C, FIG. 9C, FIG. 12C, and FIG. 15C); accordingly, a thin film transistor is completed (FIG. 3C). As described above, the thin film transistor can be manufactured using one photomask (multi-tone mask).

Note that the steps described with reference to FIG. 3A and FIG. 3B are collectively referred to as third etching. The third etching may be performed in plural steps as described above or may be performed in a single step.

Figure 17:
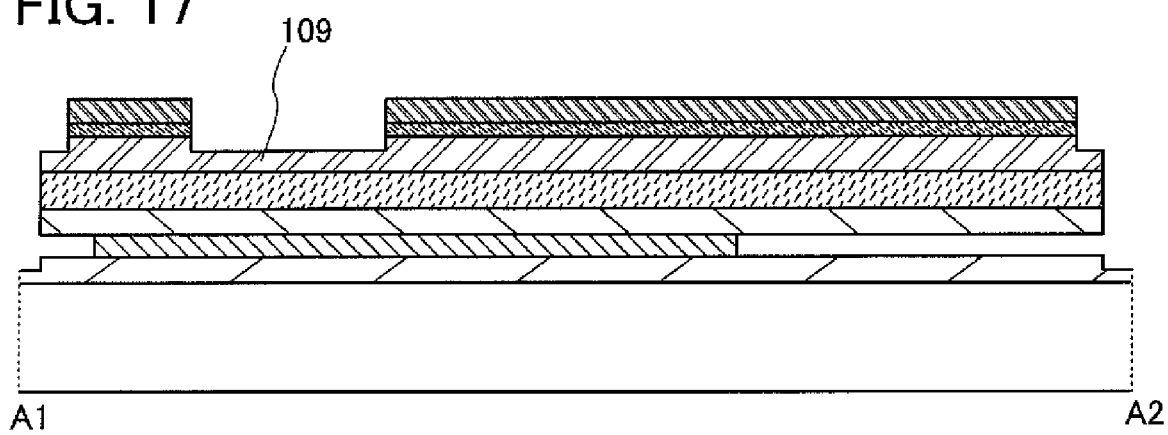
FIG. 17 illustrates one example of methods for manufacturing the display device including the thin film transistor.
Figure 18:
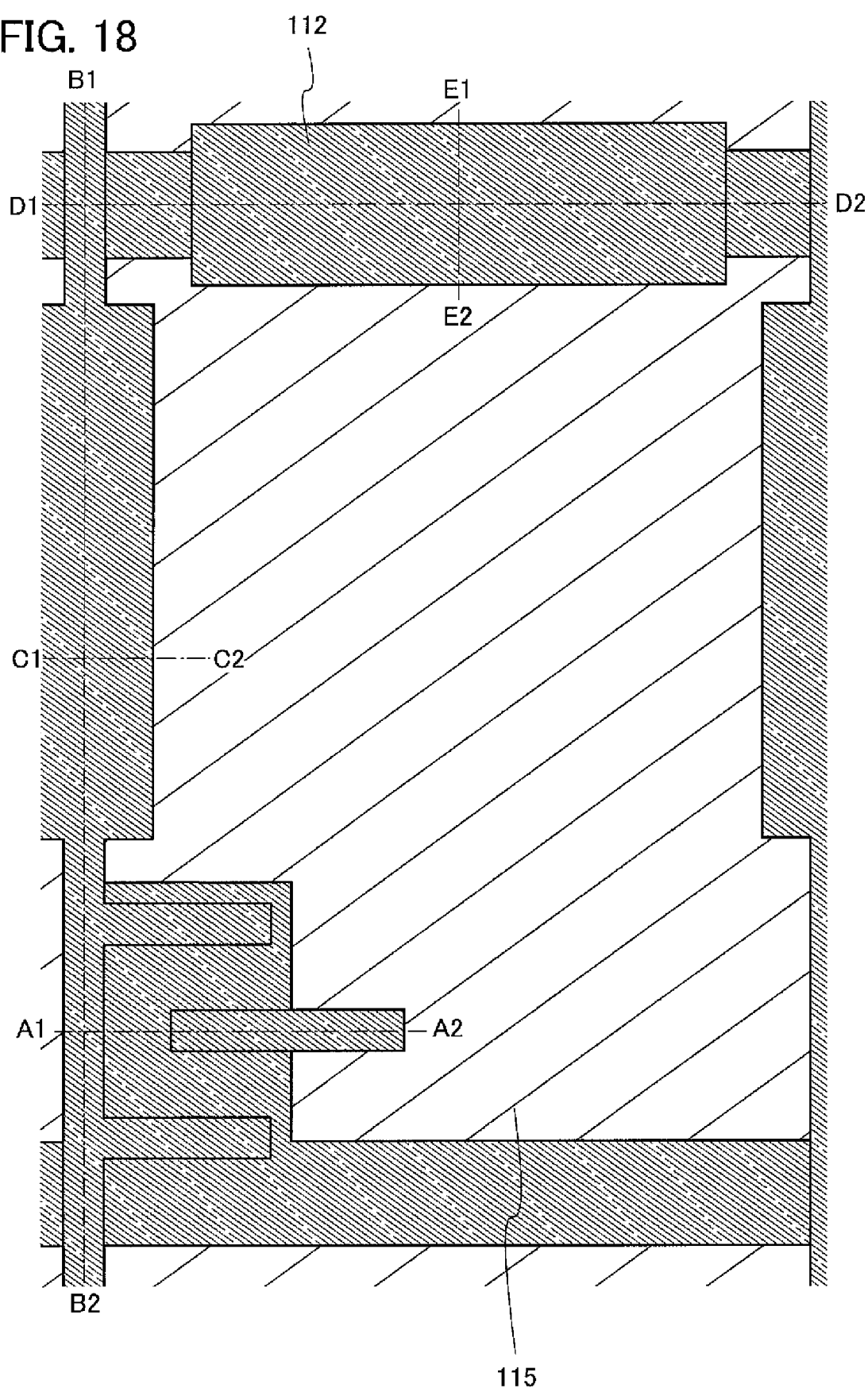
FIG. 18 illustrates one example of methods for manufacturing the display device including the thin film transistor.

As illustrated in FIG. 17A, a buffer layer 109 is preferably formed between the second semiconductor film 106 and the impurity semiconductor film 108. The buffer layer 109 is preferably formed using a layer which has an amorphous structure and minute crystal grains (hereinafter referred to as an IL layer). Note that steps other than the step in which a film which serves as a buffer layer 109 is formed over the second semiconductor film 106 and the impurity semiconductor film 108 is formed over the film which serves as the buffer layer 109 and the step accompanied by the third etching may be performed in a manner similar to those of the above steps. Thus, the description is omitted here. Note that with the third etching step when the buffer layer 109 is provided, an upper portion of the buffer layer 109 is etched and an upper portion of the second semiconductor film 106 is not etched. A cross section taken along the line A1-A2 is illustrated as a typical example of the case where the buffer layer 109 is provided. Since the buffer layer 109 overlaps with the second semiconductor film 106, a top view is omitted here.

In the IL layer which serves as the buffer layer 109, the energy of an Urbach edge measured with a constant photocurrent method (CPM) or photoluminescence spectroscopy and the defect absorption spectrum are small as compared to a conventional amorphous semiconductor layer. The IL layer is a semiconductor layer having a high level of orderliness in which the number of defects is small and a tail slope of a level at a band edge of a valence band is steep, as compared to the conventional amorphous semiconductor layer. Further, a peak region of spectrum measured with low temperature photoluminescence spectroscopy of the buffer layer 109 is greater than or equal to 1.31 eV and less than or equal to 1.39 eV. Further, a peak region of spectrum measured with low temperature photoluminescence spectroscopy of a microcrystalline semiconductor layer, preferably a microcrystalline silicon layer, is greater than or equal to 0.98 eV and less than or equal to 1.02 eV.

The film which serves as the buffer layer 109 is formed such that a semiconductor film is formed under formation conditions of a microcrystalline semiconductor film while generation of a crystal nucleus is suppressed by an impurity element which suppresses generation of a crystal nucleus. Here, as the impurity element which suppresses generation of a crystal nucleus, an impurity element (for example, nitrogen) which does not generate a carrier trap is selected. On the other hand, the concentration of an impurity element (for example, oxygen) which reduces the coordination number of silicon and generates dangling bonds is reduced. Therefore, it is preferable to reduce the oxygen concentration without reducing the nitrogen concentration. Specifically, it is preferable that the oxygen concentration measured with secondary ion mass spectrometry be $5 \times 10^{18}$ cm$^{-3}$ or less.

As formation method in which the oxygen concentration is kept low and the nitrogen concentration is made higher than the oxygen concentration, the following can be employed.

One of the method for keeping the oxygen concentration low and making the nitrogen concentration higher than the oxygen concentration, a layer over which the film which serves as the buffer layer 109 is to be formed is formed using a material containing nitrogen at a high concentration.

Another method for keeping the oxygen concentration low and making the nitrogen concentration higher than the oxygen concentration is a method in which a large amount of nitrogen is made to exist on a surface over which the film which serves as the buffer layer 109 is to be formed before the formation of the film which serves as the buffer layer 109. In order that a large amount of nitrogen is made to exist on the surface over which the film which serves as the buffer layer 109 is to be formed, the surface over which the film which serves as the buffer layer 109 is to be formed is preferably subjected to treatment with plasma generated from a gas containing nitrogen before the formation of the film which serves as the buffer layer 109. Here, ammonia can be given as an example of the gas containing nitrogen.

Another method for keeping the oxygen concentration low and making the nitrogen concentration higher than the oxygen concentration is that an inner wall of a treatment chamber (chamber) used for forming the film which serves as the buffer layer 109 is covered with a film containing nitrogen at a high concentration. As a film containing nitrogen at a high concentration, for example, a silicon nitride film can be given. Note that the film containing nitrogen at a high concentration which covers the inner wall of the treatment chamber (chamber) is preferably formed at the same time as the formation of the second insulating film 104 for simplification of the process.

Another method for keeping the oxygen concentration low and making the nitrogen concentration higher than the oxygen concentration is that the concentration of oxygen contained in a gas used for forming the film which serves as the buffer layer 109 is made low and the nitrogen concentration is made high. In this case, nitrogen may be added only to a gas which is used at the early stage of the formation of the buffer layer 109, or the amount of nitrogen to be added may be gradually reduced.

Note that, in this embodiment, any one of the methods described above or a combination thereof may be used.

It is preferable that the buffer layer 109 contain an NH group or an $NH_2$ group. The NH group is included in the buffer layer 109, whereby dangling bonds in the buffer layer 109 can be cross-linked, and the $NH_2$ group is included in the buffer layer 109, whereby dangling bonds in the buffer layer 109 can be terminated.

When a structure in which the buffer layer 109 is formed is employed, on current can be increased with off current suppressed as compared to a structure in which the buffer layer 109 is not formed. Accordingly, a thin film transistor with a high on/off ratio of a drain current can be obtained.

Note that here, a drain current means a current flowing between a source and a drain.

A third insulating film is formed to cover the thin film transistor which is formed in the above manner. Here, the third insulating film may be formed using only a first protective film 126. The third insulating film is preferably formed by stacking the first protective film 126 and a second protective film 128 (FIG. 4A, FIG. 7A, FIG. 10A, FIG. 13A, and FIG. 16A). The first protective film 126 may be formed in a manner similar to that of the second protective film 104. Note that a case where the first protective film 126 is not formed in the vicinity of a cavity formed on the side surface of the first wiring layer 116 is illustrated in this embodiment; however, the first protective film 126 may be formed in the vicinity of the cavity formed on the side surface of the first wiring layer 116 in some cases. When the first protective film 126 is sufficiently thick, the first protective film can also be formed in the vicinity of the cavity formed on the side surface of the first wiring layer 116, which is preferable.

The second protective film 128 is formed with a method with which the surface thereof becomes almost planar. This is because disconnection or the like of a pixel electrode layer 132 formed later over the second protective film 128 can be prevented when the surface of the second protective film 128 is almost planar. Accordingly, the phrase "almost planar" means planar in such an extent that the above aim can be achieved, and does not mean that high planarity is required.

The second protective film 128 can be formed, for example, with a spin coating method or the like using photosensitive polyimide, acrylic, epoxy resin, or the like. Note that the material and the formation method of the second protective film 128 are not limited to the above materials and formation method.

Next, a first opening portion 130 and a second opening portion 131 are formed in the third insulating film (FIG. 4B, FIG. 7B, FIG. 10B, FIG. 13B, and FIG. 16B). The first opening portion 130 and the second opening portion 131 are formed so as to reach at least a surface of the second wiring layer 120. The formation method of the first opening portion 130 and the second opening portion 131 is not limited to a particular method and may be determined as appropriate by a practitioner in accordance with the diameter of the first opening portion 130 or the like. For example, the first opening portion 130 and the second opening portion 131 can be formed with dry etching using photolithography.

Note that in the case of forming the opening portions with photolithography, one photomask is used.

Next, the pixel electrode layer 132 is formed over the third insulating film (FIG. 4C, FIG. 7C, FIG. 10C, FIG. 13C, FIG. 16C, and FIG. 22). The pixel electrode layer 132 is formed so as to be connected to the second wiring layer 120 through the opening portions. Specifically, the pixel electrode layer 132 is formed so as to be connected to the second wiring layer 120B through the first opening portion 130 and connected to the second wiring layer 120D through the second opening portion 131. The pixel electrode layer 132 is preferably formed using a conductive material having a light-transmitting property. Here, as examples of the conductive material having a light-transmitting property, indium tin oxide, indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like can be given. The film of the conductive material having a light-transmitting property may be formed with a sputtering method, a CVD method, or the like; however, the formation method is not limited to a particular method. In addition, the pixel electrode layer 132 may have a single layer structure or a stacked structure including a plurality of layers.

In this embodiment, only the pixel electrode layer 132 is formed using the conductive material having a light-transmitting property; however, this embodiment is not limited to this. As materials of the first conductive film 102 and the second conductive film 110, conductive materials having a light-transmitting property can also be used.

Note that in the case of forming the pixel electrode layer 132 with photolithography, one photomask is used.

In the above manner, manufacture of an active matrix substrate according to this embodiment (so-called array process) is completed. As described in this embodiment, the thin film transistor can be manufactured using one photomask in such a manner that the first wiring layer 116 is formed utilizing side-etching and, further, the second wiring layer 120 is formed using a multi-tone mask.

The thin film transistor manufactured in the above manner has a cavity in contact with the side surface of the first wiring layer 116; thus, leakage current at an end portion of the first wiring layer 116 is low. Further, since the first insulating film 101 which serves as a base insulating film is included, in the case of using a glass substrate as the substrate 100, entry of Na and the like included in the glass substrate into the second semiconductor film 106 can be prevented. Accordingly, electrical characteristics are favorable (for example, small off current) and variations in electrical characteristics over the substrate are small.

Here, a terminal connection portion of the active matrix substrate manufactured in the above steps is described with reference to FIG. 24, FIG. 25, and FIGS. 26A to 26C.

Figure 24:
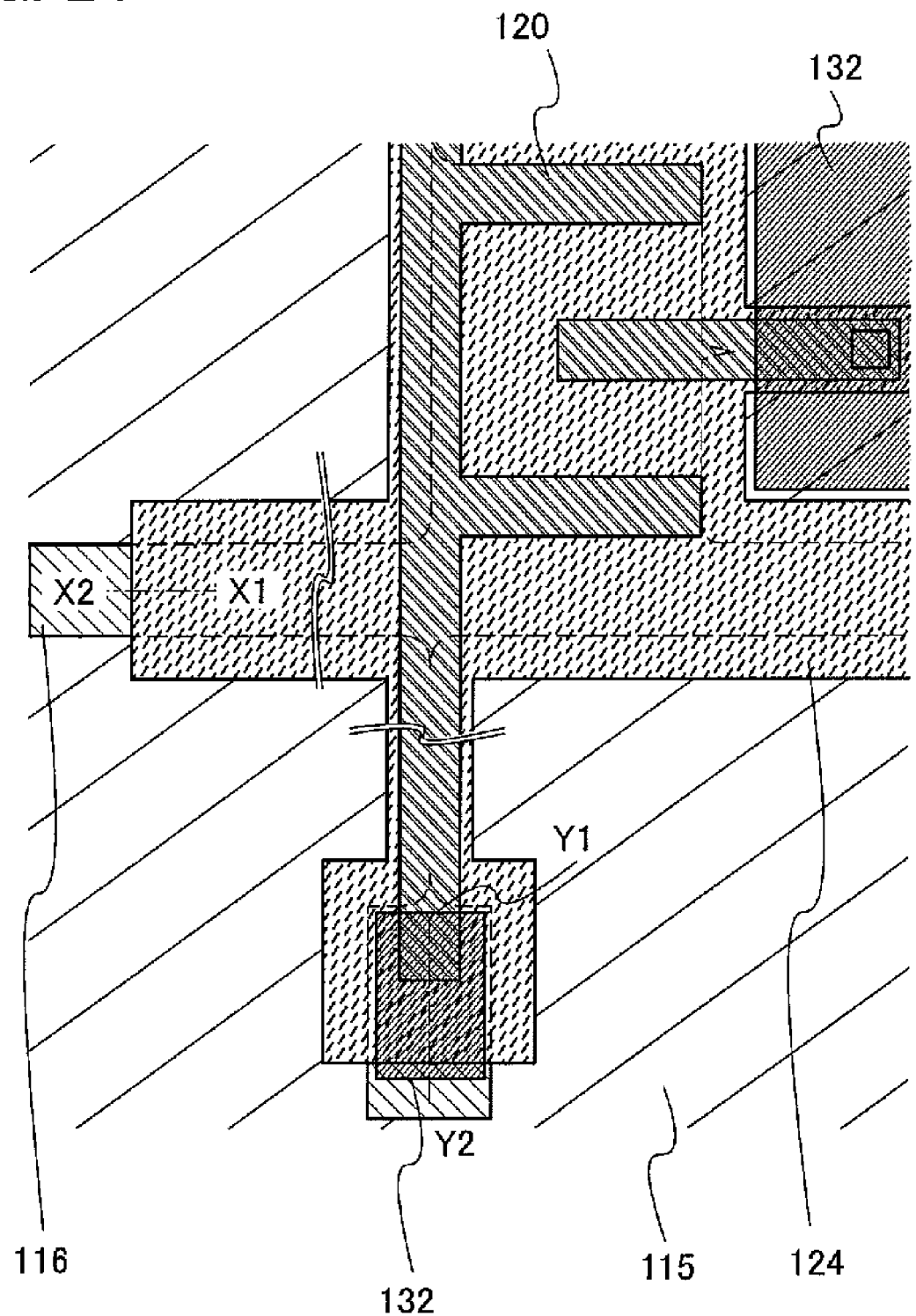
FIG. 24 illustrates a connection portion of an active matrix substrate.

FIG. 24 is a top view and FIG. 25 and FIGS. 26A to 26C are cross-sectional views of a terminal connection portion on the gate wiring side and a terminal connection portion on the source wiring side of the active matrix substrate manufactured in the above steps.

FIG. 24 is a top view of the gate wiring and the source wiring extended from the pixel portion, in the terminal connection portion on the gate wiring side and the terminal connection portion on the source wiring side.

Figure 25:
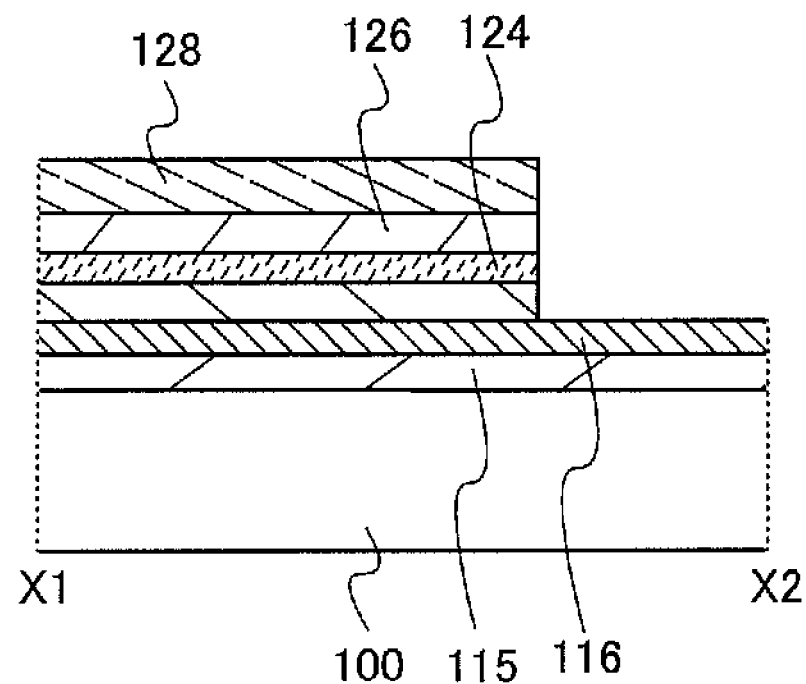
FIG. 25 illustrates a connection portion of an active matrix substrate.

FIG. 25 is a cross-sectional view taken along the line X1-X2 in FIG. 24. That is, FIG. 25 is a cross-sectional view of the terminal connection portion on the gate wiring side. In FIG. 25, the first wiring layer 116 is exposed. A terminal portion is connected to the region in which the first wiring layer 116 is exposed.

Figure 26A:
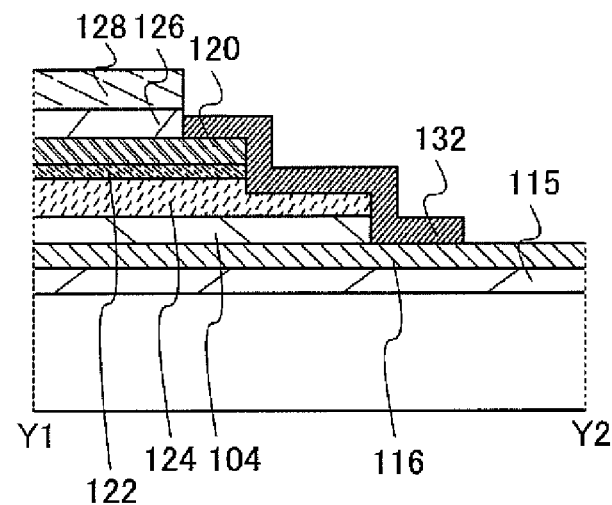
FIGS. 26A to 26C each illustrate a connection portion of an active matrix substrate.
Figure 26B:
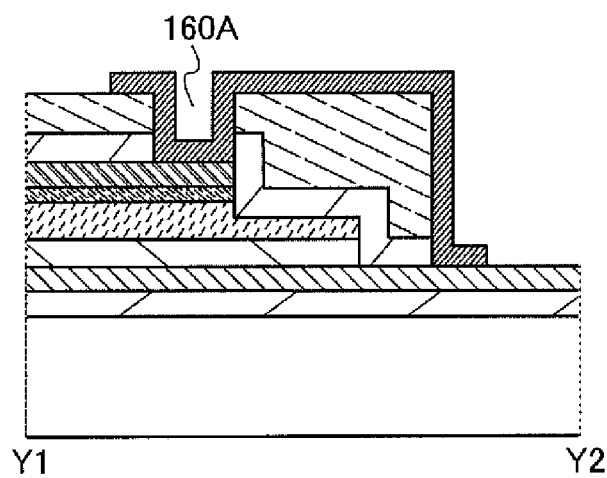
Figure 26C:
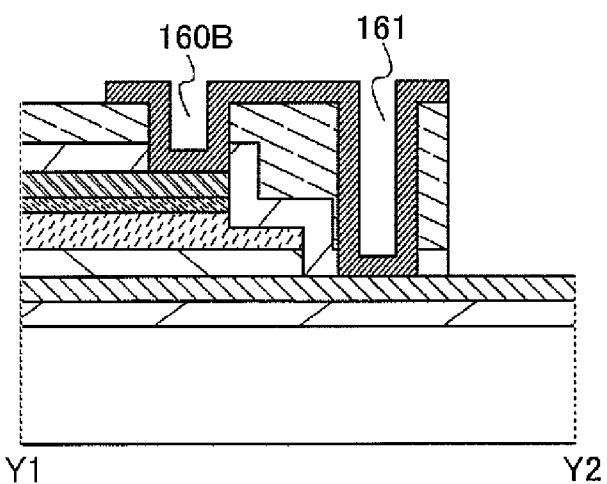

FIGS. 26A to 26C are cross-sectional views of the terminal connection portion on the source wiring side. In FIGS. 26A to 26C, the first wiring layer 116 and the second wiring layer 120 are connected to each other through the pixel electrode layer 132. FIGS. 26A to 26C illustrate various connection modes between the first wiring layer 116 and the second wiring layer 120. Any of these connection modes or connection modes other than those illustrated in FIGS. 26A to 26C may be used for the terminal connection portion in a display device of this embodiment. With the structure in which the second wiring layer 120 is connected to the first wiring layer 116, the height of the terminal connection portion can be made almost uniform.

In FIG. 26A, electric connection is realized in such a manner that end portions of the first protective film 126 and the second protective film 128 are removed with etching or the like to expose the first wiring layer 116 and the second wiring layer 120, and the pixel electrode layer 132 is formed over the exposed region. FIG. 26A corresponds to the cross-sectional view taken along the line Y1-Y2 in FIG. 24.

Note that the formation of the region in which the first wiring layer 116 and the second wiring layer 120 are exposed can be performed at the same time as the formation of the first opening portion 130 and the second opening portion 131.

In FIG. 26B, electric connection is realized in such a manner that a third opening portion 160A is provided in the first protective film 126 and the second protective film 128, end portions of the first protective film 126 and the second protective film 128 are removed with etching or the like to expose the first wiring layer 116 and the second wiring layer 120, and the pixel electrode layer 132 is formed over the exposed region.

Note that the formation of the third opening portion 160A and the formation of the region in which the first wiring layer 116 is exposed can be performed at the same time as the formation of the first opening portion 130 and the second opening portion 131.

In FIG. 26C, electric connection is realized in such a manner that a third opening portion 160B and a fourth opening portion 161 are provided in the first protective film 126 and the second protective film 128 to expose the first wiring layer 116 and the second wiring layer 120, and the pixel electrode layer 132 is formed over the exposed region. Here, end portions of the first protective film 126 and the second protective film 128 are removed with etching or the like similarly to FIGS. 26A and 26B, and this etched region is used as a terminal connection portion.

Note that the formation of the third opening portion 160B and the fourth opening portion 161 and the formation of the region in which the first wiring layer 116 is exposed can be performed at the same time as the formation of the first opening portion 130 and the second opening portion 131.

Note that the number of opening portions is not particularly limited to those in FIGS. 26A to 26C. Not only one opening portion but also a plurality of opening portions may be provided for one terminal. In the case where a plurality of opening portions is provided for one terminal, even when any of the opening portions is not formed favorably due to insufficient etching for forming the opening portion, electric connection can be realized at the other opening portion. Further, even in the case where all the opening portions are formed without any problems, the contact area can be made larger and contact resistance can be reduced, which is preferable.

Next, a method for manufacturing a liquid crystal display device using the active matrix substrate for a display device, which is manufactured in the above steps, is described. That is, a cell process and a module process are described. Note that the cell process and the module process are not limited to the following description of the method for manufacturing a display device according to this embodiment.

In the cell process, the active matrix substrate manufactured in the above steps and a substrate which faces the active matrix substrate (hereinafter referred to as an opposite substrate) are attached to each other and liquid crystal is injected. First, a method for manufacturing the opposite substrate is briefly described below. Note that a film formed over the opposite substrate may have a single layer structure or a stacked structure even if not mentioned particularly.

First, a light-blocking layer is formed over a substrate; color filter layers of red, green, and blue are formed over the light-blocking layer; a pixel electrode layer is selectively formed over the color filter layers; and then, a rib is formed over the pixel electrode layer.

As the light-blocking layer, a film of a material having a light-blocking property is selectively formed. As the material having a light-blocking property, for example, an organic resin containing a black resin (carbon black) can be used. Alternatively, a stacked film which includes a film of a material containing Cr as a main component may be used. The film of a material containing Cr as a main component means a chromium film, a chromium oxide film, or a chromium nitride film. The material used for the light-blocking layer is not particularly limited as long as it has a light-blocking property. In order to selectively form the film of a material having a light-blocking property, photolithography or the like is employed.

The color filter layers may be selectively formed using an organic resin films which transmits only light of any of red, green, and blue when irradiated with white light from a backlight. The color filter layers can be selectively formed by selective formation of color materials over predetermined areas. The arrangement of the color filters may be a stripe arrangement, a delta arrangement, or a square arrangement.

The pixel electrode layer over the opposite substrate can be formed in a manner similar to that of the pixel electrode layer 132 included in the active matrix substrate. Note that since selective formation is not necessary, the pixel electrode layer may be formed over the entire surface of the opposite substrate.

The rib formed over the pixel electrode is an organic resin film formed with a pattern for the purpose of widening the viewing angle. The rib does not need to be formed if not particularly necessary.

As the method for manufacturing the opposite substrate, there are other various modes. For example, after formation of the color filter layer and before formation of the pixel electrode layer, an overcoat layer may be formed. By formation of the overcoat layer, planarity of a surface over which the pixel electrode is formed can be increased, thereby increasing fabrication yield. In addition, part of a material included in the color filter layer can be prevented from entering a liquid crystal material. For the overcoat layer, a thermosetting material containing acrylic-based resin or epoxy-based resin is used.

Further, before or after formation of the rib, a post spacer (columnar spacer) may be formed as a spacer. The post spacer means a structural object formed at a constant interval on the opposite substrate in order to keep the gap between the active matrix substrate and the opposite substrate constant. In the case of using a bead spacer (spherical spacer), the post spacer need not be formed.

Next, an alignment film is formed on each of the active matrix substrate and the opposite substrate. Formation of the alignment films is performed, for example, in such a manner that polyimide resin or the like is dissolved in an organic solvent; this solution is applied with a printing method, a spin coating method, or the like; then the organic solvent is evaporated; and after that, the substrates are subjected to baking. The thicknesses of the formed alignment films are generally approximately greater than or equal to 50 nm and less than or equal to 100 nm. Rubbing treatment is performed on the alignment films to align liquid crystal molecules with a certain pretilt angle. The rubbing treatment is performed, for example, by rubbing the alignment film with a shaggy cloth such as a velvet.

Then, the active matrix substrate and the opposite substrate are attached with a sealant. In the case where a post spacer is not provided on the opposite substrate, a bead spacer may be dispersed in a desired region and then attachment may be performed.

Next, a liquid crystal material is injected in a space between the active matrix substrate and the opposite substrate, which are attached to each other. After injection of the liquid crystal material, an inlet for injection is sealed with an ultraviolet curing resin or the like. Alternatively, after dropping a liquid crystal material on one of the active matrix substrate and the opposite substrate, these substrates may be attached to each other.

Next, a polarizing plate is attached to both surfaces of a liquid crystal cell, which is formed by attachment of the active matrix substrate and the opposite substrate. Then, the cell process is finished.

Next, as the module process, a flexible printed circuit (FPC) is connected to an input terminal (in FIGS. 26A to 26C, the region in which the first wiring layer 116 is exposed) of the terminal portion. The FPC has a wiring formed using a conductive film over an organic resin film of polyimide or the like, and is connected to the input terminal through an anisotropic conductive paste (hereinafter referred to as an ACP). The ACP includes a paste serving as an adhesive and particles plated with gold or the like to have a conductive surface, which have a diameter of several tens of micrometers to several hundreds of micrometers. When the particles mixed in the paste are in contact with the conductive layer over the input terminal and in contact with the conductive layer over the terminal connected to the wiring formed in the FPC, electric connection therebetween is achieved. Alternatively, after connection of the FPC, a polarizing plate may be attached to the active matrix substrate and the opposite substrate. In the above manner, a liquid crystal panel used for a display device can be manufactured.

As described above, the active matrix substrate including a pixel transistor, which is used for a display device, can be manufactured using three photomasks.

Accordingly, the number of steps of manufacturing a thin film transistor and a display device can be significantly reduced. Specifically, as described above, a thin film transistor can be manufactured using one photomask (multi-tone mask). Further, an active matrix substrate including a pixel transistor can be manufactured using three photomasks. In this manner, since the number of photomasks to be used is reduced, the number of steps of manufacturing a thin film transistor and a display device can be significantly reduced.

In addition, the number of steps of manufacturing a thin film transistor can be significantly reduced without a complicated step such as backside light exposure, resist reflow, or a lift-off method. Therefore, the number of steps of manufacturing a display device can be significantly reduced without a complicated step. Thus, the number of steps of manufacturing a display device can be significantly reduced without reducing fabrication yield.

According to one embodiment of the present invention, the number of steps of manufacturing a thin film transistor can be significantly reduced while electrical characteristics of the thin film transistor are maintained.

Furthermore, by the above effects, the manufacturing cost can be significantly reduced.

In addition, since the first conductive film 102 is processed with the first etching, the distance $d_1$ between the side surface of the thin-film stack body 114 and the side surface of the first wiring layer 116 can be designed independently of the thickness of the first conductive film 102, thereby increasing the freedom of layout design of a pixel structure.

Even when a glass substrate containing an impurity metal element such as Na is used as the substrate, Na and the like can be prevented from attaching to and entering a semiconductor film, so that degradation of electrical characteristics (large off current and the like) of the thin film transistor can be prevented. Accordingly, a thin film transistor having favorable electrical characteristics can be manufactured. Further, variations in characteristics over the substrate of the thin film transistor to be manufactured can be made small. Therefore, display unevenness of the display device can be reduced.

Note that the thin film transistor manufactured using the manufacturing method of this embodiment has a structure including a gate insulating film over a first wiring layer, a second semiconductor film including a channel formation region, a source region, and a drain region over the gate insulating film, a source electrode and a drain electrode over the second semiconductor film, and a cavity in contact with the side surface of the first wiring layer. By the cavity formed in contact with the side surface of the first wiring layer, a thin film transistor with small leakage current at an end portion of the first wiring layer can be manufactured.

Furthermore, since the thin film transistor in which leakage current generated at the end portion of the first wiring layer is small can be manufactured, a display device with a high contrast ratio and favorable display quality can be obtained.

This embodiment is not limited to the above pixel structure and can be applied to a variety of liquid crystal display devices.

Embodiment 2

In this embodiment, examples of a method for manufacturing a thin film transistor, which is different from that of Embodiment 1 and a method for manufacturing an EL display device in which the thin film transistors are arranged in matrix are described with reference to FIG. 28, FIG. 29, FIG. 30, FIG. 31, FIG. 32, FIG. 33, FIGS. 34A to 34C, FIGS. 35A to 35C, FIGS. 36A to 36C, FIGS. 37A to 37C, FIGS. 38A to 38C, FIGS. 39A to 39C, FIGS. 40A to 40C, FIGS. 41A to 41C, FIGS. 42A to 42C, FIGS. 43A to 43C, FIGS. 44A to 44C, and FIGS. 45A to 45C. In this embodiment, an example in which thin film transistors with different conductivity types are formed over the same substrate is described.

Note that the detailed description is given in Embodiment 1, and in this embodiment, the detailed description of parts in which the manufacturing methods similar to those in Embodiment 1 are used is omitted.

Figure 28:
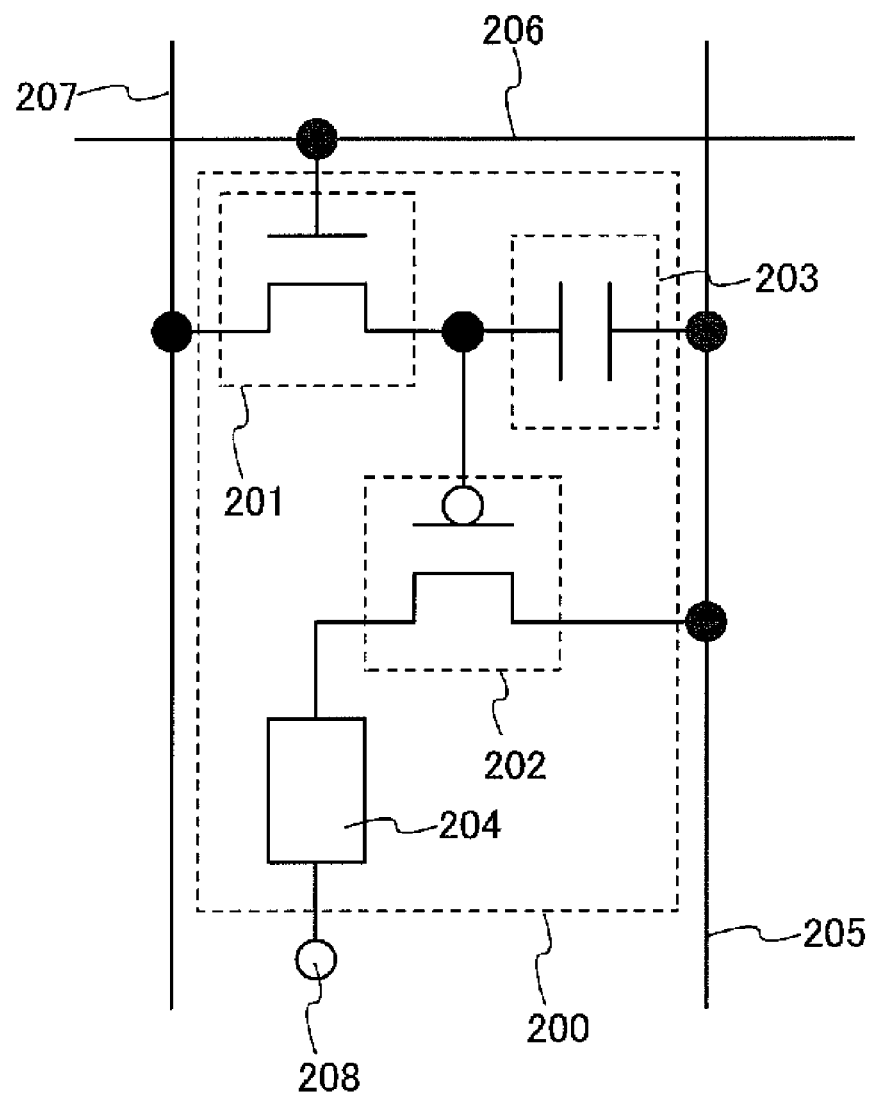
FIG. 28 illustrates one example a thin film transistor including a display device.
Figure 29:
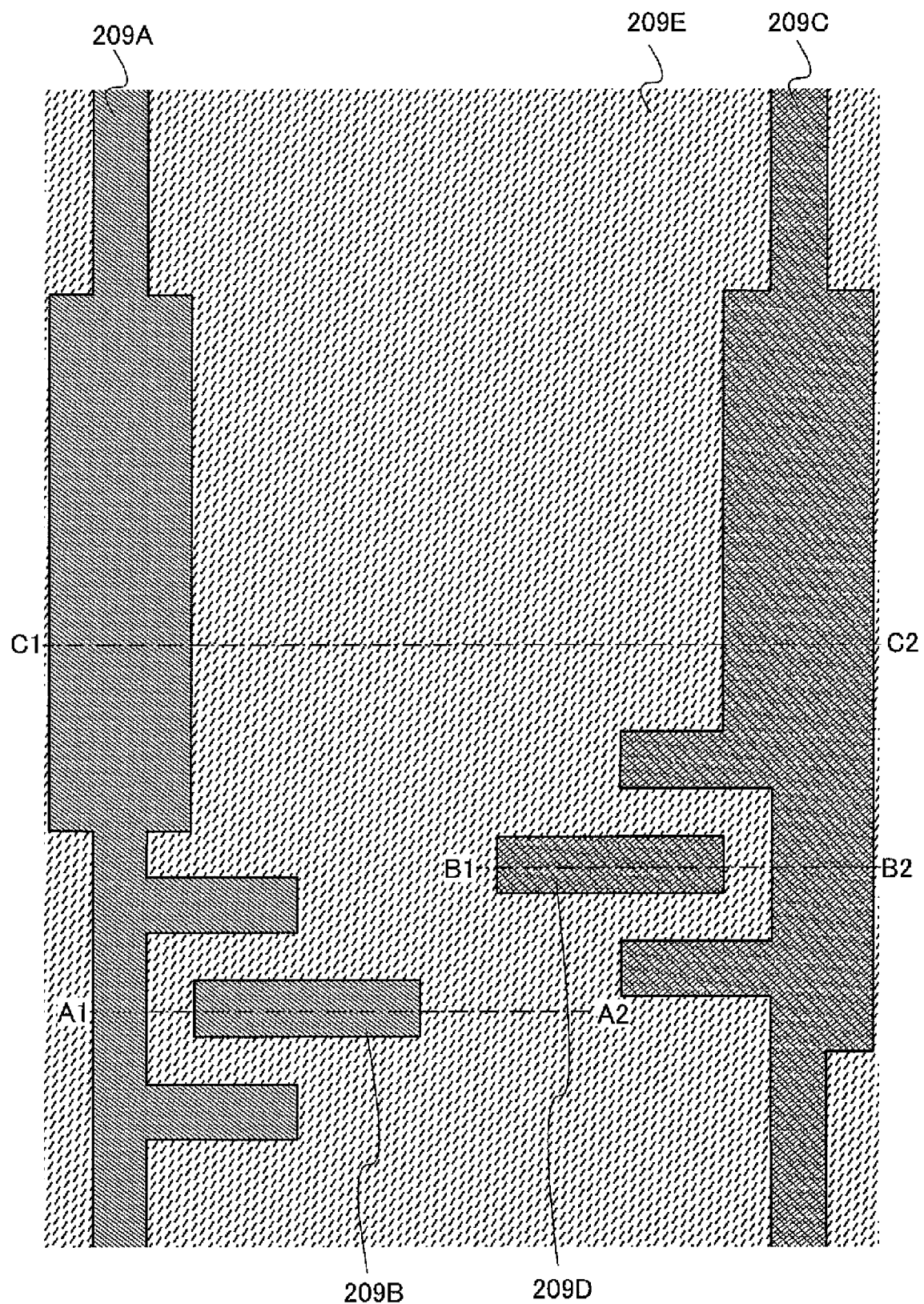
FIG. 29 illustrates one example of methods for manufacturing a display device including a thin film transistor.
Figure 30:
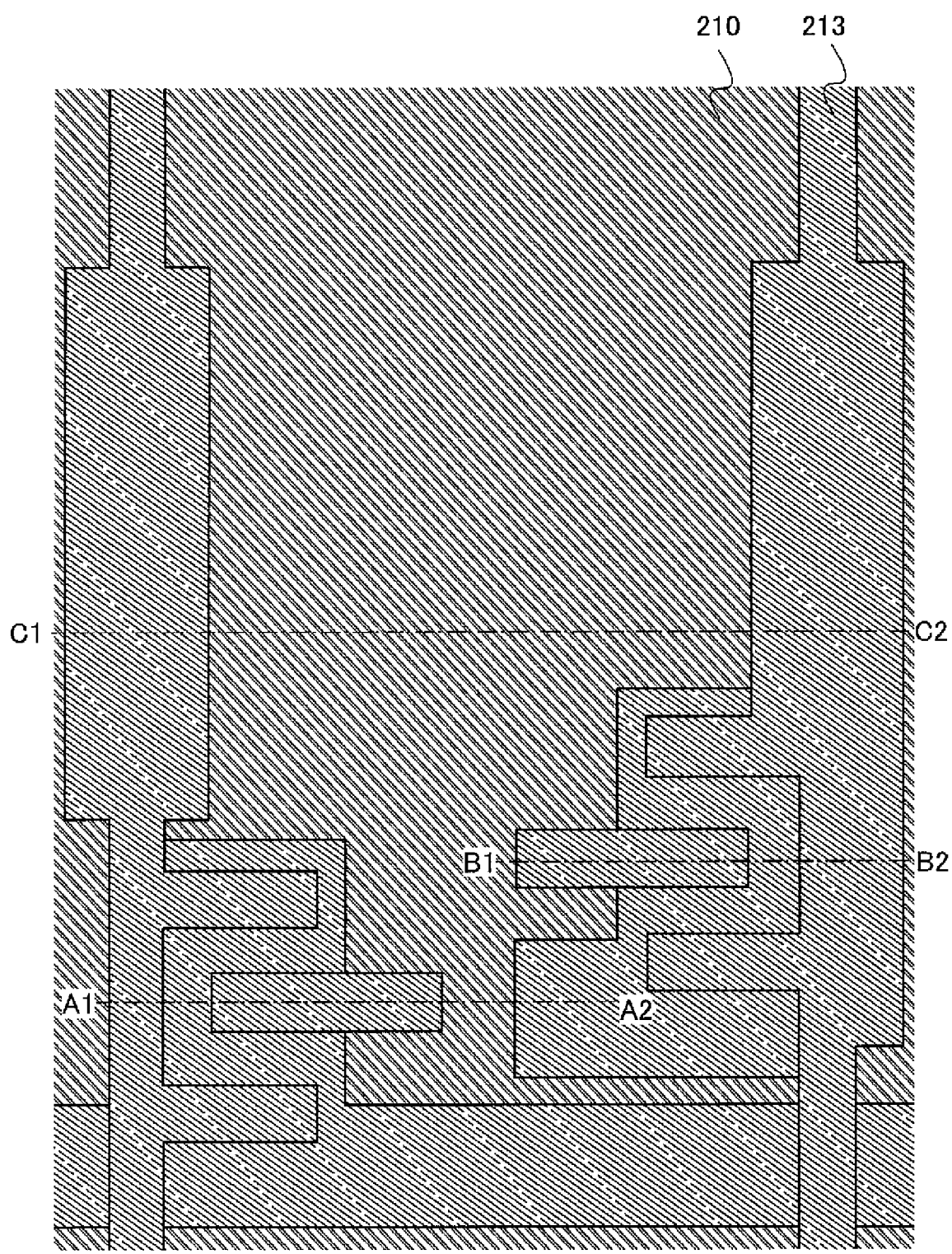
FIG. 30 illustrates one example of methods for manufacturing the display device including the thin film transistor.

In this embodiment, an example of a simple pixel circuit is illustrated in FIG. 28, and a method for manufacturing an EL display device to which the pixel circuit is applied is described. However, the pixel circuit of the EL display device which is one embodiment of the present invention is not limited to the structure illustrated in FIG. 28.

In the pixel of the EL display device illustrated in FIG. 28, a pixel 200 includes a first transistor 201, a second transistor 202, a capacitor 203, and a light-emitting element 204. The first transistor 201 is an n-channel transistor and the second transistor 202 is a p-channel transistor. A gate electrode of the first transistor 201 is connected to a gate wiring 206, one of a source electrode and a drain electrode (referred to as a first electrode) of the first transistor 201 is connected to a source wiring 207, and the other of the source electrode and the drain electrode (referred to as a second electrode) of the first transistor 201 is connected to a gate electrode of the second transistor 202 and one electrode (referred to as a first electrode) of the capacitor 203. The other electrode (referred to as a second electrode) of the capacitor 203 is connected to a power supply line 205. One of a source electrode and a drain electrode (referred to as a first electrode) of the second transistor 202 is connected to one electrode (referred to as a first electrode) of the light-emitting element 204, and the other of the source electrode and the drain electrode (referred to as a second electrode) of the second transistor 202 is connected to the power supply line 205. The other electrode (referred to as a second electrode) of the light-emitting element 204 is connected to a common electrode 208.

The operation of the pixel 200 is described. When the first transistor 201 is turned on by a signal of the gate wiring 206, the first electrode of the second transistor 202 and the first electrode of the capacitor 203 each have a potential equal to that of the source wiring 207 ($V_{37}$). When the potential of the gate electrode of the second transistor 202 is lower than that of the power supply line 205, and the potential difference between the potential of the gate electrode of the second transistor 202 and the potential of the power supply line 205 is greater than or equal to the threshold value of the second transistor 202, the second transistor 202 is turned on and the light-emitting element 204 emits light.

Accordingly, in the case of operating the second transistor 202 in a linear region, the potential of the source wiring 207 ($V_{37}$) is changed (for example, binary values), so that on and off of the second transistor 202 can be controlled. That is, voltage application to the EL layer included in the light-emitting element 204 can be controlled.

In the case of operating the second transistor 202 in a saturation region, the change in potential of the source wiring 207 ($V_{37}$) allows the control of the voltage between the gate electrode and the source electrode of the second transistor 202 and thus allows the control of the amount of current flowing through the light-emitting element 204.

In the above manner, in the case of operating the second transistor 202 in a linear region, it can be controlled whether voltage is applied to the light-emitting element 204. Thus, the light-emitting state and the non-light emitting state of the light-emitting element 204 can be controlled. The driving method like this can be used for digital time grayscale driving, for example. The digital time grayscale driving is a driving method in which one frame is divided into a plurality of subframes and the light-emitting state and the non-light emitting state of the light-emitting element 204 are controlled in each subframe.

On the other hand, in the case of operating the second transistor 202 in a saturation region, the amount of current flowing through the light-emitting element 204 can be controlled and luminance of the light-emitting element 204 can be adjusted.

Next, an EL display device to which the pixel circuit illustrated in FIG. 28 is applied and a manufacturing method thereof are described below.

Figure 33:
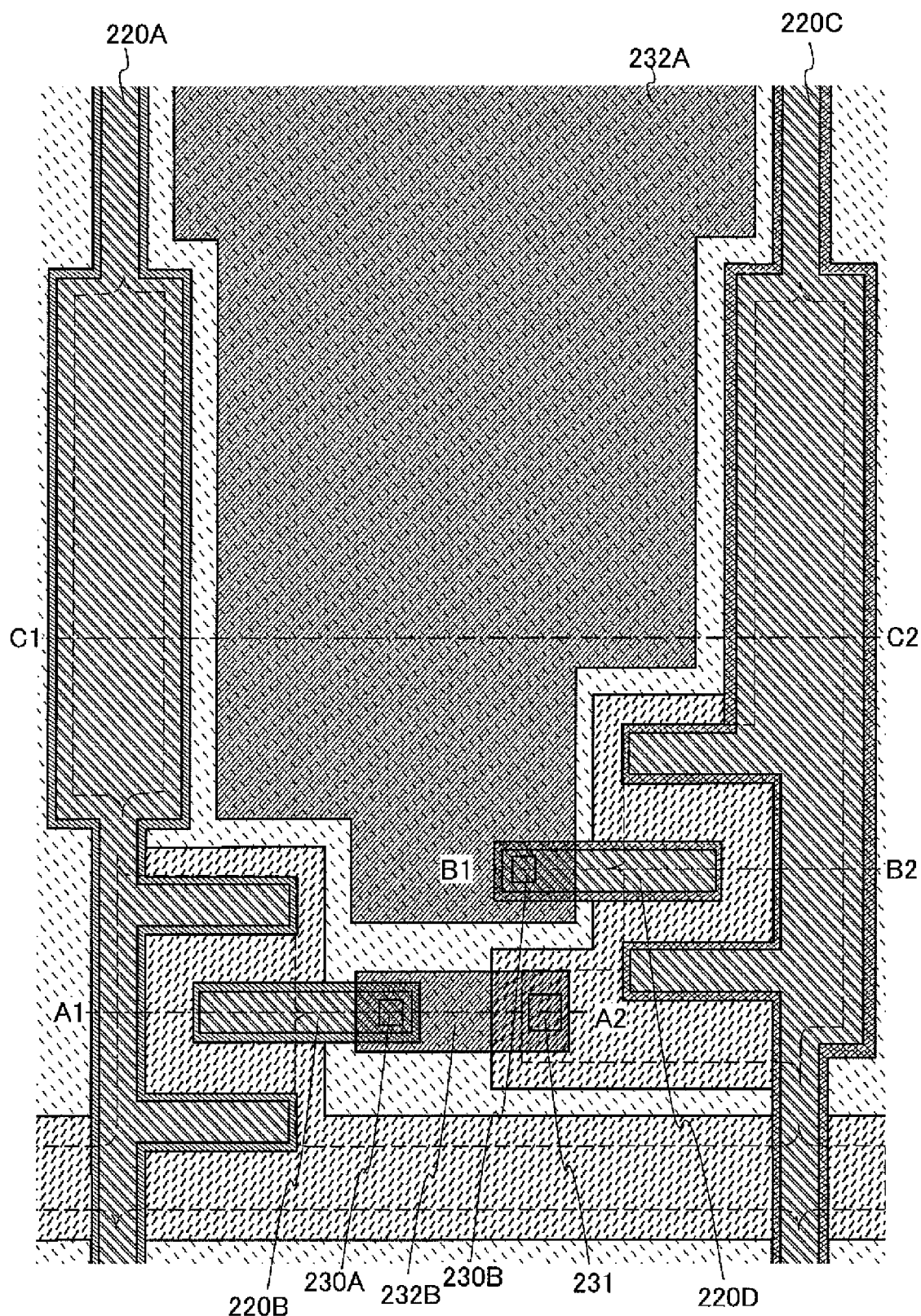
FIG. 33 illustrates one example of methods for manufacturing the display device including the thin film transistor.

FIG. 29, FIG. 30, FIG. 31, FIG. 32, and FIG. 33 are top views of the method for manufacturing the thin film transistor according to this embodiment. FIG. 33 is a completion view in the situation in which formation of a pixel electrode has been finished. FIGS. 34A to 34C, FIGS. 35A to 35C, FIGS. 36A to 36C, and FIGS. 37A to 37C are cross-sectional views taken along the line A1-A2 in FIG. 29, FIG. 30, FIG. 31, FIG. 32, and FIG. 33. FIGS. 38A to 38C, FIGS. 39A to 39C, FIGS. 40A to 40C, and FIGS. 41A to 41C are cross-sectional views taken along the line B1-B2 in FIG. 29, FIG. 30, FIG. 31, FIG. 32, and FIG. 33. FIGS. 42A to 42C, FIGS. 43A to 43C, FIGS. 44A to 44C, and FIGS. 45A to 45C are cross-sectional views taken along the line C1-C2 in FIG. 29, FIG. 30, FIG. 31, FIG. 32, and FIG. 33.

First, the first insulating film 101, the first conductive film 102, the second insulating film 104, and the second semiconductor film 209 are formed over the substrate 100 in a manner similar to that of Embodiment 1. Note that when the stacked structure includes the substrate 100, the first insulating film 101, the first conductive film 102, the second insulating film 104, and the second semiconductor film 209, any of the manufacturing methods and the materials which are described in Embodiment 1 may be selected as appropriate. Note that the second semiconductor film 209 may be formed using a material and a manner which are similar to those of the second semiconductor film 106 in Embodiment 1.

Figure 34A:
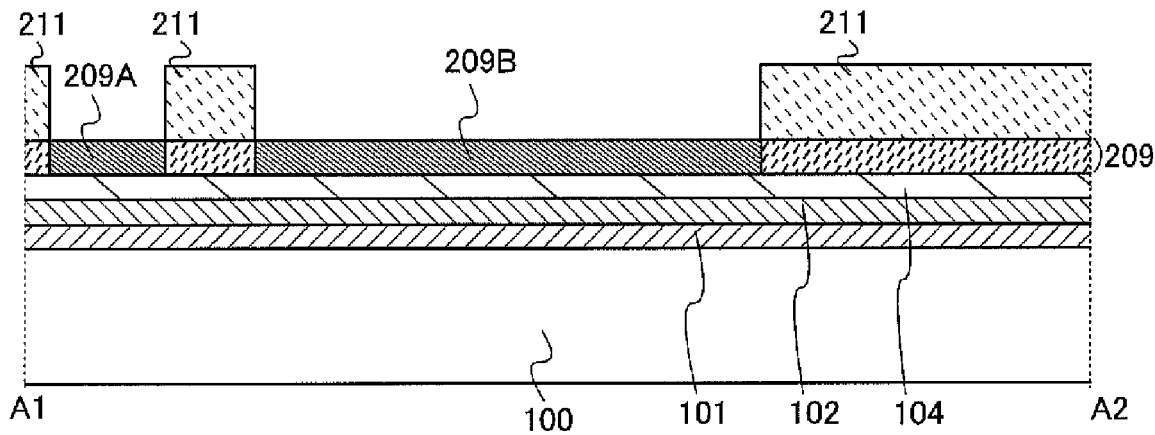
FIGS. 34A to 34C illustrate one example of methods for manufacturing the display device including the thin film transistor.
Figure 34B:
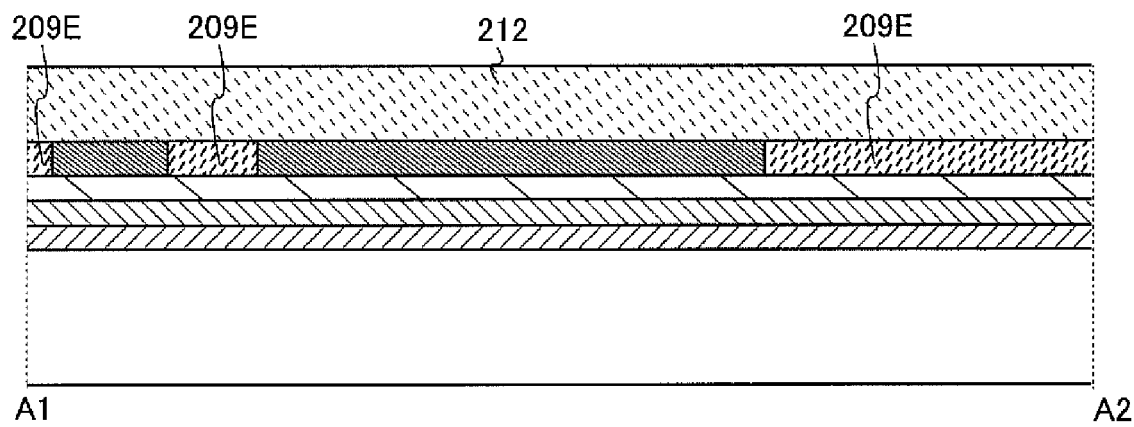
Figure 34C:
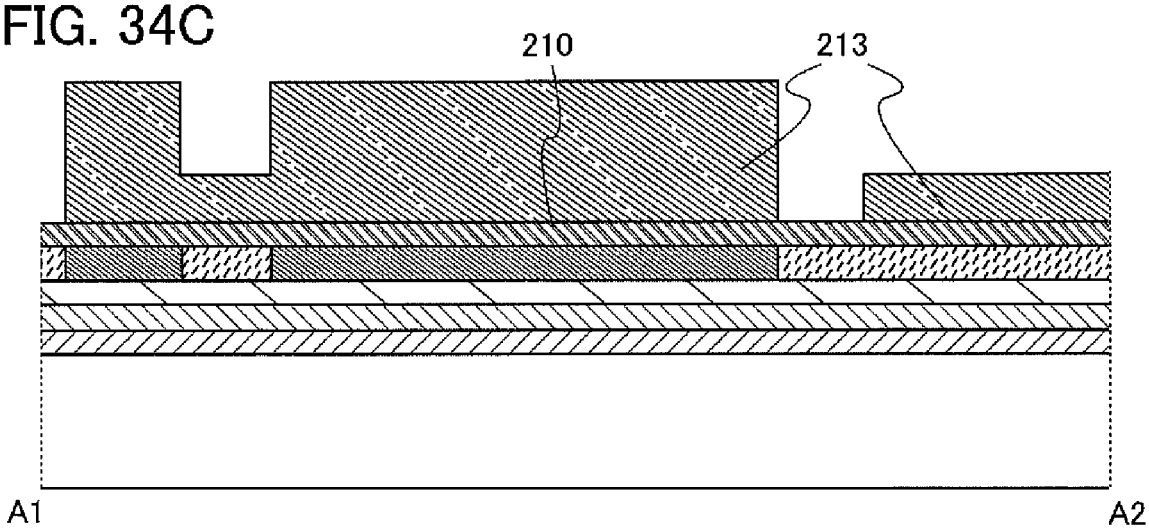
Figure 38A:
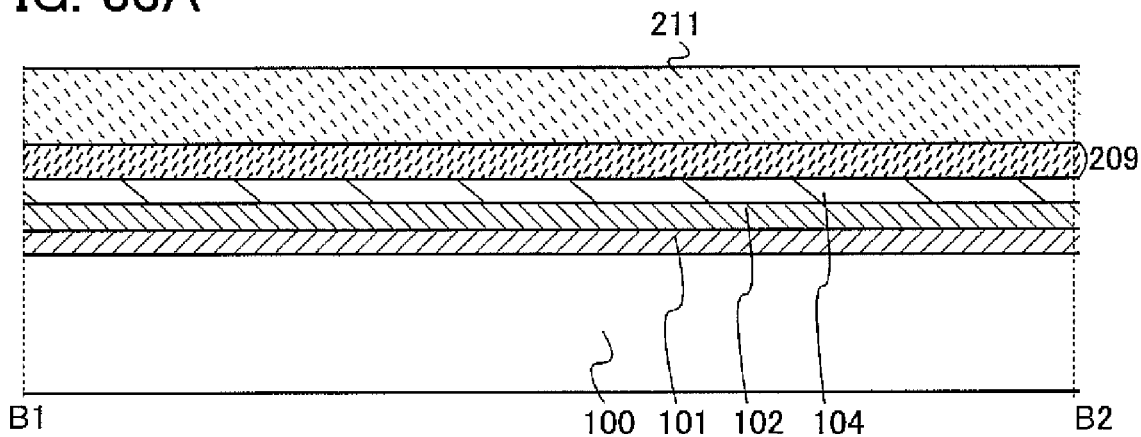
FIGS. 38A to 38C illustrate one example of methods for manufacturing the display device including the thin film transistor.
Figure 38B:
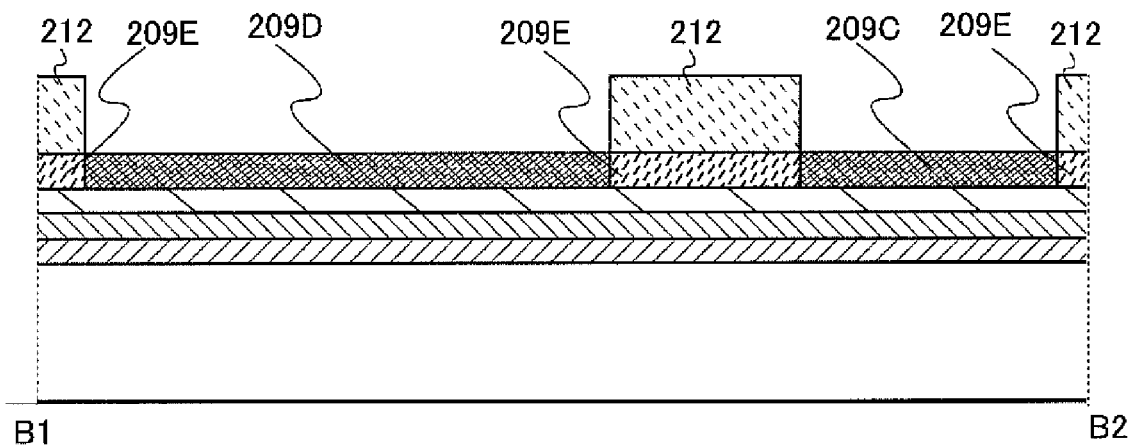
Figure 38C:
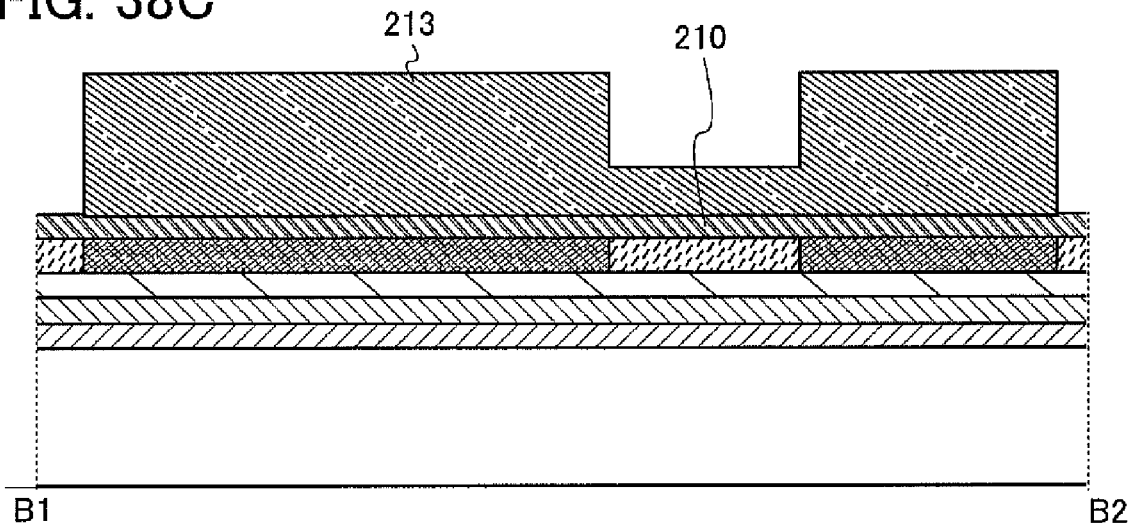
Figure 42A:
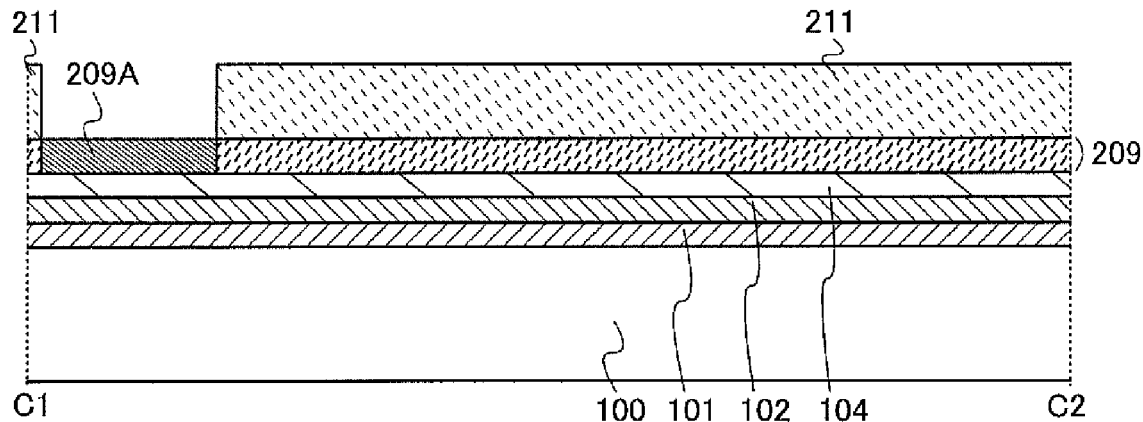
FIGS. 42A to 42C illustrate one example of methods for manufacturing the display device including the thin film transistor.
Figure 42B:
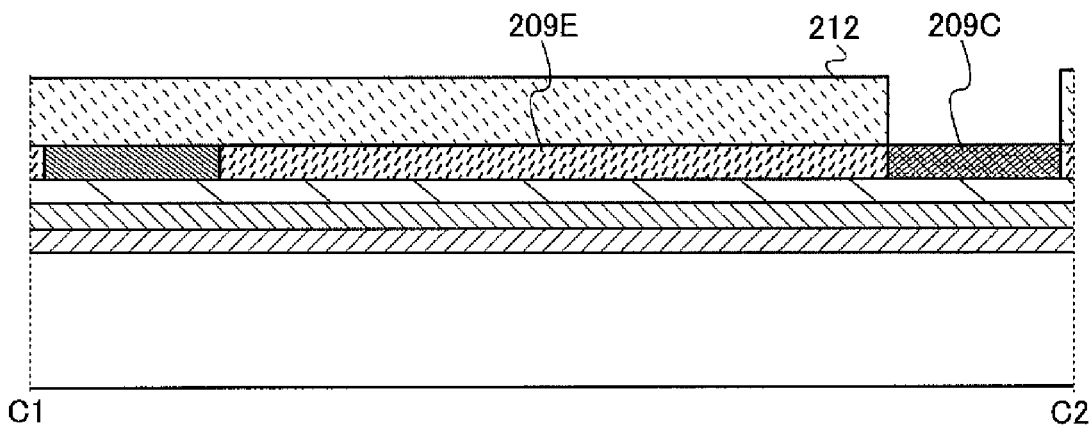
Figure 42C:
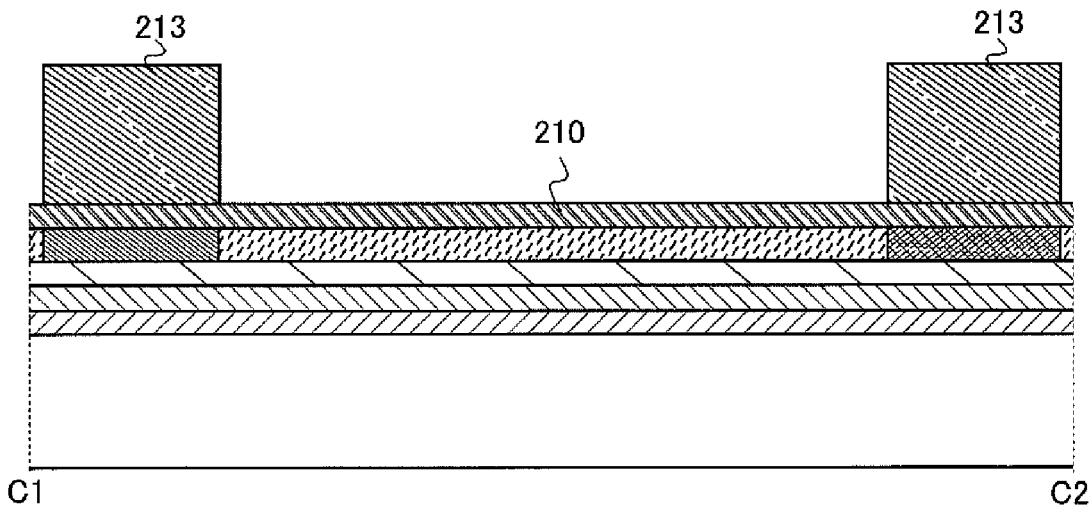

Next, a first resist mask 211 is selectively provided over the second semiconductor film 209, and an impurity element which imparts one conductivity type is added to the second semiconductor film 209 with the first resist mask 211 used as a mask, so that an impurity region 209A and an impurity region 209B are formed in regions which are not covered with the first resist mask 211 of the second semiconductor film 209 (FIG. 34A, FIG. 38A, and FIG. 42A). Here, as the impurity element which imparts one conductivity type, phosphorus (P) is added to the second semiconductor film 209 such that phosphorus (P) is contained in the impurity region 209A and the impurity region 209B at concentrations of $1\times10^{15}/cm^3$ to $1\times10^{19}/cm^3$.

Then, the first resist mask 211 is removed, and after that, a second resist mask 212 is selectively provided over the second semiconductor film 209 in which the impurity region 209A and the impurity region 209B are provided. With the use of the second resist mask 212 as a mask, an impurity element which imparts a conductivity type which is different from that of the impurity element added for forming the impurity region 209A and the impurity region 209B is added to the second semiconductor film 209, so that an impurity region 209C and an impurity region 209D are formed in regions which are not covered with the second resist mask 212 of the second semiconductor film 209. Further, a region 209E in which an impurity element is not added is formed in a region of the second semiconductor film 209, which is covered with the first resist mask 211 and then the second resist mask 212 (FIG. 29, FIG. 34B, FIG. 38B, and FIG. 42B). Here, as the impurity element which imparts one conductivity type, boron (B) is added to the second semiconductor film 209 such that boron (B) is contained in the impurity region 209C and the impurity region 209D at concentrations of $1\times10^{19}/cm^3$ to $1\times10^{20}/cm^3$.

Note that it is preferable that the impurity element which imparts one conductivity type be added to regions of the second semiconductor film 209, which are located under wirings and electrodes formed later using at least a second conductive film.

Although not illustrated here, it is preferable that low concentration impurity regions (LDD regions) which contain an impurity element at a concentration lower than those of the impurity regions 209A to 209D be formed between the regions 209E in each of which an impurity element is not added and the impurity regions 209A to 209D. Impurity elements which impart conductivity types which are the same as those of the impurity elements added for forming the impurity regions 209A to 209D are added between the regions 209E in each of which an impurity element is not added and the impurity regions 209A to 209D at lower concentrations than those of the impurity regions 209A to 209D, so that LDD regions can be formed. Specific examples of methods for forming the LDD regions are described below.

First, in a first formation method, another mask for forming the LDD regions, which is different from the first resist mask 211 and the second resist mask 212, is formed, and impurity elements are added to the LDD regions at lower concentrations than those of the impurity regions 209A to 209D. As a second formation method, a method in which the first resist mask 211 and the second resist mask 212 are made to reduce (recede) by ashing or the like in order to form a mask for forming the LDD regions and impurity elements are added, or the like can be used.

In the above second formation method, the existing resist mask is made to reduce (recede) to form a resist mask for forming the LDD regions, which has a desired shape, without forming another resist mask; thus the LDD regions can be formed without increasing the number of resist masks, which is preferable. Moreover, in the above second formation method, another resist mask is not formed; thus, misalignment of the mask can be prevented at the time of aligning the mask.

After that, the second resist mask 212 is removed and heat treatment is performed in order to activate an impurity element. Note that in the case where the LDD regions are formed, after the LDD regions and the impurity regions are formed, a mask for forming the LDD regions and the second resist mask 212 are removed from the second semiconductor film. Then, heat treatment may be performed.

Next, the second resist mask 212 is removed, and then a second conductive film 210 is formed over the second semiconductor film 209. The second conductive film 210 can be formed using a material and a formation method which are similar to those of Embodiment 1. Here, for example, Mo is used.

Next, a third resist mask 213 is formed over the second conductive film 210 (FIG. 30, FIG. 34C, FIG. 38C, and FIG. 42C). Here, it is preferable that the third resist mask 213 be a resist mask having a recessed portion or a projected portion like the second resist mask 212 described in Embodiment 1. However, this embodiment is not limited to this, and the third resist mask 213 may be a resist mask which does not have a recessed portion or a projected portion.

Note that a projected portion is formed in a region of the third resist mask 213 described in this embodiment, in which the second wiring layer is to be formed later, and a recessed portion is formed in a region of the third resist mask 213 described in this embodiment, in which the second wiring layer is not to be formed and the semiconductor film is to be exposed. The third resist mask 213 can be formed using the multi-tone mask described in Embodiment 1.

Figure 35A:
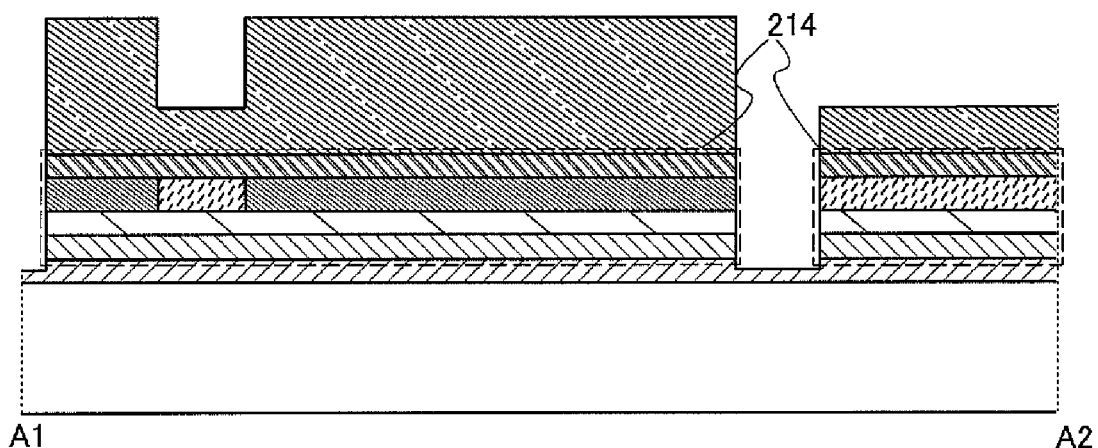
FIGS. 35A to 35C illustrate one example of methods for manufacturing the display device including the thin film transistor.
Figure 35B:
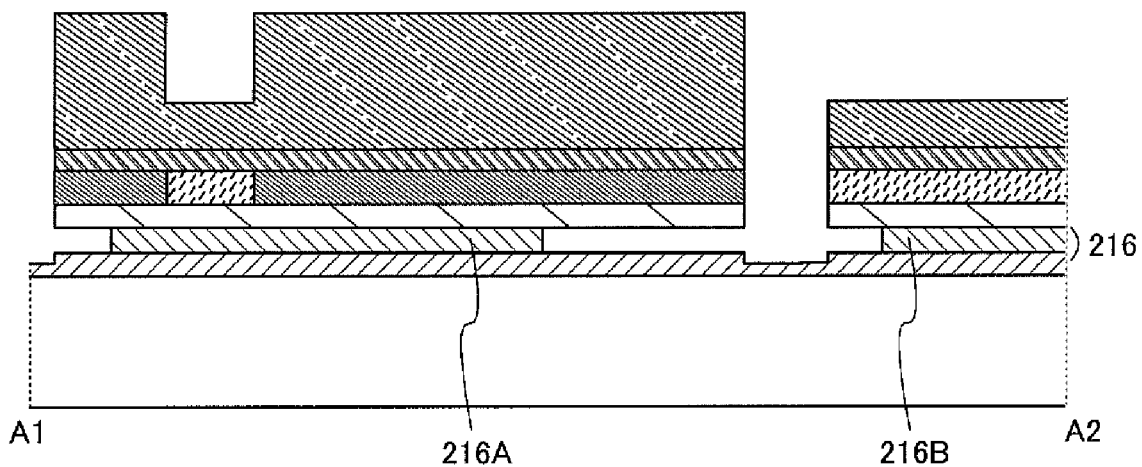
Figure 39A:
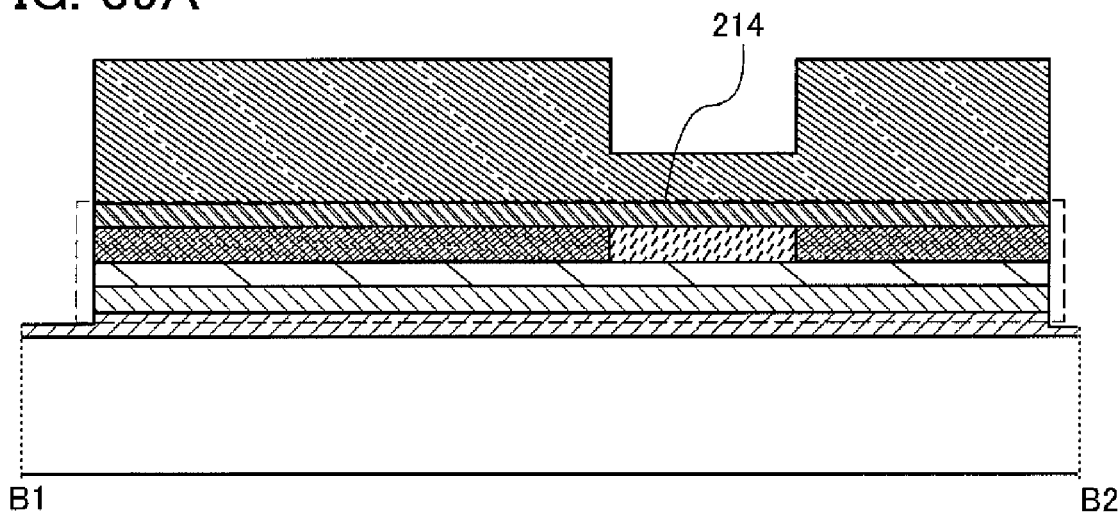
FIGS. 39A to 39C illustrate one example of methods for manufacturing the display device including the thin film transistor.
Figure 39B:
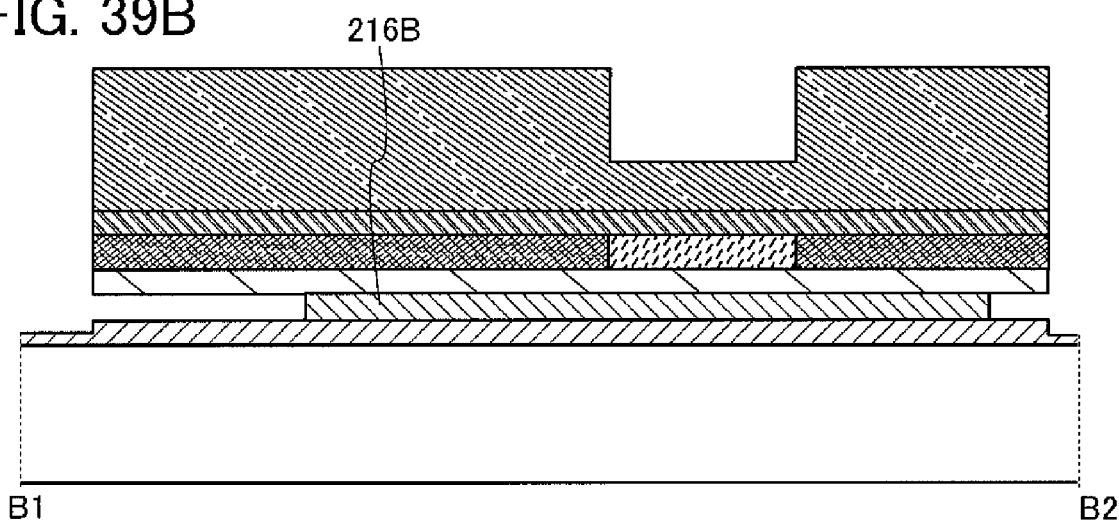
Figure 43A:
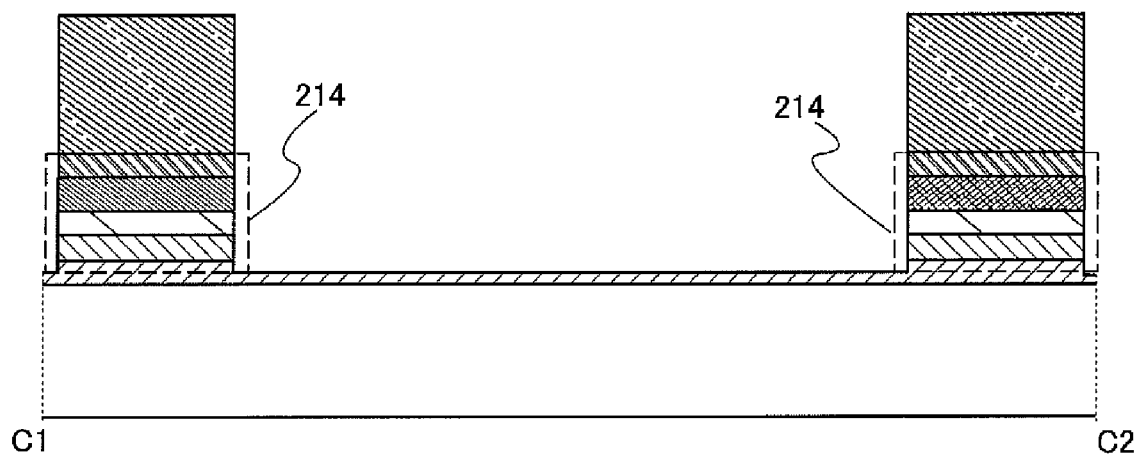
FIGS. 43A to 43C illustrate one example of methods for manufacturing the display device including the thin film transistor.
Figure 43B:
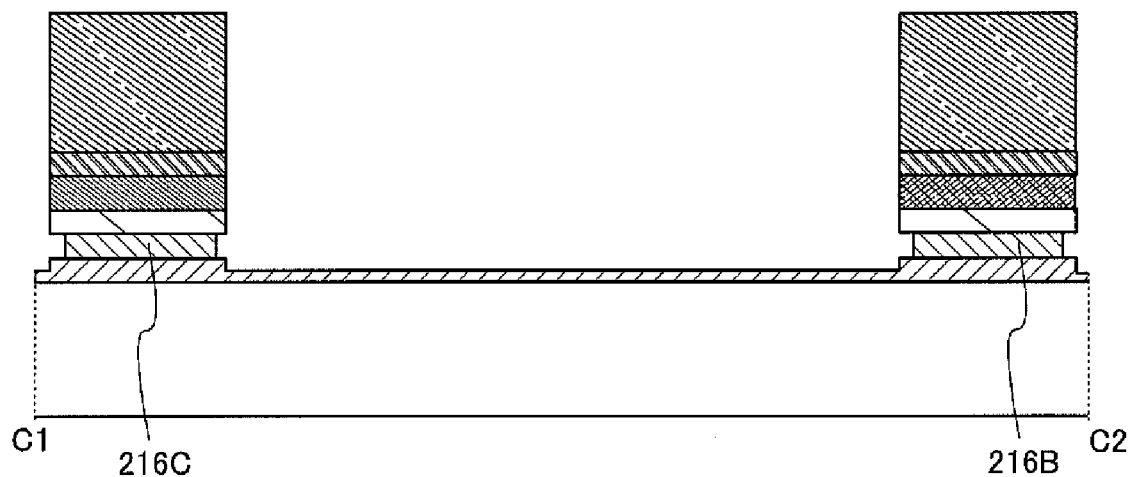

Next, first etching is performed using the third resist mask 213. That is, the first conductive film 102, the second insulating film 104, the second semiconductor film 209, and the second conductive film 210 are patterned with etching to form a thin-film stack body 214 (FIG. 35A, FIG. 39A, and FIG. 43A). At this time, it is preferable that at least a surface of the first conductive film 102 be exposed. In this embodiment, this etching step is called "first etching". As the first etching, dry etching or wet etching may be employed. The first etching can be performed in a manner similar to that of Embodiment 1.

Next, second etching is performed using the third resist mask 213. That is, the first conductive film 102 is patterned with etching to form a first wiring layer 216 (collective term of 216A, 216B and 216C; FIG. 31, FIG. 35B, FIG. 39B, and FIG. 43B).

Note that the first wiring layer 216 includes a gate electrode of a thin film transistor, a gate wiring, one electrode of a capacitor, and a supporting portion. When a first wiring layer is referred to as a "first wiring layer 216A", the first wiring layer means an electrode layer which includes a gate wiring and the gate electrode of the first transistor 201. When a first wiring layer is referred to as a "first wiring layer 216B", the first wiring layer means an electrode layer which includes the gate electrode of the second transistor 202 and one electrode of the capacitor 203. When a first wiring layer is referred to as a "first wiring layer 216C", the first wiring layer means an electrode layer which includes a supporting portion. These first wiring layers are collectively referred to as the first wiring layer 216.

The second etching is performed under such etching conditions that a side surface of the first wiring layer 216 formed using the first conductive film 102 is located on an inner side than a side surface of the thin-film stack body 214 in a manner similar to that of Embodiment 1.

As described in Embodiment 1, the second etching under the condition that side-etching can also be performed is very important. This is because with the second etching in which the first conductive film 102 is side-etched, a pattern which enables desired connection between not only the gate wirings, which are adjacent to each other and are formed using the first wiring layer 216, but also elements in the pixel circuit can be formed.

Figure 31:
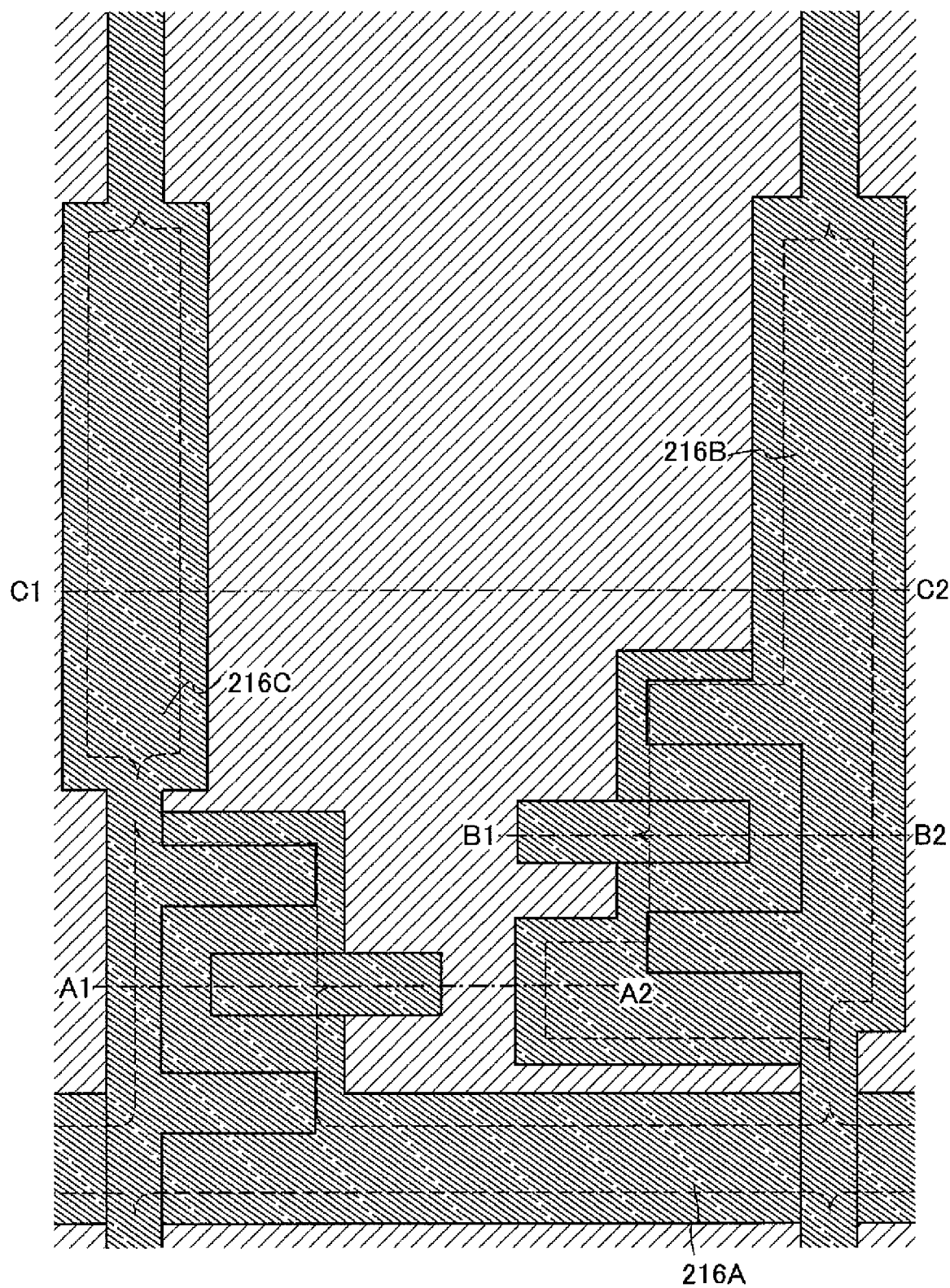
FIG. 31 illustrates one example of methods for manufacturing the display device including the thin film transistor.
Figure 32:
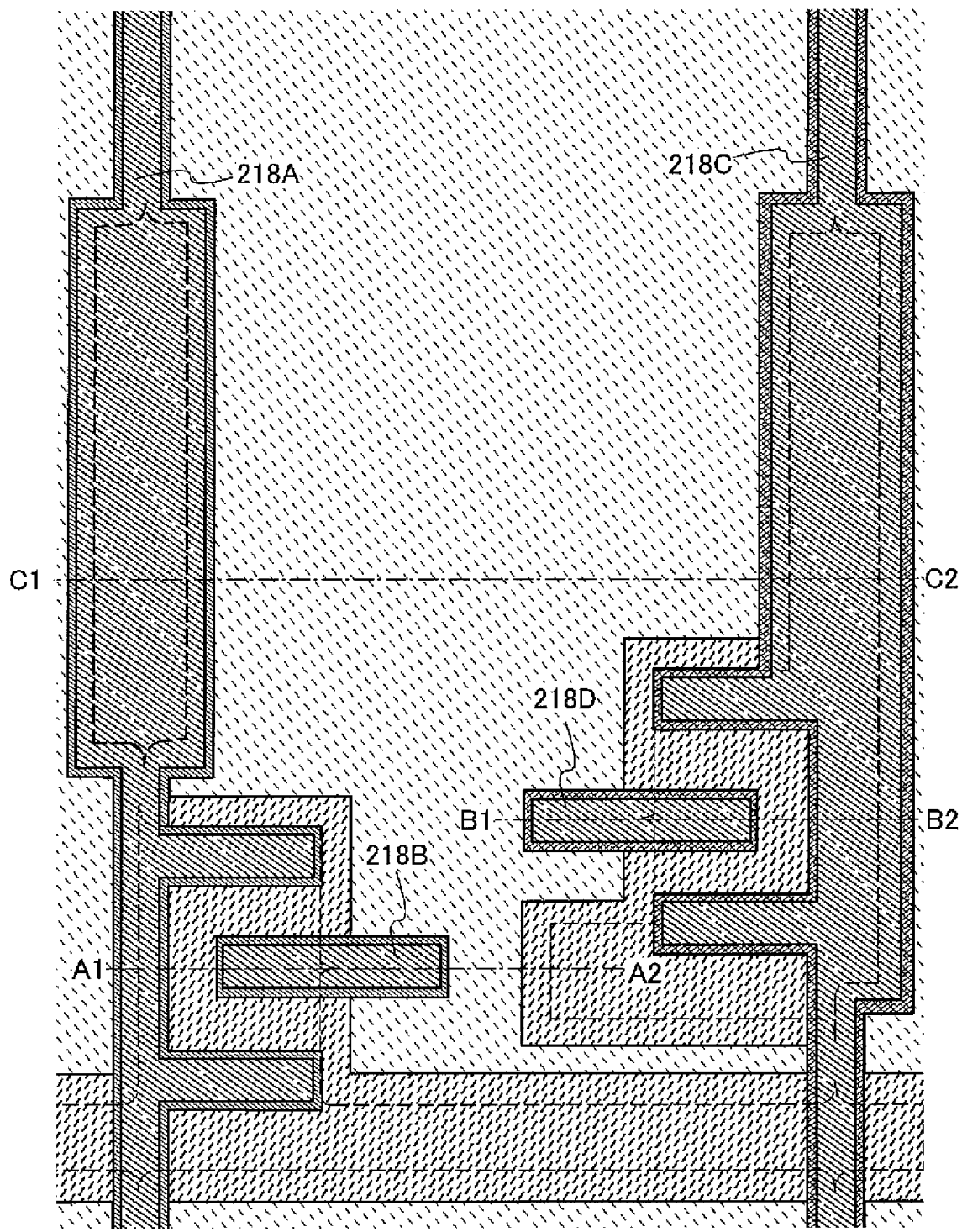
FIG. 32 illustrates one example of methods for manufacturing the display device including the thin film transistor.

The first wiring layer 216C illustrated in FIG. 31 serves as a supporting portion which supports a portion of the thin-film stack body 214 which is located above the first wiring layer 216C. By the existence of the supporting portion, peeling of a film such as a gate insulating film formed over the first wiring layer 216 can be prevented. Further, by the existence of the supporting portion, a cavity region formed in contact with the first wiring layer 216 with the second etching can be prevented from being larger than necessary. Furthermore, it is preferable to provide the supporting portion because the thin-film stack body 214 can be prevented from being broken or damaged due to its own weight and, accordingly, fabrication yield is increased. However, this embodiment is not limited to this, and the supporting portion is not necessarily provided.

Note that, the first wiring layer 216 is formed so as to have a horn when seen from the above (FIG. 31). The first wiring layer 216 may be formed so as not to have such a horn in a manner similar to that of Embodiment 1.

Next, the third resist mask 213 is made to reduce (recede) to expose the second conductive film 210 and form a fourth resist mask 218. A region in which the fourth resist mask 218 is formed corresponds or substantially corresponds with the projected portion of the third resist mask 213. Note that the case where the fourth resist mask 218 is formed after the second etching is described here; however, this embodiment is not limited to this, and the second etching may be performed after the formation of the fourth resist mask 218.

In the case where a multi-tone mask is not used to form the third resist mask 213, the fourth resist mask 218 may be separately formed using another photomask.

Figure 35C:
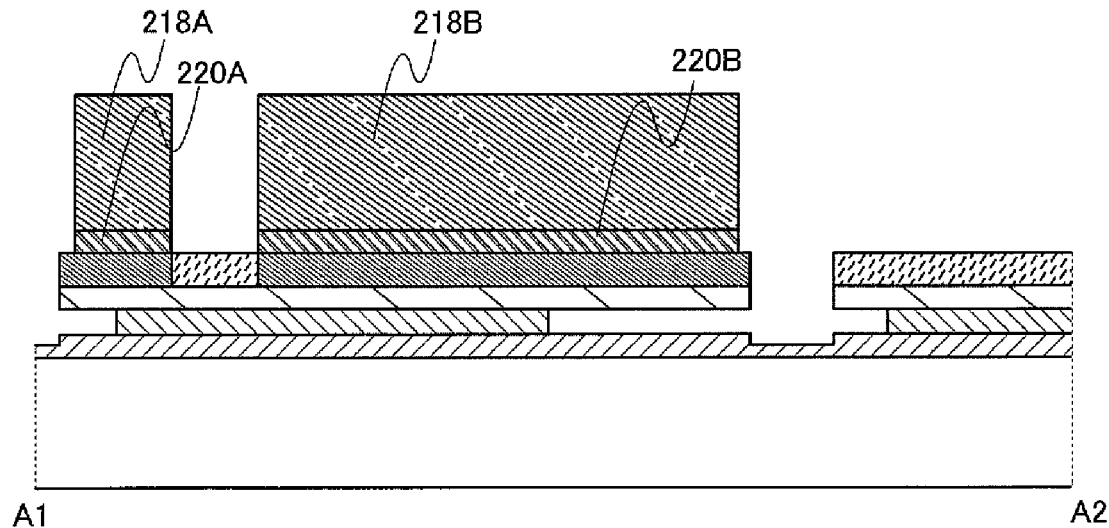
Figure 39C:
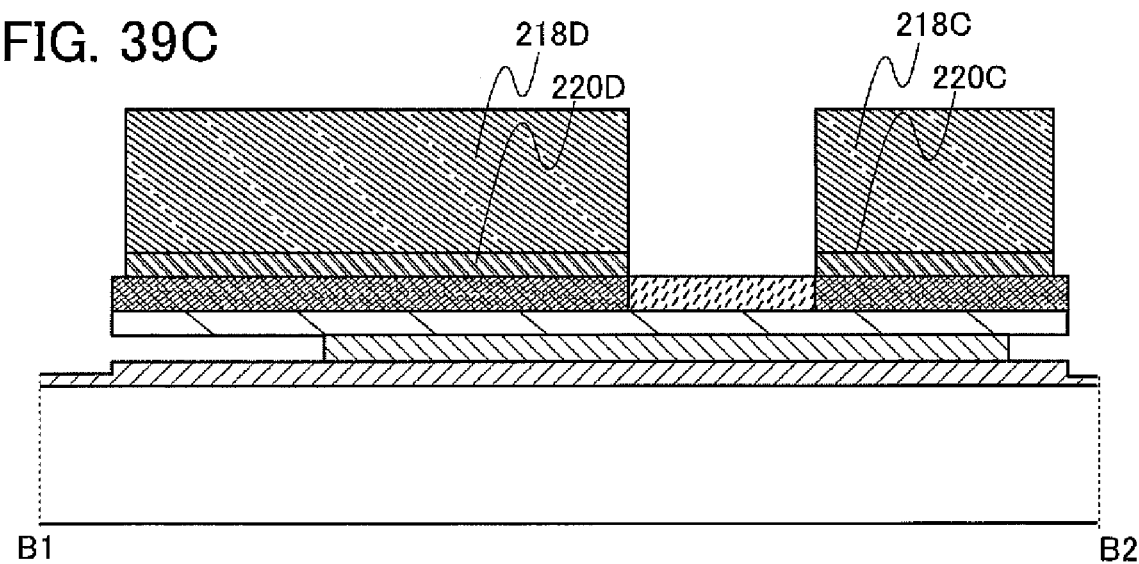
Figure 43C:
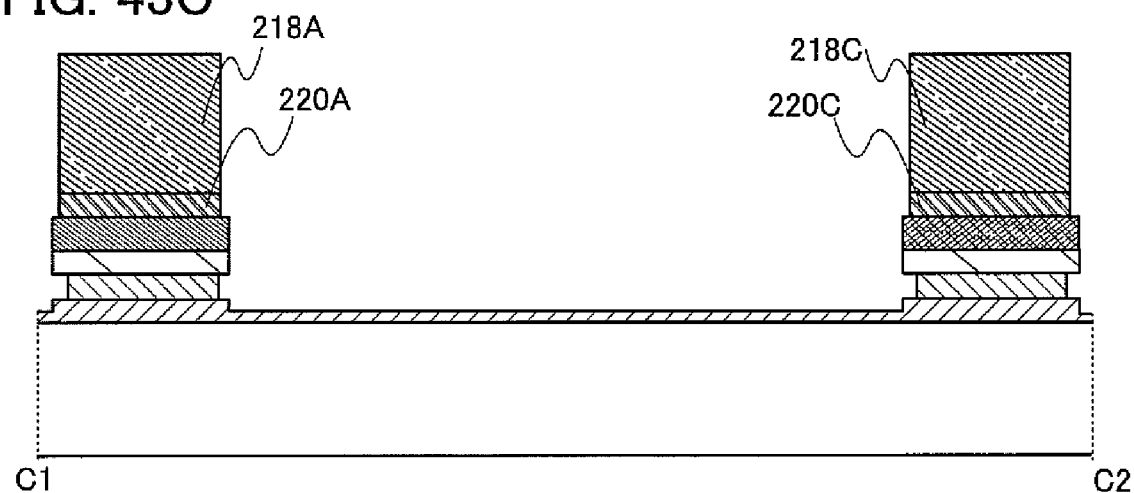

Next, the second conductive film 210 in the thin-film stack body 214 is etched using the fourth resist mask 218, so that the second wiring layer 220 (collective term of 220A, 220B, 220C and 220D) is formed (FIG. 32, FIG. 35C, FIG. 39C, and FIG. 43C). Here, as the etching conditions, the conditions under which films other than the second conductive film 210 are not unintentionally etched or eroded or are not easily unintentionally etched or eroded are selected. In particular, it is important that etching be performed under the conditions that the first wiring layer 216 is not unintentionally etched or eroded or is not easily unintentionally etched or eroded. Note that the above step described with reference to FIG. 35C, FIG. 39C, and FIG. 43C is referred to as third etching.

Note that the second wiring layer 220 includes the source electrode or the drain electrode of the thin film transistor, the source wiring, the power supply line, the other of the electrodes of the capacitor, and the electrode which connects the thin film transistor to one electrode of the light-emitting element. When a second wiring layer is referred to as the "second wiring layer 220A", the second wiring layer means an electrode layer which includes the source wiring 207 and one of the source electrode and the drain electrode of the first thin film transistor 201; when a second wiring layer is referred to as a "second wiring layer 220B", the second wiring layer means an electrode layer which includes the other of the source electrode and the drain electrode of the first thin film transistor 201; when a second wiring layer is referred to as the "second wiring layer 220C", the second wiring layer means an electrode layer which includes one of the source electrode and the drain electrode of the second thin film transistor 202, the power supply line 205, and one electrode of the capacitor 203; and when a second wiring layer is referred to as a "second wiring layer 220D", the second wiring layer means an electrode layer which includes the other of the source electrode and the drain electrode of the second thin film transistor 202 and an electrode connected to one electrode of the light-emitting element 204.

Note that a fourth resist mask 218A means a resist mask which overlaps with the second wiring layer 220A, a fourth resist mask 218B means a resist mask which overlaps with the second wiring layer 220B, a fourth resist mask 218C means a resist mask which overlaps with the second wiring layer 220C, and a fourth resist mask 218D means a resist mask which overlaps with the second wiring layer 220D.

Note that the etching of the second conductive film 210 in the thin-film stack body 214 may be performed with wet etching or dry etching.

Figure 36A:
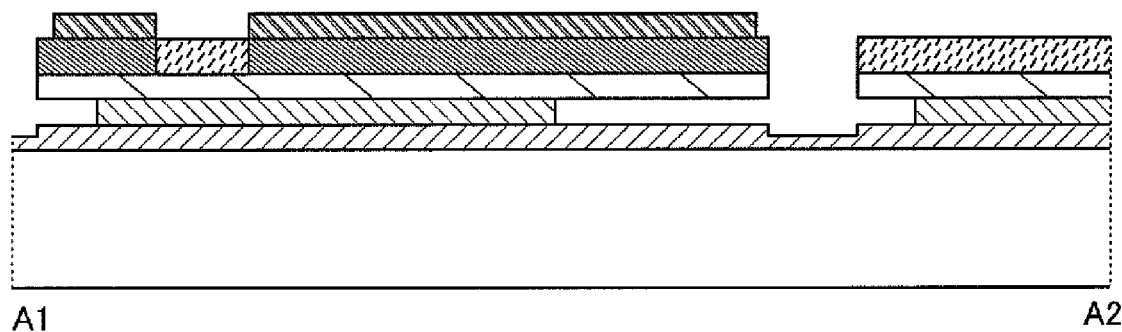
FIGS. 36A to 36C illustrate one example of a method for manufacturing the display device including the thin film transistor.
Figure 40A:
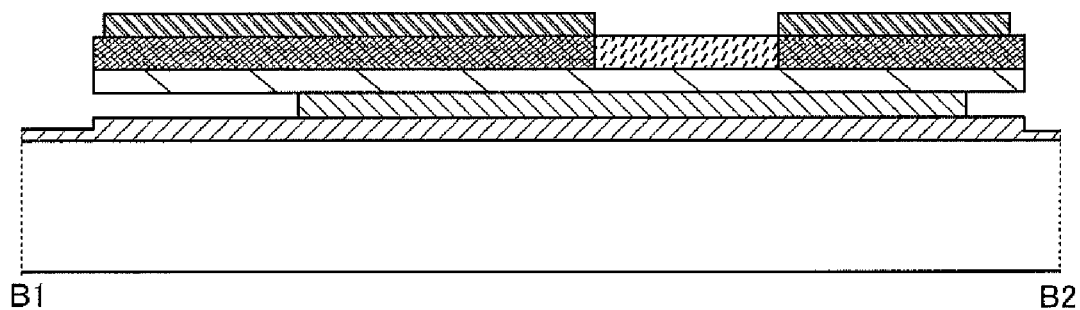
FIGS. 40A to 40C illustrate one example of methods for manufacturing the display device including the thin film transistor.
Figure 44A:
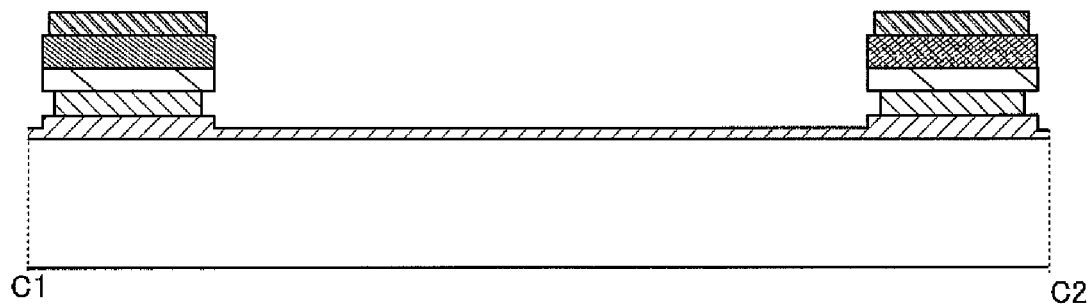
FIGS. 44A to 44C illustrate one example of methods for manufacturing the display device including the thin film transistor.

After that, the fourth resist mask 218 is removed; accordingly, a thin film transistor is completed (FIG. 36A, FIG. 40A, and FIG. 44A). As described above, a plurality of thin film transistors with different conductivity types can be formed over the same substrate using three photomasks (multi-tone masks). In particular, a patterning step in which the thin film transistor is etched can be performed using one photomask (multi-tone mask).

Figure 36B:
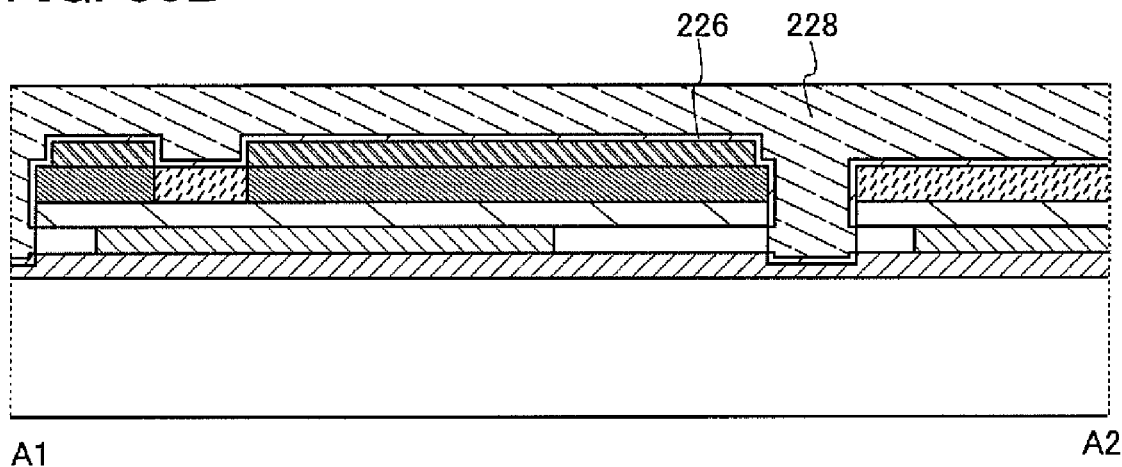
Figure 40B:
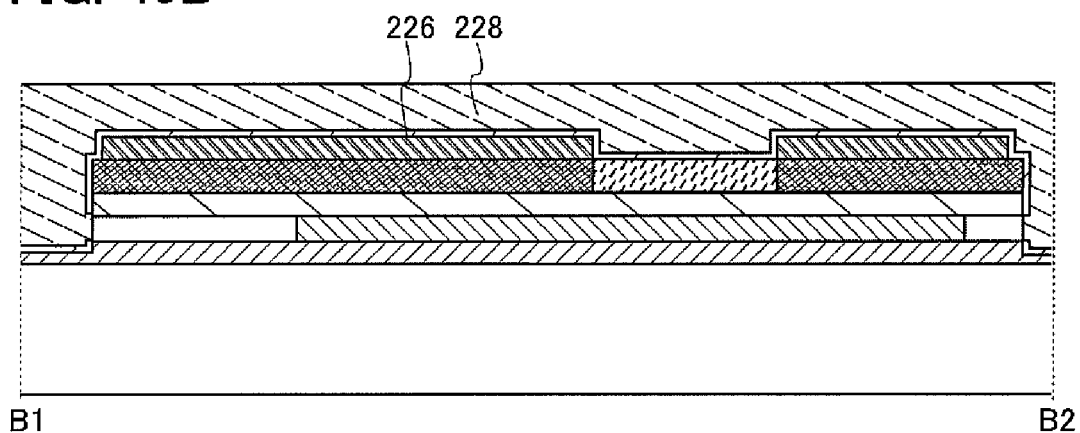
Figure 44B:
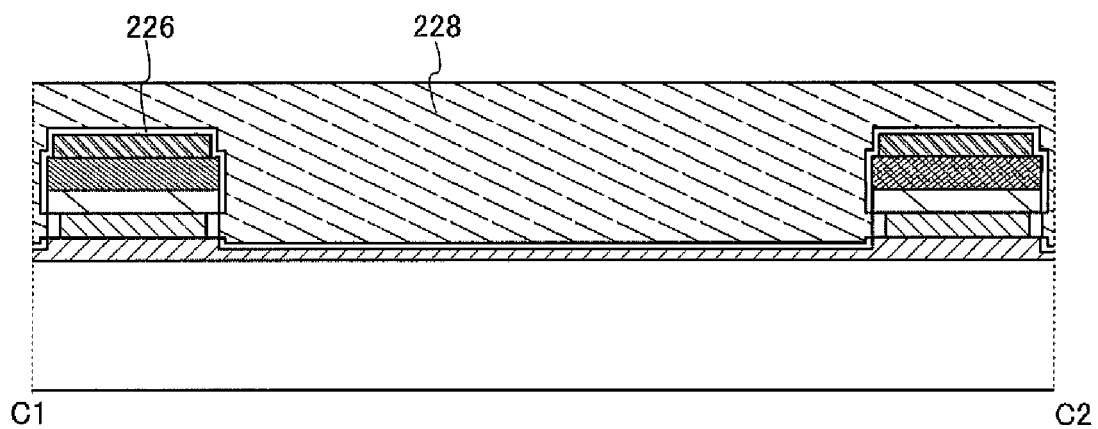

A third insulating film is formed to cover the thin film transistor which is formed in the above manner. Here, the third insulating film may be formed using only a first protective film 226. In this embodiment, the third insulating film is formed using the first protective film 226 and a second protective film 228 (FIG. 36B, FIG. 40B, and FIG. 44B). The first protective film 226 is formed using silicon nitride containing hydrogen or silicon nitride oxide containing hydrogen; thus, the semiconductor film can be prevented from being contaminated by entry and diffusion of Na and the like. As a method for forming the first protective film 226, for example, a CVD method, a sputtering method, or the like can be given; however, the method is not limited to this. In the case where the first protective film 226 is formed to have a thickness which is far smaller than the thickness of the first wiring layer 216 with a CVD method or the like, the first protective film 226 is not likely to be formed in the vicinity of a cavity formed on a side surface of the first wiring layer 216 as illustrated in FIG. 36B, FIG. 40B, and FIG. 44B. However, when the first protective film 226 is sufficiently thick, the first protective film 226 can also be formed in the vicinity of the cavity formed on the side surface of the first wiring layer 216. It is preferable that the first protective film 226 be thicker than, for example, the first conductive film 102 so that the first protective film 226 can also be formed in the vicinity of the cavity formed on the side surface of the first wiring layer 216.

The second protective film 228 is formed with a method with which the surface thereof is almost planarized. This is because when the surface of the second protective film 228 is almost planar, disconnection or the like of a first pixel electrode layer 232 formed over the second protective film 228 can be prevented. Accordingly, the phrase "almost planar" means planar to such an extent that the above aim can be achieved, and does not mean that high planarity is required.

The second protective film 228 can be formed, for example, with a spin coating method or the like using photosensitive polyimide, acrylic, epoxy resin, or the like. Note that the material and the formation method of the second protective film 228 are not limited to the above materials and formation method.

It is preferable that the second protective film 228 include a stack of the above protective film formed with a method with which the surface thereof becomes almost planar and a protective film which covers the protective film and prevents entry and release of moisture. In particular, when the second protective film 228 is formed using an organic compound, it is preferable to stack a protective film which prevents entry and release of moisture. This protective film which prevents entry and release of moisture can prevent deterioration of a light-emitting element which is to be formed in later steps, as compared to the case where the protective film for preventing entry and release of moisture is not provided. Specifically, the protective film which prevents entry and release of moisture is preferably formed using silicon nitride, silicon nitride oxide, aluminum oxynitride, aluminum nitride, or the like. As the formation method of the second protective film 228, a sputtering method is preferably used.

Figure 36C:
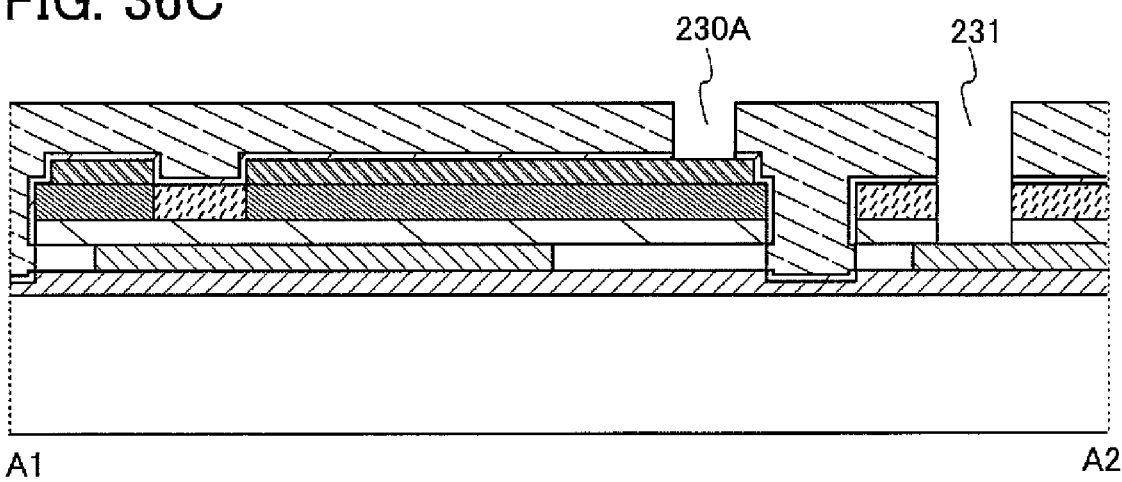
Figure 40C:
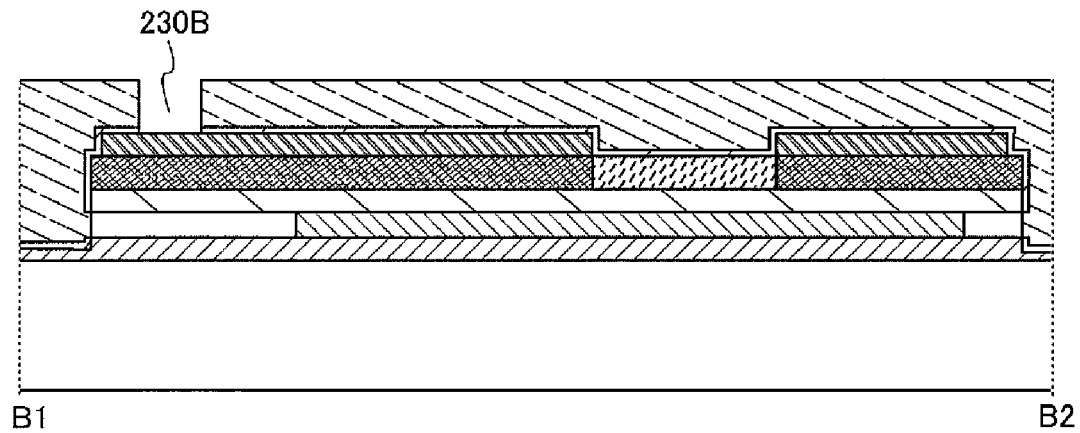
Figure 44C:
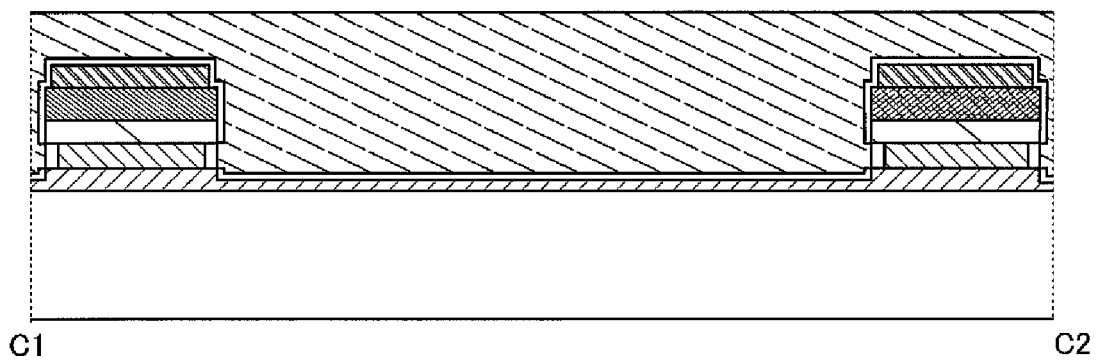

Next, a first opening portion 230 (collective term of 230A and 230B) and a second opening portion 231 are formed in the third insulating film (FIG. 36C, FIG. 40C, and FIG. 44C). The first opening portion 230 is formed so as to reach at least the surface of the second wiring layer. The second opening portion 231 is formed so as to reach at least a surface of the first wiring layer. The formation method of the first opening portion 230 and the second opening portion 231 is not limited to a particular method and may be determined as appropriate by a practitioner in accordance with the diameter of the first opening portion 230 and the like. For example, the first opening portion 230 and the second opening portion 231 can be formed with dry etching using photolithography. Although a structure in which the cavity is provided so as to overlap with the first opening portion 230 is described here; however, it is preferable that the supporting portion (not illustrated) formed using the first wiring layer 216 be provided so as to overlap with the first opening portion 230 in view of mechanical balance, fabrication yield, reliability, and the like. Moreover, in the step of forming the second opening portion 231, part of the semiconductor film located between the second wiring layer 220A and the second wiring layer 220C may be removed in order to cut the semiconductor film (FIG. 33).

The first opening portion 230 is provided so as to reach the second wiring layer 220, and a plurality of the first opening portions 230 is provided at appropriate places as illustrated in FIG. 33. The first opening portion 230A is provided over the second wiring layer 220B, and the first opening portion 230B is provided over the second wiring layer 220D.

The second opening portion 231 is provided so as to reach the second wiring layer 216. That is, not only the third insulating film but also desired regions of the second insulating film 104 and the semiconductor layer 209 are removed to provide the second opening portion 231.

Note that in the case of forming the opening portions with photolithography, one photomask is used.

Next, the first pixel electrode layer 232 (collective term of 232A and 232B) is formed over the third insulating film (FIG. 33, FIG. 37A, FIG. 41A, and FIG. 45A). The first pixel electrode layer 232 is formed so as to be connected to the second wiring layer 220 through the first opening portion 230 or so as to be connected to the first wiring layer 216 through the second opening portion 231. Specifically, the first pixel electrode layer 232A is formed so as to be connected to the second wiring layer 220D through the first opening portion 230B. The first pixel electrode layer 232B is formed so as to be connected to the second wiring layer 220B through the first opening portion 230A and so as to be connected to the first wiring layer 216B through the second opening portion 231. The first pixel electrode layer 232 may have a single layer structure or a stacked structure including a plurality of layers.

Note that in the case of forming the first pixel electrode layer 232 with photolithography, one photomask is used.

Since the thin film transistor connected to the first pixel electrode layer 232A is a p-channel thin film transistor, it is preferable to form the first pixel electrode layer 232 using a material which forms an anode. As the material which forms an anode, a material having a high work function is preferably used here. In addition, the first pixel electrode layer 232 may be formed using a material having a light-blocking property. As the material used for forming the first pixel electrode layer 232, for example, Al, Ti, titanium nitride, Ta, tantalum nitride, Ag, and the like can be given, and a stacked structure including any of the materials is preferably used.

Figure 37A:
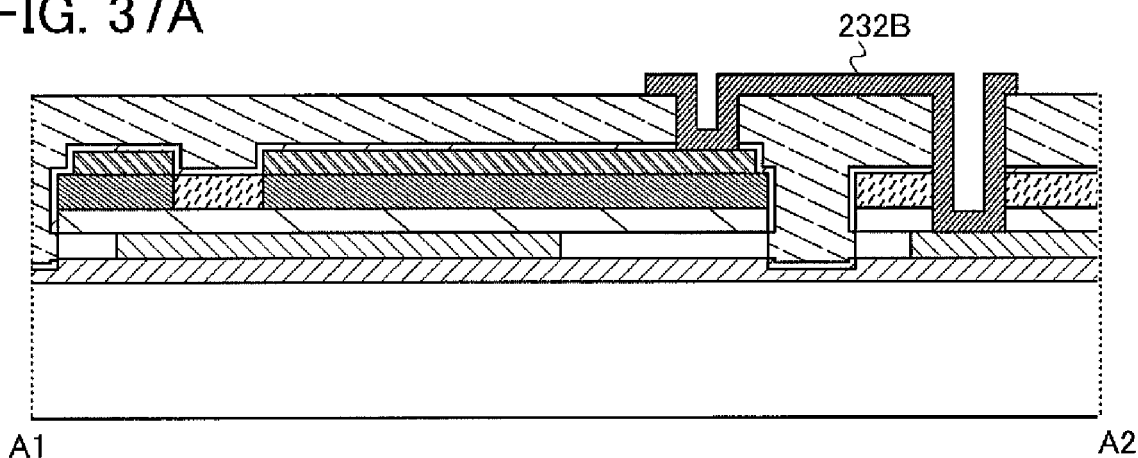
FIGS. 37A to 37C illustrate one example of methods for manufacturing the display device including the thin film transistor.
Figure 37B:
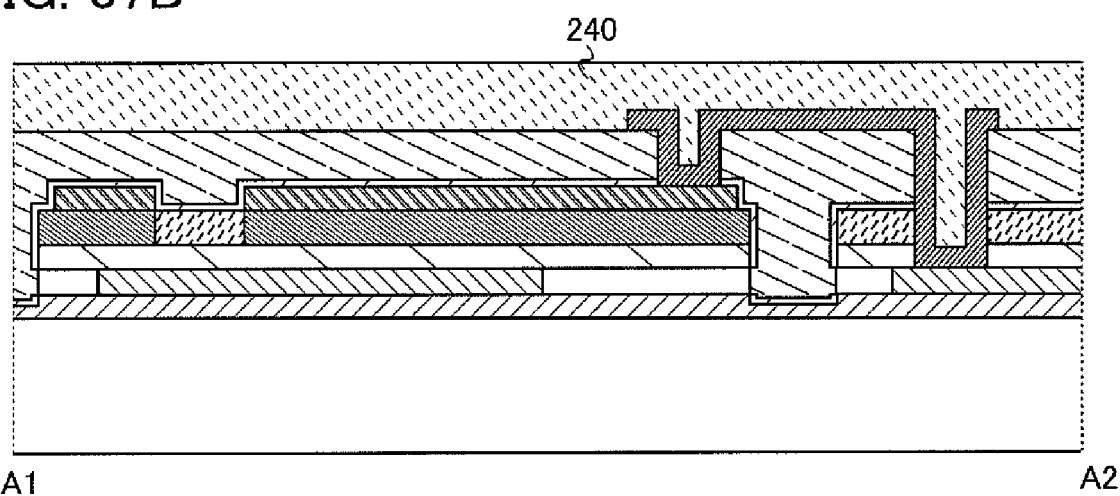
Figure 41A:
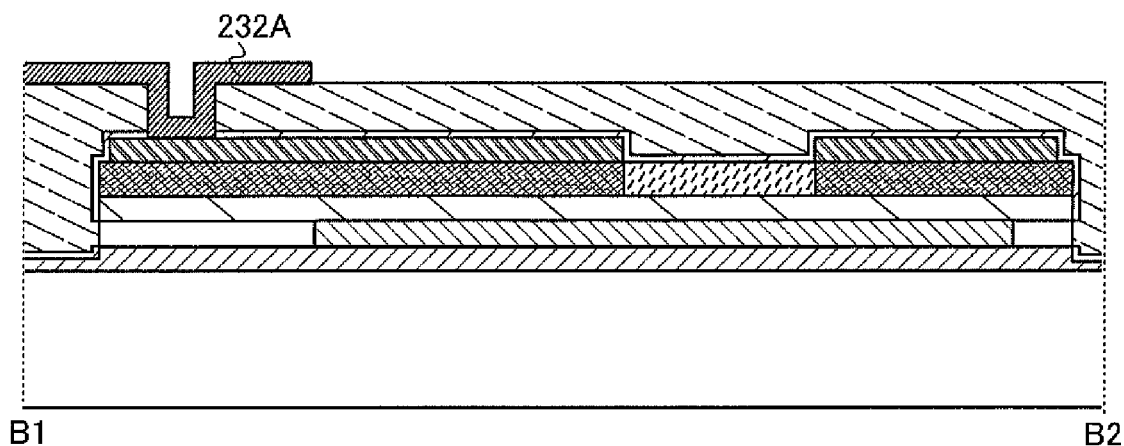
FIGS. 41A to 41C illustrate one example of methods for manufacturing the display device including the thin film transistor.
Figure 41B:
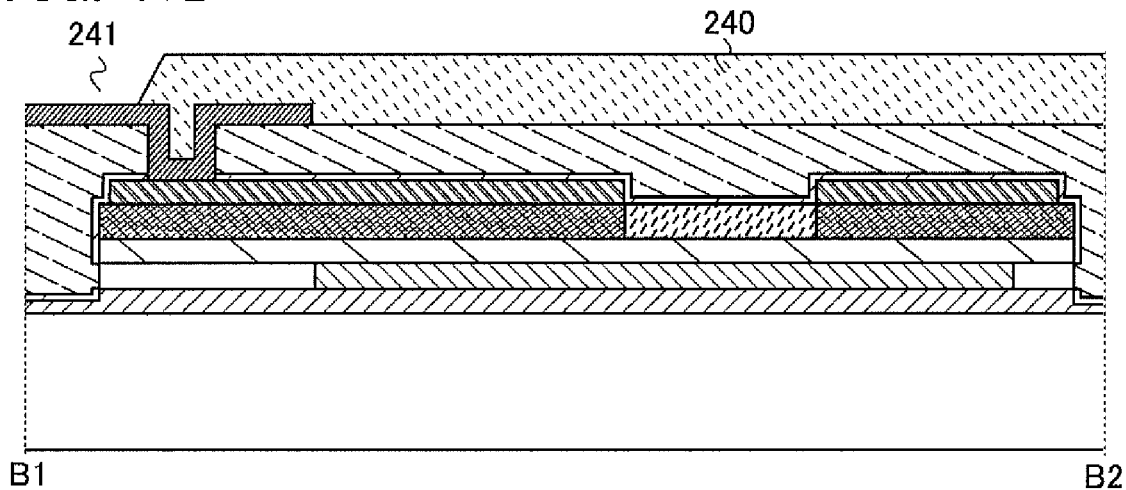
Figure 45A:
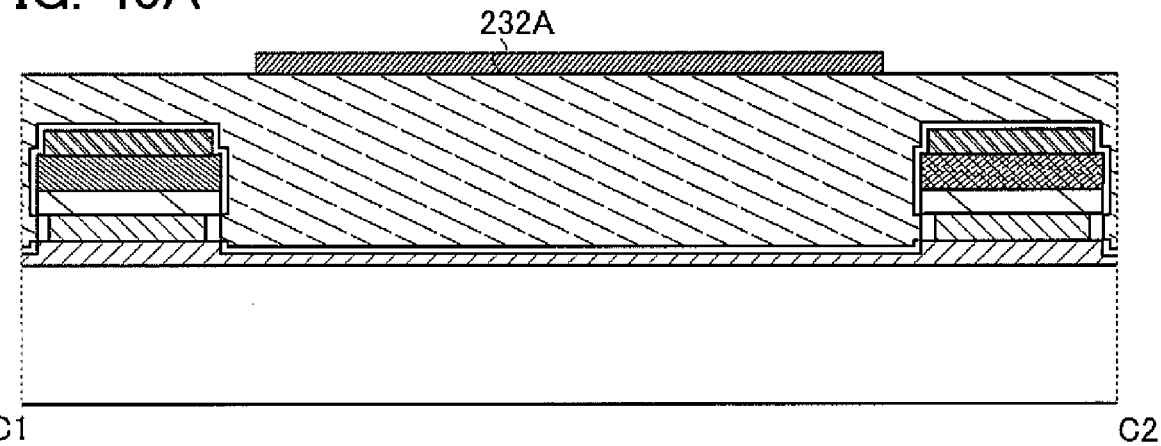
FIGS. 45A to 45C illustrate one example of methods for manufacturing the display device including the thin film transistor.
Figure 45B:
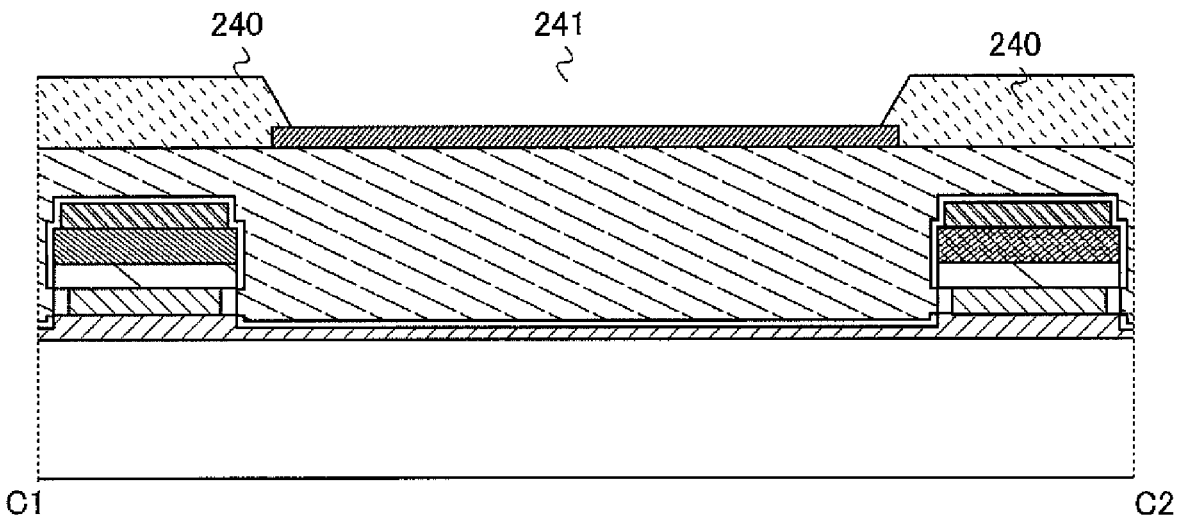

Next, a partition wall 240 is formed on the side surface (end portion) of the first pixel electrode layer 232A and over the third insulating film (FIG. 37B, FIG. 41B, and FIG. 45B). The partition wall 240 has an opening portion 241, and the first pixel electrode layer 232A is exposed through the opening portion 241. Note that it is preferable that the partition wall 240 be not formed in a region to which the flexible printed circuit (FPC) to be formed later, which is described in Embodiment 1, is connected. Therefore, it is preferable that the partition wall 240 be formed selectively using a sputtering mask when the partition wall 240 is formed using a sputtering method. The partition wall 240 is formed using an organic resin material, an inorganic insulating material, or organic polysiloxane. When the partition wall 240 is formed using an organic resin material, it is preferable that the partition wall 240 have a stacked structure including a protective film which prevents entry and release of moisture from the organic resin material as an upper layer, in order to prevent deterioration of a light-emitting element which is to be formed in later steps. Specifically, the first layer may be formed using polyimide, polyamide, polyimide amide, acrylic, or benzocyclobutene, and silicon nitride, silicon nitride oxide, aluminum nitride oxide, aluminum nitride, or the like may be deposited thereon. In particular, it is preferable that the protective film be formed using a photosensitive material; an opening portion be formed over the first pixel electrode layer 232A; a sidewall of the opening portion have an inclined surface with a continuous curvature; and the protective film which prevents entry and release of moisture be formed so as to cover top and side surfaces of the opening portion and have an inclined surface.

Then, an EL layer 242 is formed so as to be in contact with the first pixel electrode layer 232A in the opening portion of the partition wall 240. The EL layer 242 may be formed using a single layer structure or a stacked structure including a plurality of layers. The EL layer 242 includes at least a light-emitting layer.

Then, a second pixel electrode layer 243 is formed using a material which forms a cathode, so as to cover the EL layer 242. The second pixel electrode layer 243 corresponds to the common electrode 208 in FIG. 28. The second pixel electrode layer 243 can be formed using a conductive material having a low work function. The second pixel electrode layer 243 is formed to have a thickness which allows light transmission. For example, Al, AgMg, or the like, which has a thickness of 5 nm to 20 nm, can be used. The second pixel electrode layer 243 may be formed using a single layer structure or a stacked structure including a plurality of layers. The second pixel electrode layer 243 may be formed with a sputtering method, a CVD method, or the like; however, the formation method is not limited to a particular method.

Note that it is preferable that the EL layer 242 be selectively formed with a printing method, an inkjet method, or the like. These methods enable separate formation of the EL layer 242 using a projection and a recession due to a thin film transistor (a projection and a recession due to a source wiring); thus, accuracy of forming the EL layer 242 is improved. That is, the accuracy of forming the EL layer 242 can be improved and productivity of the method for manufacturing a light-emitting device can be improved without employing a special structure.

Figure 37C:
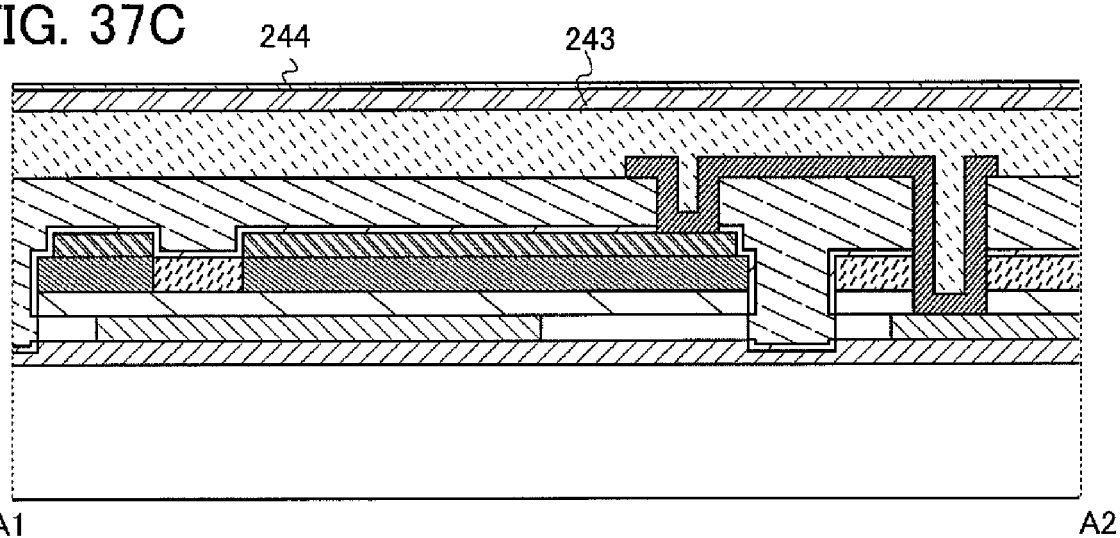
Figure 41C:
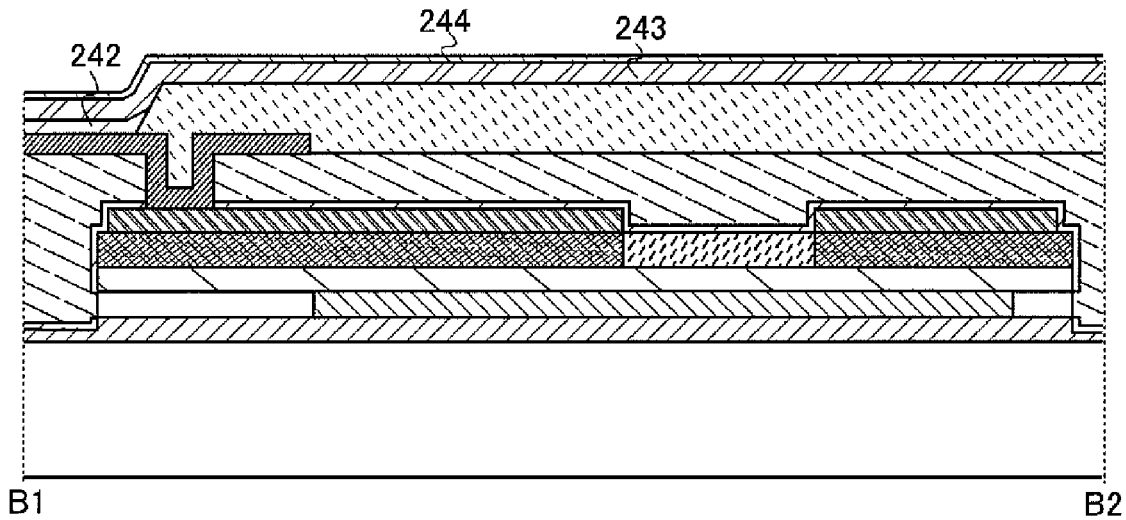
Figure 45C:
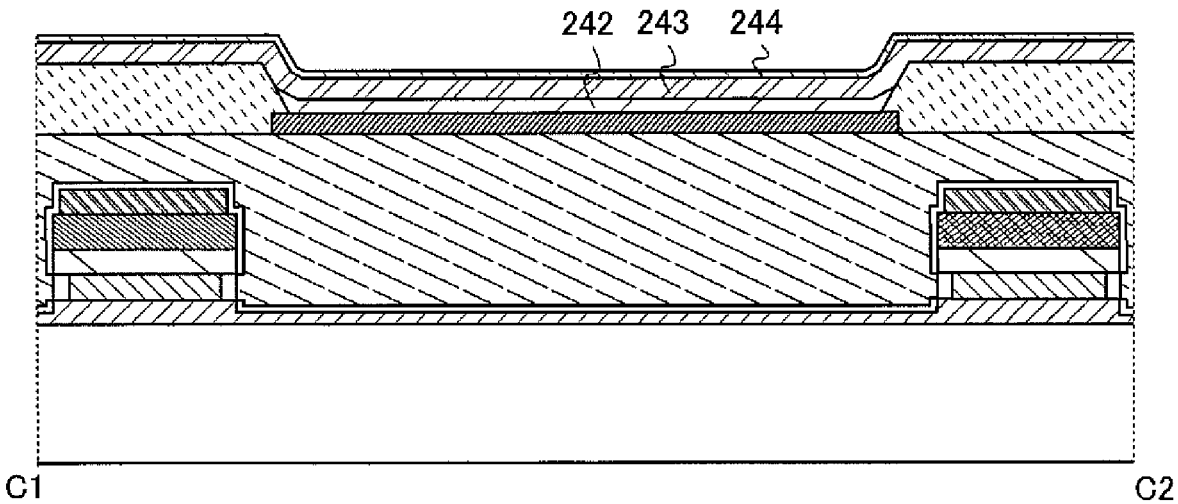

In the opening portion of the partition wall 240, the first pixel electrode layer 232A, the EL layer 242, and the second pixel electrode layer 243 overlap with one another, thereby forming a light-emitting element. The light-emitting element corresponds to the light-emitting element 204 in FIG. 28. After that, a third protective film 244 is preferably formed over the second pixel electrode layer 243 and the partition wall 240 so that oxygen, hydrogen, moisture, carbon dioxide, and the like do not enter the light-emitting element (FIG. 37C, FIG. 41C, and FIG. 45C). For a material of the third protective film 244, a material having a function of preventing entry and release of moisture is selected like that of the second protective film 228. The third protective film 244 is preferably formed using silicon nitride, silicon nitride oxide, aluminum nitride oxide, aluminum nitride, or the like. Further, a silicon nitride film, a DLC film, or the like is preferably provided to cover the third protective film 244.

Then, although not illustrated, it is preferable to further perform packaging (sealing) with a protective film (a bonding film, an ultraviolet curing resin film, or the like) or a covering material in order to prevent exposure to the outside air. It is preferable to use a material which has high airtightness and causes little degasification for the protective film or the cover material.

As described above, a light-emitting element of a top emission EL display device can be formed. However, the EL display device which is one embodiment of the present invention is not limited to the above description, and the present invention can be applied to either a bottom-emission EL display device or a dual-emission EL display device. In a bottom emission structure and a dual emission structure, the first pixel electrode layer 232 may be formed using a conductive material having a light-transmitting property.

In addition, the material and the formation method of the protective film and the like which are described above are not limited to the above material and formation method as long as light emission of the EL layer is not hindered and deterioration and the like can be prevented.

Further, in the top emission structure, the first pixel electrode layer 232A may be formed so as to cover the region in which the pixel circuit is formed. In this case, first, only the conductive layer corresponding to the first pixel electrode layer 232B is formed, an insulating layer having the first opening portion 230 is formed over the conductive layer, and then, the first pixel electrode layer 232A is formed so as to be connected to the second wiring layer 220D through the first opening portion. By forming the first pixel electrode layer 232A so as to cover the region in which the pixel circuit is formed, the light-emitting region can be enlarged and higher definition display can be performed.

Note that although an organic EL element is described here as a light-emitting element, an inorganic EL element can also be used as a light-emitting element.

In the above manner, an EL display device can be manufactured.

As described above, the number of photomasks used in manufacturing a thin film transistor is reduced, which can lead to a large reduction of the number of steps of manufacturing a thin film transistor and an EL display device.

Note that the thin film transistor manufactured using the manufacturing method of this embodiment has a structure including a gate insulating film over a first wiring layer, a second semiconductor film including a channel formation region, a source region, and a drain region over the gate insulating film, a source electrode and a drain electrode over the second semiconductor film, and a cavity in contact with the side surface of the first wiring layer. With the cavity formed in contact with the side surface of the first wiring layer, a thin film transistor with small leakage current at an end portion of the first wiring layer can be manufactured.

Further, since a pattern is not formed in a gate electrode at the time of irradiation with a laser beam, difference in thermal conductivity is not generated and variations in threshold voltage can be suppressed.

In addition, the number of steps of manufacturing a thin film transistor can be significantly reduced without a complicated step using backside light exposure, resist reflow, a lift-off method, or the like. Therefore, the number of steps of manufacturing an EL display device can be significantly reduced without a complicated step.

Moreover, the number of steps of manufacturing a thin film transistor can be significantly reduced while electrical characteristics of the thin film transistor are maintained.

According to the above method for manufacturing a thin film transistor, patterning in manufacturing a thin film transistor can be completed with the use of one photomask, so that misalignment of a photomask can be prevented at the time of aligning the photomask for etching.

Furthermore, the manufacturing cost of an EL display device can be significantly reduced.

Note that the thin film transistor manufactured with the manufacturing method described in this embodiment may be applied to a liquid crystal display device. In addition, the manufacturing method is not limited to the manufacturing method described in this embodiment, and an EL display device which is similar to that of this embodiment may be manufactured with the manufacturing method described in Embodiment 1.

Embodiment 3

In this embodiment, electronic devices in which a display device manufactured with any of the manufacturing methods described in Embodiments 1 and 2 is incorporated as a display portion are described with reference to FIGS. 46A and 46B, FIG. 47, and FIGS. 48A to 48C. As such electronic devices, for example, cameras such as video cameras and digital cameras; head mounted displays (goggle type displays); car navigation systems; projectors; car stereos; personal computers; and portable information terminals (such as mobile computers, mobile phones, and e-book readers) can be given. Examples of the electronic devices are illustrated in FIGS. 46A and 46B.

Figure 46A:
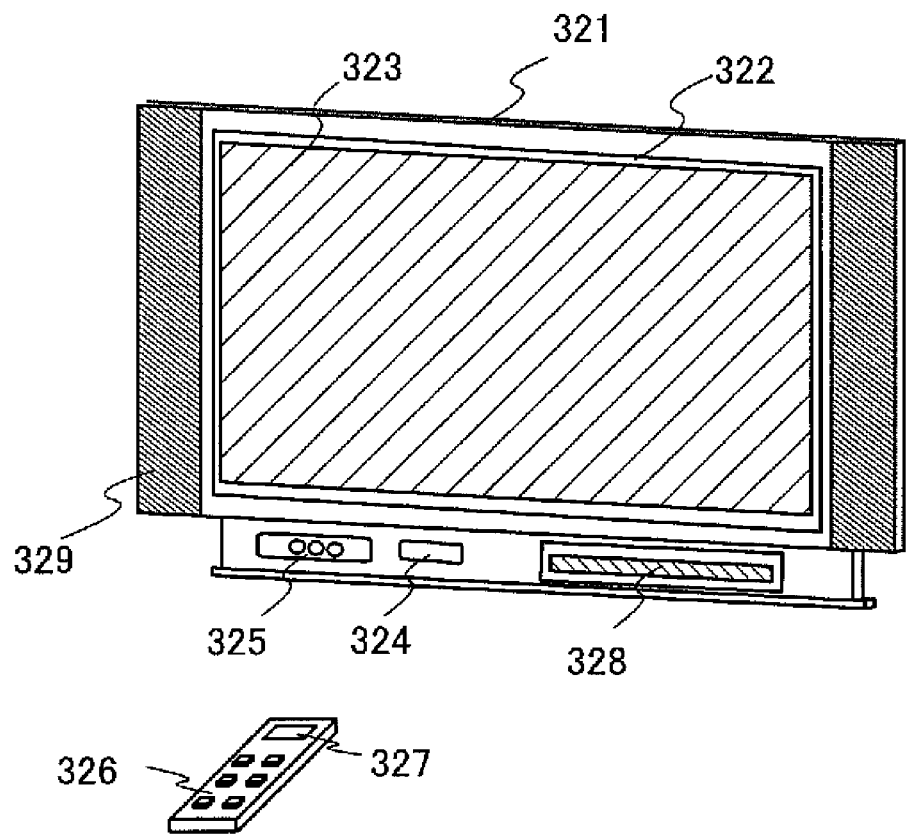
FIGS. 46A and 46B each illustrate an electronic device using a display device.
Figure 46B:
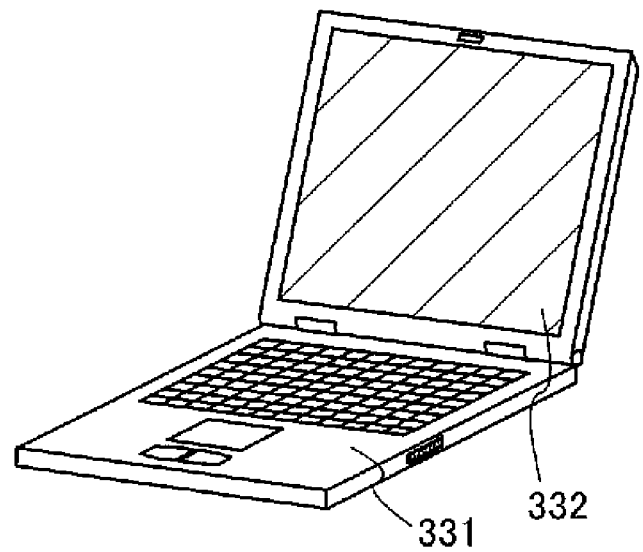

FIG. 46A illustrates a television device. A television device illustrated in FIG. 46A can be completed by incorporating a display device manufactured with any of the manufacturing methods described in Embodiments 1 and 2 into a housing. A main screen 323 is formed using the display device manufactured with any of the manufacturing methods described in Embodiments 1 and 2, and a speaker portion 329, operation switches, and the like are provided as its accessory equipment.

As illustrated in FIG. 46A, a display panel 322 manufactured with any of the manufacturing methods described in Embodiments 1 and 2 is incorporated into a housing 321, and general TV broadcast can be received by a receiver 325. When the television device is connected to a communication network by wired or wireless connections via a modem 324, one-way (from a sender to a receiver) or two-way (between a sender and a receiver or between receivers) information communication can be performed. The television device can be operated using switches incorporated into the housing or by a remote control device 326 provided separately. A display portion 327 which displays output information may be provided for the remote control device 326.

Further, the television device may include a sub-screen 328 formed using a second display panel for displaying channels, volume, and the like, in addition to the main screen 323.

Figure 47:
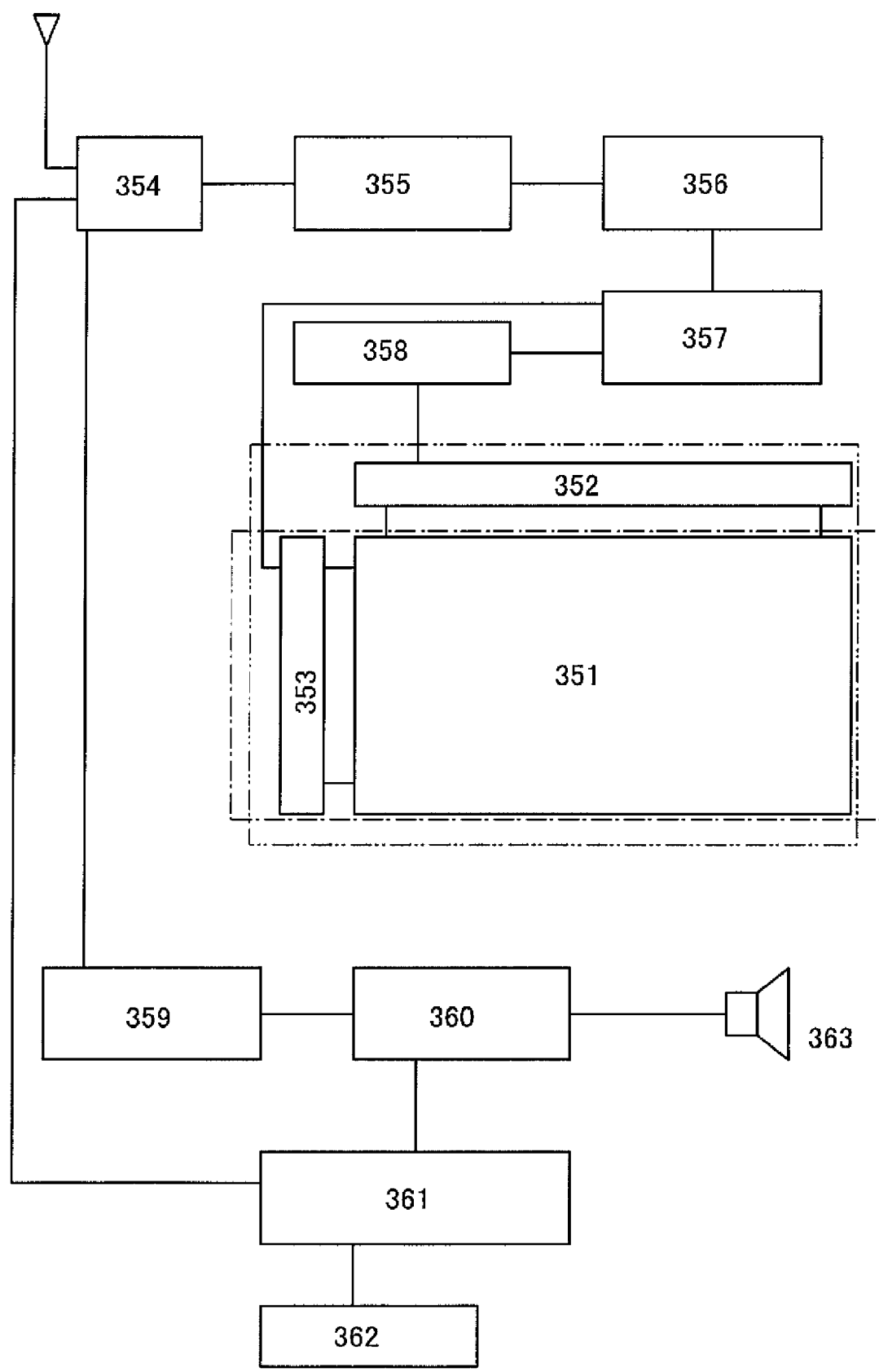
FIG. 47 illustrates an electronic device using a display device.

FIG. 47 is a block diagram of a main structure of a television device. A pixel portion 351 is formed in a display region. A signal line driver circuit 352 and a scan line driver circuit 353 may be mounted on a display panel with a COG method.

As structures of other external circuits, a video signal amplifier circuit 355 amplifying a video signal among signals received by a tuner 354, a video signal processing circuit 356 converting signals output from the video signal amplifier circuit 355 into chrominance signals corresponding to respective colors of red, green, and blue, a control circuit 357 for converting the video signal into a signal which meets input specifications of a driver IC, and the like are provided on the input side of the video signal. The control circuit 357 outputs signals to each of the scan line side and the signal line side. In the case of digital drive, a signal dividing circuit 358 may be provided on the signal line side and an input digital signal may be divided into an integral number of pieces and supplied.

Among the signals received by the tuner 354, audio signals are transmitted to an audio signal amplifier circuit 359, and an output thereof is supplied to a speaker 363 through an audio signal processing circuit 360. A control circuit 361 receives control information on receiving station (receiving frequency) and volume from an input portion 362 and transmits signals to the tuner 354 and the audio signal processing circuit 360.

Naturally, the present invention is not limited to the television device and can also be applied to a large-size display medium such as an information display board at a train station, an airport, and the like, or an advertisement display board on the street, as well as a monitor of a personal computer. By using the manufacturing method of a display device which is one embodiment of the present invention, productivity of these display mediums can be improved.

When the display device manufactured with any of the manufacturing methods of a display device described in Embodiments 1 and 2 is applied to either or both of the main screen 323 and the sub screen 328, productivity of television devices can be increased.

A mobile computer illustrated in FIG. 46B includes a main body 331, a display portion 332, and the like. When the display device manufactured with any of the manufacturing methods of a display device described in Embodiments 1 and 2 is applied to the display portion 332, productivity of manufacturing computers can be increased.

Figure 48A:
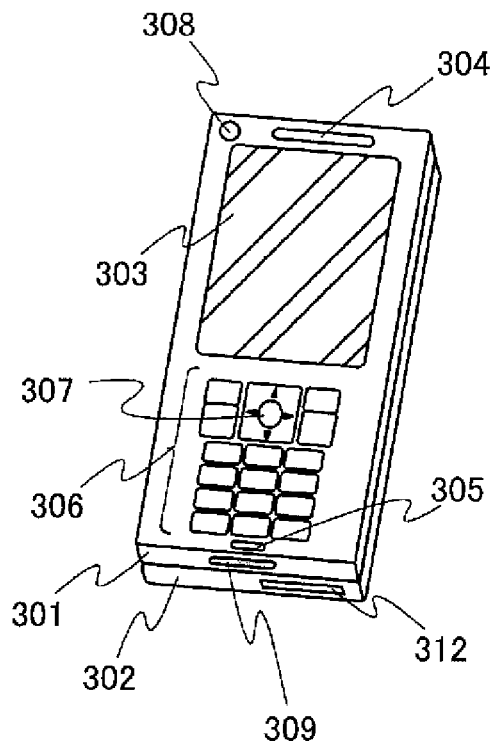
FIGS. 48A to 48C illustrate an electronic device using a display device.
Figure 48B:
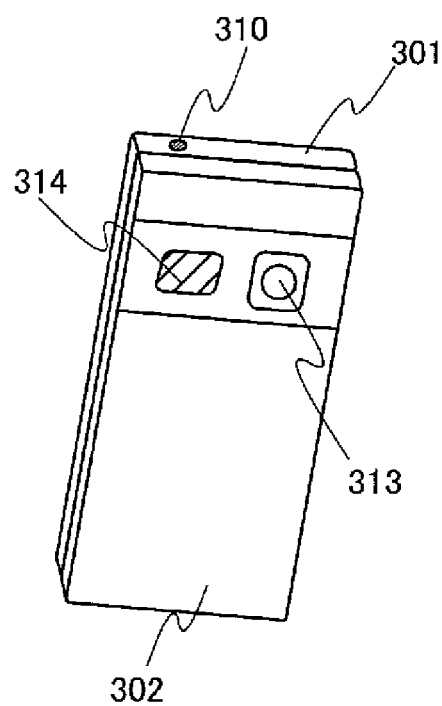
Figure 48C:
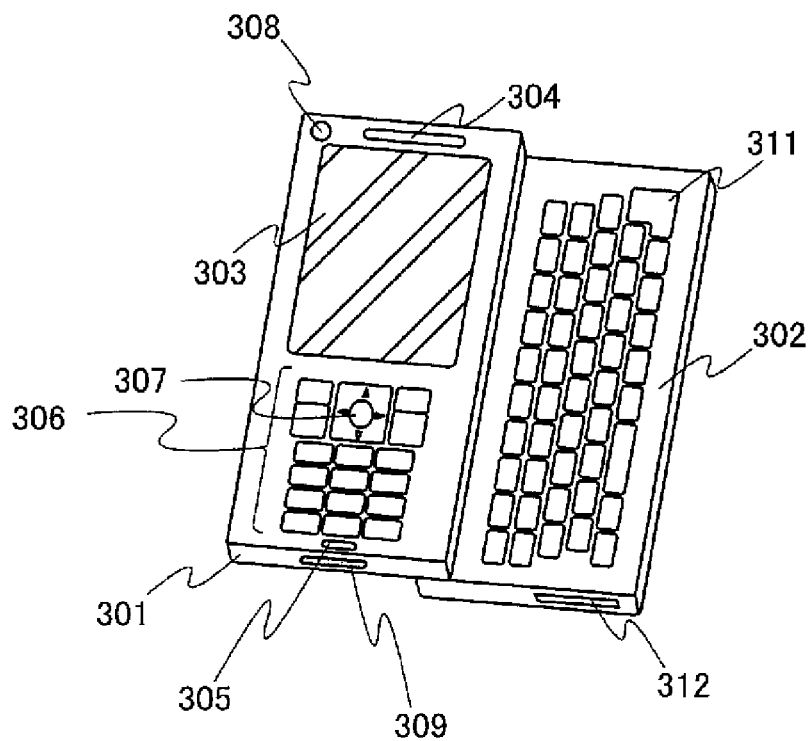

FIGS. 48A to 48C illustrate an example of a mobile phone to which the present invention is applied. FIG. 48A is a front view, FIG. 48B is a rear view, and FIG. 48C is a front view when two housings are slided. A mobile phone includes two housings 301 and 302. The mobile phone 300 is a so-called smartphone which has both functions of a mobile phone and a portable information terminal, and incorporates a computer and can process a variety of data processing in addition to voice calls.

The mobile phone includes the housing 301 and the housing 302. The housing 301 includes a display portion 303, a speaker 304, a microphone 305, operation keys 306, a pointing device 307, a front camera lens 308, a jack 309 for an external connection terminal, an earphone terminal 310, and the like, while the housing 302 includes a keyboard 311, an external memory slot 312, a rear camera 313, a light 314, and the like. In addition, an antenna is incorporated in the housing 301.

In addition to the above structure, a wireless IC chip, a small-size memory device, or the like may be incorporated in the mobile phone 300.

The housings 301 and 302 overlapped with each other (illustrated in FIG. 48A) can be slid to be developed as illustrated in FIG. 48C. The display device manufactured with any of the manufacturing methods of a display device described in Embodiments 1 and 2 can be incorporated in the display portion 303. Since the display portion 303 and the front camera lens 308 are provided in the same plane, the mobile phone 300 can be used as a videophone. A still image and a moving image can be taken by the rear camera 313 and the light 314 by using the display portion 303 as a viewfinder.

By using the speaker 304 and the microphone 305, the mobile phone 300 can be used as an audio recording device (sound recorder) or an audio reproducing device. With the use of the operation keys 306, operation of incoming and outgoing calls, simple information input for electronic mail or the like, scrolling of a screen displayed on the display portion, cursor motion for selecting information to be displayed on the display portion, and the like are possible.

If much information needs to be handled, such as the case of creating documents and using the mobile phone 300 as a portable information terminal, the use of the keyboard 311 is convenient. The housings 301 and 302 overlapped with each other (FIG. 48A) slide and can be developed as illustrated in FIG. 48C. In the case where the mobile phone 300 is used as a portable information terminal, a cursor can be moved smoothly with the use of the keyboard 311 and the pointing device 307. The jack 309 for an external connection terminal can be connected to various cables such as an AC adapter or a USB cable, whereby the mobile phone 300 can be charged or can perform data communication with a personal computer or the like. Moreover, by inserting a recording medium into the external memory slot 312, the mobile phone 300 can deal with storing and moving a large capacity of data.

In the rear surface of the housing 302 (FIG. 48B), the rear camera 313 and the light 314 are provided, and a still image and a moving image can be taken by using the display portion 303 as a viewfinder.

Further, the mobile phone 300 may have an infrared communication function, a USB port, a function of receiving one segment television broadcast, a non-contact IC chip, an earphone jack, or the like, in addition to the above functions and structures.

Since various electronic devices described in this embodiment can be manufactured with any of the manufacturing methods of a thin film transistor and a display device described in Embodiments 1 and 2, productivity of these electronic devices can be increased by applying one embodiment of the present invention.

Accordingly, the manufacturing cost of these electronic devices can be significantly reduced by applying one embodiment of the present invention.

This application is based on Japanese Patent Application serial no. 2009-075573 filed with Japan Patent Office on Mar. 26, 2009, the entire contents of which are hereby incorporated by reference.

What is claimed is:

1. A method for manufacturing a thin film transistor, comprising the steps of:
    stacking a first conductive film, an insulating film, and a first semiconductor film in this order;
    crystallizing the first semiconductor film to form a second semiconductor film;
    stacking an impurity semiconductor film and a second conductive film in this order over the second semiconductor film;
    forming a first resist mask having a recessed portion over the second conductive film;
    performing first etching on at least the second conductive film, the impurity semiconductor film, the second semiconductor film, and the insulating film with the use of the first resist mask;
    performing second etching in which the first conductive film is side-etched to form a first wiring layer;
    reducing the first resist mask to expose a part of the second conductive film which overlaps with the recessed portion of the first resist mask to form a second resist mask after performing the second etching; and
    performing third etching on the second conductive film, the impurity semiconductor film, and the second semiconductor film with the use of the second resist mask to form a second wiring layer, an impurity semiconductor layer, and the second semiconductor film whose upper part is etched.

2. The method for manufacturing the thin film transistor according to claim 1, wherein the first resist mask is formed using a multi-tone mask.

3. The method for manufacturing the thin film transistor according to claim 1, further comprising the step of:
    forming a thin-film stack body with the first etching,
    wherein a side surface of the first wiring layer is located on an inner side than a side surface of the thin-film stack body by an almost uniform distance with the second etching.

4. The method for manufacturing the thin film transistor according to claim 1,
    wherein the first conductive film is formed over a substrate with a base insulating film interposed therebetween, and
    wherein an upper portion of the base insulating film is etched as well with the first etching.

5. The method for manufacturing the thin film transistor according to claim 1,
    wherein the first etching is dry etching, and
    wherein the second etching is wet etching.

6. The method for manufacturing the thin film transistor according to claim 1,
wherein in the crystallizing step, laser beam irradiation or thermal crystallization is performed.

7. A method for manufacturing a thin film transistor, comprising the steps of
stacking a first conductive film, an insulating film, and a first semiconductor film in this order;
crystallizing the first semiconductor film to form a second semiconductor film;
stacking an impurity semiconductor film and a second conductive film in this order over the second semiconductor film;
forming a first resist mask having a recessed portion over the second conductive film;
performing first etching on at least the second conductive film, the impurity semiconductor film, the second semiconductor film, and the insulating film with the use of the first resist mask;
reducing the first resist mask to expose a part of the second conductive film which overlaps with the recessed portion of the first resist mask to form a second resist mask;
performing second etching in which the first conductive film is side-etched to form a first wiring layer after reducing the first resist mask; and
performing third etching on parts of the second conductive film, the impurity semiconductor film, and the second semiconductor film with the use of the second resist mask to form a second wiring layer, an impurity semiconductor layer, and the second semiconductor film whose upper part is etched.

8. The method for manufacturing the thin film transistor according to claim 7, wherein the first resist mask is formed using a multi-tone mask.

9. The method for manufacturing the thin film transistor according to claim 7, further comprising the step of:
forming a thin-film stack body with the first etching,
wherein a side surface of the first wiring layer is located on an inner side than a side surface of the thin-film stack body by an almost uniform distance with the second etching.

10. The method for manufacturing the thin film transistor according to claim 7,
wherein the first conductive film is formed over a substrate with a base insulating film interposed therebetween, and
wherein an upper portion of the base insulating film is etched as well with the first etching.

11. The method for manufacturing the thin film transistor according to claim 7,
wherein the first etching is dry etching, and
wherein the second etching is wet etching.

12. The method for manufacturing the thin film transistor according to claim 7,
wherein in the crystallizing step, laser beam irradiation or thermal crystallization is performed.

13. A method for manufacturing a thin film transistor, comprising the steps of:
stacking a first conductive film, an insulating film, and a first semiconductor film in this order;
crystallizing the first semiconductor film to form a second semiconductor film;
forming a first resist mask over the second semiconductor film;
adding an impurity element imparting one conductivity type to a region of the second semiconductor film which is not covered with the first resist mask;
removing the first resist mask, and then activating the impurity element of the second semiconductor film;
forming a second conductive film over the second semiconductor film;
forming a second resist mask having a recessed portion over the second conductive film;
performing first etching on at least the second conductive film, the second semiconductor film, and the insulating film with the use of the second resist mask;
performing second etching in which the first conductive film is side-etched to form a first wiring layer;
forming a third resist mask over the second conductive film; and
performing third etching on the second conductive film and the second semiconductor film with the use of the third resist mask to form a second wiring layer and a semiconductor layer including a source region and a drain region.

14. The method for manufacturing the thin film transistor according to claim 13,
wherein the third resist mask is formed by reducing the second resist mask.

15. The method for manufacturing the thin film transistor according to claim 13,
wherein the first resist mask is formed using a multi-tone mask.

16. The method for manufacturing the thin film transistor according to claim 13, further comprising the step of:
forming a thin-film stack body with the first etching,
wherein a side surface of the first wiring layer is located on an inner side than a side surface of the thin-film stack body by an almost uniform distance with the second etching.

17. The method for manufacturing the thin film transistor according to claim 13,
wherein the first conductive film is formed over a substrate with a base insulating film interposed therebetween, and
wherein an upper portion of the base insulating film is etched as well with the first etching.

18. The method for manufacturing the thin film transistor according to claim 13,
wherein the first etching is dry etching, and
wherein the second etching is wet etching.

19. The method for manufacturing the thin film transistor according to claim 13,
wherein in the crystallizing step, laser beam irradiation or thermal crystallization is performed.

* * * * *

UNITED STATES PATENT AND TRADEMARK OFFICE
CERTIFICATE OF CORRECTION

PATENT NO.        : 8,372,700 B2
APPLICATION NO.   : 12/731210
DATED             : February 12, 2013
INVENTOR(S)       : Miyairi Page 1 of 1

It is certified that error appears in the above-identified patent and that said Letters Patent is hereby corrected as shown below:

On the title page, item [30] should read:
--(30) Foreign Application Priority Data March 26, 2009    (JP) ……………………………2009-075573--.

Signed and Sealed this
First Day of October, 2013

Teresa Stanek Rea
*Deputy Director of the United States Patent and Trademark Office*